US012610734B2

(12) United States Patent
Jen et al.

(10) Patent No.: US 12,610,734 B2
(45) Date of Patent: Apr. 21, 2026

(54) ORGANIC-INORGANIC HYBRID PEROVSKITES

(71) Applicant: City University of Hong Kong, Hong Kong (CN)

(72) Inventors: Alex Kwan Yue Jen, Hong Kong (CN); Fengzhu Li, Hong Kong (CN)

(73) Assignee: City University of Hong Kong, Hong Kong (CN)

( * ) Notice: Subject to any disclaimer, the term of this patent is extended or adjusted under 35 U.S.C. 154(b) by 444 days.

(21) Appl. No.: 18/479,863

(22) Filed: Oct. 3, 2023

(65) Prior Publication Data

US 2025/0113727 A1 Apr. 3, 2025

(51) Int. Cl.
*H10K 85/50* (2023.01)
*C09K 11/06* (2006.01)

(52) U.S. Cl.
CPC .............. *H10K 85/50* (2023.02); *C09K 11/06* (2013.01); *C09K 2211/188* (2013.01)

(58) Field of Classification Search
CPC .. H10K 85/50; H10K 85/1135; H10K 85/633; H10K 85/655; H10K 85/55; H10K 85/113; C09K 11/06; C09K 11/0883; C09K 11/67; C09K 2211/188; C09K 2211/10;

(Continued)

(56) References Cited

PUBLICATIONS

Correa-Baena, J.-P. et al. Promises and challenges of perovskite solar cells. Science 358, 739-744, doi:10.1126/science.aam6323 (2017).

(Continued)

*Primary Examiner* — Nikolay K Yushin
(74) *Attorney, Agent, or Firm* — S&F/WEHRW

(57) ABSTRACT

Organic-inorganic hybrid perovskite including: $M^{2+}$, one or more $A^+$, and a multifunctional nonvolatile additive (MNA) comprising a cationic species having the formula $R^1Ar^1R^2$, wherein $M^{2+}$ comprises $Pb^{2+}$, $Sn^{2+}$, $Ge^{2+}$, or a mixture thereof; each of the one or more $A^+$ is independently selected from the group consisting of $Cs^+$, $Rb^+$, $CH_3NH_3^+$, $CH_3CH_2NH_3^+$, $H(C{=}NH_2)NH_2^+$, and $Me(C{=}NH_2)NH_2^+$; $Ar^1$ is an optionally substituted aryl or an optionally substituted heteroaryl; $R^1$ is —COOH, —$CH_2COOH$, —$CH_2CH_2COOH$, —$SO_3H$, —$CH_2SO_3H$, —$CH_2CH_2SO_3H$, —$PO_3H_2$, —$CH_2PO_3H_2$, or —$CH_2CH_2PO_3H_2$; and $R^2$ is —$NH(C{=}NH_2)NH_2^+$ or —$N(R)_3H^+$, wherein R for each instance is independently hydrogen or $C_1$-$C_6$ alkyl, with the proviso that the one or more $A^+$ includes $H(C{=}NH_2)NH_2^+$.

19 Claims, 45 Drawing Sheets

(58) Field of Classification Search
CPC .... C09K 2211/1014; C09K 2211/1007; Y02E 10/549; Y02E 10/547; Y02E 10/548
See application file for complete search history.

(56) References Cited

PUBLICATIONS

Kojima, A., Teshima, K., Shirai, Y. & Miyasaka, T. Organometal Halide Perovskites as Visible-Light Sensitizers for Photovoltaic Cells. Journal of the American Chemical Society 131, 6050-6051, doi: 10.1021/ja809598r (2009).
Min, H. et al. Perovskite solar cells with atomically coherent interlayers on SnO2 electrodes. Nature 598, 444-450, doi:10.1038/s41586-021-03964-8 (2021).
Kim, M. et al. Conformal quantum dot-SnO2 layers as electron transporters for efficient perovskite solar cells. Science 375, 302-306, doi:10.1126/science.abh1885 (2022).
Yoo, J. J. et al. Efficient perovskite solar cells via improved carrier management. Nature 590, 587-593, doi:10.1038/s41586-021-03285-w (2021).
Li, Z. et al. Organometallic-functionalized interfaces for highly efficient inverted perovskite solar cells. Science 376, 416-420, doi:10.1126/science.abm8566 (2022).
Li, F. et al. Regulating Surface Termination for Efficient Inverted Perovskite Solar Cells with Greater Than 23% Efficiency. Journal of the American Chemical Society 142, 20134-20142, doi:10.1021/jacs.0c09845 (2020).
Zheng, X. et al. Managing grains and interfaces via ligand anchoring enables 22.3%-efficiency inverted perovskite solar cells. Nat. Energy 5, 131-140, doi:10.1038/s41560-019-0538-4 (2020).
Li, X. et al. Constructing heterojunctions by surface sulfidation for efficient inverted perovskite solar cells. Science 375, 434-437, doi:10.1126/science.abl5676 (2022).
Chen, H. et al. Quantum-size-tuned heterostructures enable efficient and stable inverted perovskite solar cells. Nat. Photonics 16, 352-358, doi:10.1038/s41566-022-00985-1 (2022).
Rajagopal, A., Yao, K. & Jen, A. K. Y. Toward Perovskite Solar Cell Commercialization: A Perspective and Research Roadmap Based on Interfacial Engineering. Advanced Materials 30, 1800455 (2018).
Li, F. & Jen, A. K. Y. Interface Engineering in Solution-Processed Thin-Film Solar Cells. Acc. Mater. Res. 3, 272-282, doi:10.1021/accountsmr.1c00169 (2022).
Jeon, N. J. et al. Solvent engineering for high-performance inorganic-organic hybrid perovskite solar cells. Nat. Mater. 13, 897-903, doi:10.1038/nmat4014 (2014).
Liu, S. et al. A Review on Additives for Halide Perovskite Solar Cells. Adv. Energy Mater. 10, 1902492, doi:https://doi.org/10.1002/aenm.201902492 (2020).
Bu, T. et al. Lead halide-templated crystallization of methylamine-free perovskite for efficient photovoltaic modules. Science 372, 1327-1332, doi:10.1126/science.abh1035 (2021).
Kim, M. et al. Methylammonium Chloride Induces Intermediate Phase Stabilization for Efficient Perovskite Solar Cells. Joule 3, 2179-2192, doi:10.1016/j.joule.2019.06.014 (2019).
Chen, S. et al. Stabilizing perovskite-substrate interfaces for high-performance perovskite modules. Science 373, 902-907, doi:10.1126/science.abi6323 (2021).
Li, H. et al. Stiffening the Pb-X Framework through a π-Conjugated Small-Molecule Cross-Linker for High-Performance Inorganic CsPbI2Br Perovskite Solar Cells. ACS Appl. Mater. Interfaces 13, 40489-40501, doi: 10.1021/acsami.1c06533 (2021).
Li, N. et al. Cation and anion immobilization through chemical bonding enhancement with fluorides for stable halide perovskite solar cells. Nat. Energy 4, 408-415, doi:10.1038/s41560-019-0382-6 (2019).
Wang, R. et al. Caffeine Improves the Performance and Thermal Stability of Perovskite Solar Cells. Joule 3, 1464-1477 (2019).
Deng, X. et al. Co-assembled Monolayers as Hole-Selective Contact for High-Performance Inverted Perovskite Solar Cells with Optimized Recombination Loss and Long-Term Stability. Angew. Chem. Int. Ed. n/a, e202203088, doi: https://doi.org/10.1002/anie.202203088 (2022).
Quarti, C., De Angelis, F. & Beljonne, D. Influence of Surface Termination on the Energy Level Alignment at the CH3NH3PbI3 Perovskite/C60 Interface. Chem. Mater. 29, 958-968, doi:10.1021/acs.chemmater.6b03259 (2017).
Song, T.-B. et al. Revealing the Dynamics of Hybrid Metal Halide Perovskite Formation via Multimodal In Situ Probes. Adv. Funct. Mater. 30, 1908337, doi:https://doi.org/10.1002/adfm.201908337 (2020).
Mrkyvkova, N. et al. Combined in Situ Photoluminescence and X-ray Scattering Reveals Defect Formation in Lead-Halide Perovskite Films. J. Phys. Chem. Lett. 12, 10156-10162, doi:10.1021/acs.jpclett.1c02869 (2021).
Song, T.-B. et al. Dynamics of Antisolvent Processed Hybrid Metal Halide Perovskites Studied by In Situ Photoluminescence and Its Influence on Optoelectronic Properties. ACS Appl. Energy Mater. 3, 2386-2393, doi:10.1021/acsaem.9b02052 (2020).
D'Innocenzo, V., Srimath Kandada, A. R., De Bastiani, M., Gandini, M. & Petrozza, A. Tuning the Light Emission Properties by Band Gap Engineering in Hybrid Lead Halide Perovskite. J. Am. Chem. Soc. 136, 17730-17733, doi:10.1021/ja511198f (2014).
You, J. et al. Moisture assisted perovskite film growth for high performance solar cells. Appl. Phys. Lett. 105, 183902, doi:10.1063/1.4901510 (2014).
Shi, B. et al. Unraveling the Passivation Process of PbI2 to Enhance the Efficiency of Planar Perovskite Solar Cells. J. Phys. Chem. C 122, 21269-21276, doi:10.1021/acs.jpcc.8b08075 (2018).
Shi, D. et al. Low trap-state density and long carrier diffusion in organolead trihalide perovskite single crystals. Science 347, 519-522, doi:10.1126/science.aaa2725 (2015).
Mei, A. et al. A hole-conductor-free, fully printable mesoscopic perovskite solar cell with high stability. Science 345, 295-298, doi:10.1126/science.1254763 (2014).
Wang, K., Wu, C., Yang, D., Jiang, Y. & Priya, S. Quasi-Two-Dimensional Halide Perovskite Single Crystal Photodetector. ACS Nano 12, 4919-4929, doi:10.1021/acsnano.8b01999 (2018).
Wang, Y., He, J., Liu, C., Chong, W. H. & Chen, H. Thermodynamics versus Kinetics in Nanosynthesis. Angew. Chem. Int. Ed. 54, 2022-2051, doi:https://doi.org/10.1002/anie.201402986 (2015).
Han, T.-H. et al. Perovskite-polymer composite cross-linker approach for highly-stable and efficient perovskite solar cells. Nat. Commun. 10, 520, doi:10.1038/s41467-019-08455-z (2019).
Lin, R. et al. All-perovskite tandem solar cells with improved grain surface passivation. Nature 603, 73-78, doi:10.1038/s41586-021-04372-8 (2022).
Fu, Y. et al. Stabilization of the Metastable Lead Iodide Perovskite Phase via Surface Functionalization. Nano Lett. 17, 4405-4414, doi:10.1021/acs.nanolett.7b01500 (2017).
Xia, Y., Xia, X. & Peng, H.-C. Shape-Controlled Synthesis of Colloidal Metal Nanocrystals: Thermodynamic versus Kinetic Products. J. Am. Chem. Soc. 137, 7947-7966, doi:10.1021/jacs.5b04641 (2015).
Yao, J. et al. Quantifying Losses in Open-Circuit Voltage in Solution-Processable Solar Cells. Phys. Rev. Appl. 4, 014020, doi:10.1103/PhysRevApplied.4.014020 (2015).
Yamaguchi, M. in Post-Transition Metals (ed Mohammed Muzibur Rahman) Ch. High-Efficiency GaAs-Based Solar Cells, 196 (2020).
Khenkin, M. V. et al. Consensus statement for stability assessment and reporting for perovskite photovoltaics based on ISOS procedures. Nature Energy 5, 35-49, doi:10.1038/s41560-019-0529-5 (2020).
Mohammadi, M. et al. Encapsulation Strategies for Highly Stable Perovskite Solar Cells under Severe Stress Testing: Damp Heat, Freezing, and Outdoor Illumination Conditions. ACS Appl. Mater. Interfaces 13, 45455-45464, doi:10.1021/acsami.1c11628 (2021).
Lin, Y.-H. et al. A piperidinium salt stabilizes efficient metal-halide perovskite solar cells. Science 369, 96-102, doi:10.1126/science.aba1628 (2020).

(56) References Cited

PUBLICATIONS

Liu, Z. et al. A holistic approach to interface stabilization for efficient perovskite solar modules with over 2,000-hour operational stability. Nature Energy 5, 596-604, doi:10.1038/s41560-020-0653-2 (2020).
Kresse, G. & Furthmüller, J. Efficient iterative schemes for ab initio total-energy calculations using a plane-wave basis set. Phys. Rev. B 54, 11169-11186, doi:10.1103/PhysRevB.54.11169 (1996).
Perdew, J. P., Burke, K. & Ernzerhof, M. Generalized Gradient Approximation Made Simple. Phys. Rev. Lett. 77, 3865-3868, doi:10.1103/PhysRevLett.77.3865 (1996).
Blöchl, P. E. Projector augmented-wave method. Physical review B 50, 17953 (1994).
Lee, K., Murray, É. D., Kong, L., Lundqvist, B. I. & Langreth, D. C. Higher-accuracy van der Waals density functional. Physical Review B 82, 081101 (2010).
Lu, T. & Chen, F. Multiwfn: A multifunctional wavefunction analyzer. J. Comput. Chem. 33, 580-592, doi:https://doi.org/10.1002/jcc.22885 (2012).
Momma, K. & Izumi, F. Vesta 3 for three-dimensional visualization of crystal, volumetric and morphology data. J. Appl. Crystallogr. 44, 1272-1276 (2011).
Wang, V., Xu, N., Liu, J.-C., Tang, G. & Geng, W.-T. VASPKIT: A user-friendly interface facilitating high-throughput computing and analysis using VASP code. Comput. Phys. Commun. 267, 108033, doi:https://doi.org/10.1016/j.cpc.2021.108033 (2021).

Measurement Report

| | |
|---|---|
| 依頼者名(Client Name) | City University of Hong Kong |
| 依頼者住所(Client Address) | Tat Chee Avenue, Kowloon, Hong Kong SAR |
| 型式名(Type) | Perovskite solar cell |
| 製造者名(Manufacturer) | Alex K.-Y Jen Group City University of Hong Kong |
| 識別番号(Serial Number) | AJ-1 |
| 受付番号(Application number) | C22R0010 |
| 受付日(Application number date) | June 15, 2022 |
| 測定方法(Measurement method) | IEC60904-1Ed.3, IEC60904-8Ed.3 |
| 測定実施場所(Measurement Location) | JAPAN ELECTRICAL SAFETY & ENVIRONMENT TECHNOLOGY LABORATORIES<br>POWER TECHNOLOGY TESTING LABORATORY<br>1-12-28 MOTOMIYA TSURUMI-KU YOKOHAMA-CITY,<br>230-0004 JAPAN |

測定実施日(Measurement date) June 15, 2022

測定確認者(Measurement Authority)

Takamitsu Inoue

発行日(Issued date)

2022年(Year)6月(Mon)27日(Day)

発行者Approved By

神奈川県横浜市鶴見区元宮1-12-28

1-12-28 MOTOMIYA TSURUMI-KU YOKOHAMA-CITY, 230-0004 JAPAN

一般財団法人 電気安全環境研究所（ＪＥＴ）

JAPAN ELECTRICAL SAFETY & ENVIRONMENT TECHNOLOGY LABORATORIES

電力技術試験所長 古谷 毅

POWER TECHNOLOGY TESTING LABORATORY DIRECTOR

On behalf of

Takeshi Furutani

The Measurement Result presented in this report is valid only for the module measured.

The Measurement Report shall not be reproduced without the written approval of JET.

FIG. 36

(1) Measurement of I-V characteristic

| | |
|---|---|
| Category of Reference Device | Primary Reference Cell |
| Reference Device Manufacturer | Suntech Power Japan Corporation |
| Reference Device Type | filtered reference solar cell |
| Reference Device Serial Number | JETp-A01W 1102-5 |
| Calibration Value of Reference Device /Valid Date of Calibration for Reference Device | JETp-A01W 1102-5: 45.00mA / Oct. 2022 |
| Reference Device is Calibrated by | Physikalisch-Technische Bundesanstalt (PTB) |
| Spectral Mismatch Correction Factor | +2.25% |
| Measurement Conditions | Standard Test Conditions<br>IEC60904-3Ed.4 AM1.5G<br>Irradiance:1000±100 W/m², Temperature:25±1°C |
| Measurement Method | Simulated Sunlight by Steady State Solar Simulator<br>CLASS AAA based on IEC60904-9 |
| Measurement Results | Detailed in the section below |

| Serial Number (Scan Direction) | Isc (mA) | Voc (V) | Pmax (mW) | Ipm (mA) | Vpm (V) | F.F. (%) | Eff. (%) (Da) |
|---|---|---|---|---|---|---|---|
| AJ-1 (Forward) | 0.9759 | 1.185 | 0.9632 | 0.9352 | 1.030 | 83.3 | 24.1 |
| AJ-1 (Reverse) | 0.9797 | 1.190 | 0.9822 | 0.9266 | 1.060 | 84.2 | 24.5 |

| | |
|---|---|
| Expanded Uncertainty : | Isc 1.6%($k$=2), Voc 1.2%($k$=2), Pmax 2.6%($k$=2) |

Note : The value is the numerical value of an expanded uncertainty $U = ku_c$, with $U$ determined from a combined standard uncertainty $u_c$ and a coverage factor $k = 2$, and defines an interval estimated to have a level of confidence of approximately 95 %.

FIG. 36 (Continued)

AvaSolar Report

| | |
|---|---|
| Date | 2020/11/17 |
| Report Number: | 1117-1 |
| Standard: | IEC-60904-9-2007 |
| Worst Case Classification: | A |

| | | | | | |
|---|---|---|---|---|---|
| Intervals(nm): | 400-500 | 500-600 | 600-700 | 700-800 | 800-900 |
| Ratios: | 0.814 | 0.818 | 1.207 | 1.198 | 1.028 |
| Classes: | A | A | A | A | A |

| | |
|---|---|
| Intervals(nm): | 900-1100 |
| Ratios: | 1.005 |
| Classes: | A |

| Reference | $E_g$ (eV) | $V_{OC}$ (V) | $V_{OC}$ loss (V) | PCE (%) | Certified PCE (Organization) |
|---|---|---|---|---|---|
| **This work** | **1.51** | **1.19** | **0.36** | **24.8** | **24.5% (JET, Japan)** |
| Ref 1: *Nat. Photonics 2022, 16, 352.* | 1.53 | 1.15 | 0.38 | 23.9 | 23.9% (NREL, U.S.) |
| Ref 2: *Science 2022, 376, 416.* | 1.55 | 1.18 | 0.37 | 25.0 | 24.3% (NIM, China) |
| Ref 3: *Science 2022, 375, 434.* | 1.55 | 1.19 | 0.36 | 24.3 | 23.5% (SIMIT, China) |
| Ref 4: *Science 2021, 373, 902.* | 1.49 | 1.17 | 0.32 | 23.8 (20.1% for 19 $cm^2$) | 19.3% for 18.1 $cm^2$ (NREL, U.S.) |
| Ref 5: *J. Am. Chem. Soc. 2020, 142, 47, 20134.* | 1.50 | 1.17 | 0.33 | 23.4 | 22.8% (IEE, China) |
| Ref 6: *Nat. Energy* 2020, 5, 131. | 1.56 | 1.17 | 0.39 | 23.0 | 22.3% (Newport, U.S.) |
| Ref 7: *Nature* 2022, https://doi.org/10.1038/s41586-022-05268-x. | 1.53 | 1.15 | 0.38 | 25.5 | 25.4% (NREL, U.S.) |

FIG. 47

| | |
|---|---|
| **Chemical formula** | $C_{14}H_{24}I_3N_5O_4Pb$ |
| **Formula weight** | 914.27 g/mol |
| **Temperature** | 213(2) K |
| **Wavelength** | 1.54178 Å |
| **Crystal system** | monoclinic |
| **Space group** | P 1 21/c 1 |
| **Unit cell dimensions** | a = 19.2650(5) Å α = 90°<br>b = 8.0266(2) Å β = 117.2290(10)°<br>c = 21.0048(6) Å γ = 90° |
| **Volume** | 2888.09(13) $Å^3$ |
| **Z** | 4 |
| **Density (calculated)** | 2.103 $g/cm^3$ |
| **Independent reflections** | 5861 [R(int) = 0.0638] |
| **Data/restraints/parameters** | 5861 / 0 / 249 |
| **Goodness-of-fit on $F^2$** | 1.050 |
| **Final R indices** | 4912 data; I>2σ(I)<br>R1 = 0.0831, wR2 = 0.2451<br>all data<br>R1 = 0.0904, wR2 = 0.2556 |
| **Largest diff. peak and hole** | 2.475 and -6.294 $eÅ^{-3}$ |
| **R.M.S. deviation from mean** | 0.354 $eÅ^{-3}$ |

FIG. 48

| Devices | $V_{OC}$ (V) | FF (%) | $J_{SC}$ (mA/cm$^2$) | PCE (%) |
|---|---|---|---|---|
| 1 | 1.18 | 81.97 | 24.50 | 23.70 |
| 2 | 1.18 | 84.26 | 24.53 | 24.39 |
| 3 | 1.18 | 82.97 | 24.74 | 24.22 |
| 4 | 1.18 | 84.27 | 24.52 | 24.38 |
| 5 | 1.18 | 83.48 | 24.65 | 24.28 |
| 6 | 1.18 | 83.84 | 24.48 | 24.22 |
| 7 | 1.18 | 83.26 | 24.66 | 24.23 |
| 8 | 1.18 | 83.44 | 24.45 | 24.07 |
| 9 | 1.18 | 84.15 | 23.86 | 23.70 |
| 10 | 1.18 | 83.73 | 24.21 | 23.92 |
| 11 | 1.19 | 83.72 | 24.55 | 24.46 |
| 12 | 1.18 | 84.27 | 24.44 | 24.30 |
| 13 | 1.18 | 83.13 | 24.69 | 24.22 |
| 14 | 1.18 | 83.52 | 24.58 | 24.23 |
| 15 | 1.19 | 84.78 | 24.55 | 24.68 |
| 16 | 1.18 | 84.39 | 24.22 | 24.12 |
| 17 | 1.18 | 84.23 | 24.75 | 24.66 |
| 18 | 1.18 | 84.02 | 24.43 | 24.23 |
| 19 | 1.17 | 83.89 | 24.71 | 24.25 |
| 20 | 1.17 | 82.98 | 24.48 | 23.74 |

FIG. 49

| Reference | *V*oc (V) | *J*sc (mA/cm$^2$) | FF (%) | PCE (%) | Device structure |
|---|---|---|---|---|---|
| ***This work*** | **1.18** | **24.83** | **77.4** | **22.7** | **p-i-n** |
| *Nature 2022, 601, 573.* | 1.20 | 22.89 | 85.1 | 23.4 | n-i-p |
| *Joule 2022, 6, 1.* | 1.15 | 24.83 | 80.0 | 22.8 | n-i-p |
| *Nat. Energy 2018, 3, 847.* | 1.13 | 22.24 | 80.5 | 20.3 | p-i-n |

FIG. 50

| Devices | $V_{OC}$ (V) | FF (%) | $J_{SC}$ ($mA/cm^2$) | PCE (%) |
|---|---|---|---|---|
| 1 | 1.18 | 72.43 | 24.89 | 21.27 |
| 2 | 1.17 | 78.56 | 24.47 | 22.49 |
| 3 | 1.19 | 76.98 | 24.81 | 22.73 |
| 4 | 1.18 | 73.75 | 24.74 | 21.53 |
| 5 | 1.18 | 77.14 | 24.73 | 22.51 |
| 6 | 1.18 | 75.84 | 24.96 | 22. 34 |
| 7 | 1.17 | 75.28 | 24.74 | 21.79 |
| 8 | 1.18 | 73.96 | 24.75 | 21.60 |
| 9 | 1.19 | 76.33 | 24.74 | 22.47 |
| 10 | 1.17 | 74.08 | 24.66 | 21.37 |
| 11 | 1.17 | 75.55 | 24.59 | 21.74 |
| 12 | 1.18 | 71.63 | 24.88 | 21.03 |
| 13 | 1.18 | 74.04 | 24.82 | 21.68 |
| 14 | 1.17 | 72.67 | 24.40 | 20.75 |
| 15 | 1.18 | 75.37 | 24.41 | 21.71 |
| 16 | 1.17 | 72.17 | 24.49 | 20.67 |
| 17 | 1.18 | 74.95 | 24.54 | 21.70 |
| 18 | 1.18 | 72.59 | 24.74 | 21.19 |
| 19 | 1.19 | 77.05 | 24.78 | 22.72 |
| 20 | 1.17 | 78.56 | 24.47 | 22.49 |

FIG. 51

ORGANIC-INORGANIC HYBRID PEROVSKITES

TECHNICAL FIELD

The present disclosure relates organic-inorganic perovskites comprising a multifunctional nonvolatile additive with improved stability and optoelectronic performance and electronic devices comprising the same.

BACKGROUND

Organic-inorganic hybrid perovskites have garnered great attention due to their impressive optoelectronic properties, such as high absorption coefficients, long carrier diffusion lengths, and large defect tolerance. Through combined compositional and interfacial engineering, the power conversion efficiency (PCE) of perovskite solar cells (PVSCs) has been dramatically improved to a record 26.1%. However, most of the highly efficient devices reported are based on the conventional (n-i-p) architecture. Despite the lower-temperature processability and better compatibility with the fabrication of tandem and flexible devices for inverted (p-i-n) PVSCs, their performance still lags behind those of the conventional ones. One of the main challenges in further improving the performance of inverted PVSCs is the difficulty in reducing energy loss, especially the non-radiative recombination loss induced by defects embedded at the surface and the grain boundaries. Therefore, the intrinsic perovskite film quality, such as pinhole-free surface morphology, good heterojunction contacts, stable photoactive phases, and low defect density, plays a critical role in deciding the efficiency and stability that can be achieved for PVSCs.

The most common method for improving perovskite film quality is to apply additives to facilitate crystallization, leading to enhanced film morphology and decreased defect density, which can minimize energy loss. Various additives, especially volatile additives like solvents and organic salts, have been developed to tune the intermediate compositions to modulate crystallization kinetics. However, these additives can escape from the film after annealing due to their volatility, which creates voids at the perovskite-substrate interface, thus inducing unavoidable recombination loss and fast degradation of perovskite.

There thus exists a need for improved methods for preparing perovskites with enhanced properties.

SUMMARY

Perovskite film quality plays a vital role in device performance and long-term stability, which becomes a key point for the commercialization of this technology. To address this issue, a facile and effective strategy is provided herein MNAs into the precursor solution for adjusting the intermediate phase to modulate the film formation and passivate defects. Consequently, high-quality perovskite film with enhanced crystallinity and large-size grains (up to 1 μm) are achieved, the derived PVSCs can achieve a PCE of approaching 25% and exhibit long-term stability under various conditions.

Accordingly, the present disclosure proposes an effective and facile strategy employing a multifunctional nonvolatile additive comprising both acid groups and base groups that can be used to form a hydrogen bond-bridged intermediate phase with perovskite precursors and passivation groups that reduce defects in the derived perovskite films.

In a first aspect, provided herein is an organic-inorganic hybrid perovskite comprising: $M^{2+}$, one or more $A^+$, and a multifunctional nonvolatile additive (MNA) comprising a cationic species having the formula $R^1Ar^1R^2$, wherein $M^{2+}$ comprises $Pb^{2+}$, $Sn^{2+}$, $Ge^{2+}$, or a mixture thereof; each of the one or more $A^+$ is independently selected from the group consisting of $Cs^+$, $Rb^+$, $CH_3NH_3^+$, $CH_3CH_2NH_3^+$, $H(C{=}NH_2)NH_2^+$, and $Me(C{=}NH_2)NH_2^+$; $Ar^1$ is an optionally substituted aryl or an optionally substituted heteroaryl; $R^1$ is $-COOH$, $-CH_2COOH$, $-CH_2CH_2COOH$, $-SO_3H$, $-CH_2SO_3H$, $-CH_2CH_2SO_3H$, $-PO_3H_2$, $-CH_2PO_3H_2$, or $-CH_2CH_2PO_3H_2$; and $R^2$ is $-NH(C{=}NH_2)NH_2^+$ or $-N(R)_3H^+$, wherein R for each instance is independently hydrogen or $C_1$-$C_6$ alkyl, with the proviso that the one or more $A^+$ comprises $H(C{=}NH_2)NH_2^+$.

In certain embodiments, the MNA is selected from the group consisting of:

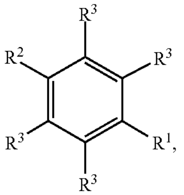,
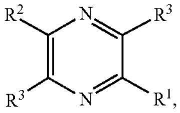,
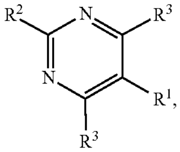,
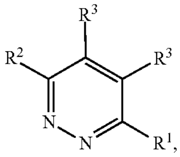,
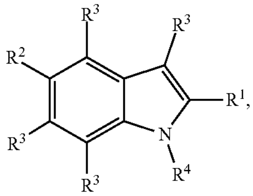,
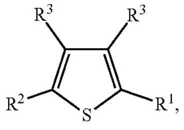,
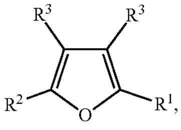,
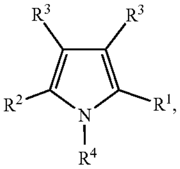,
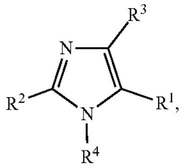,
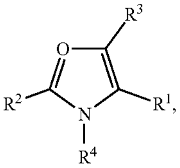,
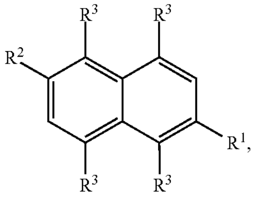,
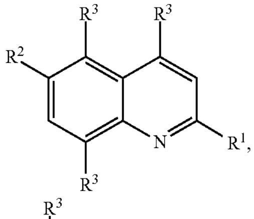, and
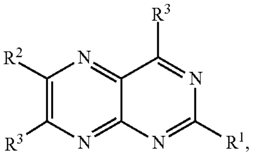, wherein $R^1$ is $-COOH$, $-SO_3H$, or $-PO_3H_2$;

$R^2$ is $-NH(C{=}NH_2)NH_2^+$;

$R^3$ for each instance is independently selected from the group consisting of hydrogen, Me, Et, F, Cl, Br, I, CN, SCN, —$NO_2$, —OMe, —OEt, —SMe, and —SEt; and $R^4$ is hydrogen or alkyl.

In certain embodiments, the MNA comprises a cationic species of Formula 1:

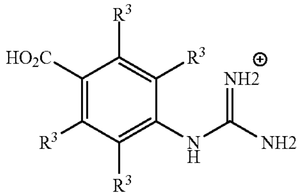 1 wherein $R^3$ for each instance is independently selected from the group consisting of hydrogen, Me, Et, F, Cl, Br, I, CN, SCN, —$NO_2$, —OMe, —OEt, —SMe, and —SEt.

In certain embodiments, the MNA has Formula 2:

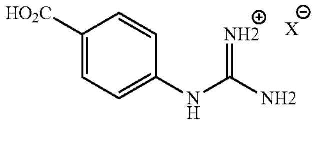 2 wherein X is $Cl^-$, Br, or I.

In certain embodiments, the organic-inorganic hybrid perovskite has Formula 3:

$$(A^+)(M^{2+})(X^-)_3\cdot(MNA)m \quad 3$$

wherein m is 0.01-0.5;

X is F, Cl, Br, or I;

$M^{2+}$ comprises $Pb^{2+}$, $Sn^{2+}$, $Ge^{2+}$, or a mixture thereof;

$A^+$ is $Cs^+$, $Rb^+$, $CH_3NH_3^+$, $CH_3CH_2NH_3^+$, $H(C{=}NH_2)NH_2^+$, $Me(C{=}NH_2)NH_2^+$, or a mixture thereof $R^3$ for each instance is independently selected from the group consisting of hydrogen, Me, Et, F, Cl, Br, I, CN, SCN, —$NO_2$, —OMe, —OEt, —SMe, and —SEt; and $R^4$ is hydrogen or alkyl, with the proviso that $A^+$ comprises $H(C{=}NH_2)NH_2^+$.

In certain embodiments, the MNA has Formula 2:

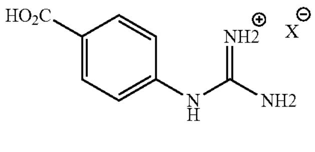 2 wherein X is $Cl^-$, $Br^-$, or $I^-$; and the one or more $A^+$ comprises $Cs^+$, $CH_3NH_3^+$, and $H(C{=}NH_2)NH_2^+$.

In a second aspect, provided herein is an organic-inorganic hybrid perovskite precursor solution comprising: $M^{2+}$, one or more $A^+$, a multifunctional nonvolatile additive (MNA) comprising a cationic species having the formula $R^1Ar^1R^2$, and an organic solvent, wherein $M^{2+}$ comprises $Pb^{2+}$, $Sn^{2+}$, $Ge^{2+}$, or a mixture thereof; each of the one or more $A^+$ is independently selected from the group consisting of $Cs^+$, $Rb^+$, $CH_3NH_3^+$, $CH_3CH_2NH_3^+$, $H(C{=}NH_2)NH_2^+$, and $Me(C{=}NH_2)NH_2^+$; $Ar^1$ is an optionally substituted aryl or an optionally substituted heteroaryl; $R^1$ is —COOH, —$CH_2COOH$, —$CH_2CH_2COOH$, —$SO_3H$, —$CH_2SO_3H$, —$CH_2CH_2SO_3H$, —$PO_3H_2$, —$CH_2PO_3H_2$, or —$CH_2CH_2PO_3H_2$; and $R^2$ is —$NH(C{=}NH_2)NH_2^+$ or —$N(R)_3H^+$, wherein R for each instance is independently hydrogen or $C_1$-$C_6$ alkyl, with the proviso that the one or more $A^+$ comprises $H(C{=}NH_2)NH_2^+$.

In certain embodiments, the MNA is selected from the group consisting of:

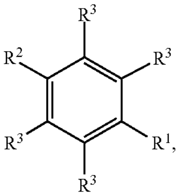, 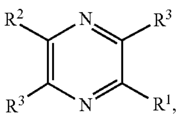, 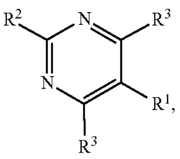,

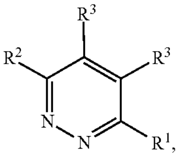, 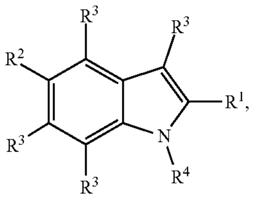,

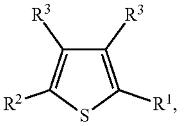, 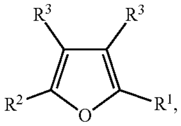, 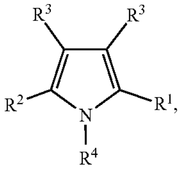,

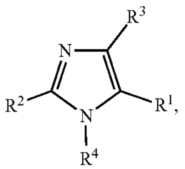, 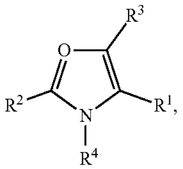,

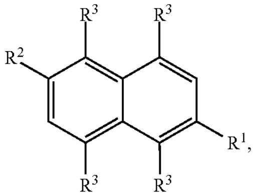, 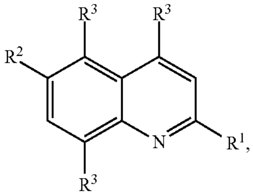, and

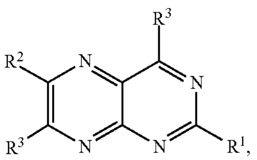, wherein $R^1$ is —COOH, —$SO_3H$, or —$PO_3H_2$;

$R^2$ is —$NH(C{=}NH_2)NH_2^+$;

$R^3$ for each instance is independently selected from the group consisting of hydrogen, Me, Et, F, Cl, Br, I, CN, SCN, —$NO_2$, —OMe, —OEt, —SMe, and —SEt; and $R^4$ is hydrogen or alkyl.

In certain embodiments, the MNA comprises a cationic species of Formula 1:

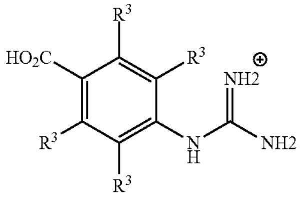
1 wherein $R^3$ for each instance is independently selected from the group consisting of hydrogen, Me, Et, F, Cl, Br, I, CN, SCN, and $—NO_2$.

In certain embodiments, the MNA has Formula 2:

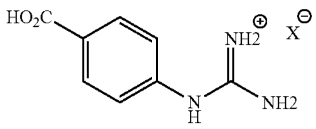
2 wherein X is $Cl^-$, Br, or I.

In certain embodiments, $M^{2+}$ comprises $Pb^{2+}$.

In certain embodiments, $M^{2+}$ comprises $Pb^{2+}$; and the one or more $A^+$ comprises $Cs^+$, $CH_3NH_3^+$, and $H(C{=}NH_2)NH_2^+$.

In certain embodiments, the solvent comprises dimethyl formamide, dimethyl sulfoxide, or a mixture thereof.

In certain embodiments, the MNA has Formula 2:

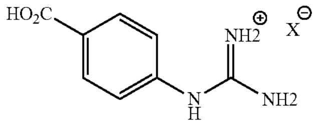
2 wherein X is Br or I; and the solvent comprises dimethyl formamide, dimethyl sulfoxide, or a mixture thereof.

In a third aspect, provided herein is an electronic device comprising:

a substrate layer;

a transparent conductive layer disposed on a surface of the substrate layer, a hole-transport layer disposed on the surface of the substrate layer;

a perovskite functional layer comprising the organic-inorganic hybrid perovskite of claim 1 disposed on a surface of the hole-transport layer;

an electron-transport layer disposed on the surface of the perovskite functional layer; and a metal electrode disposed on the surface of the electron-transport layer.

In certain embodiments, the electronic device has a power conversion efficiency (PCE) of 24.5-24.8% measured under International Electrotechnical Commission (IEC) 60904-9: 2007.

In certain embodiments, the MNA comprises a cationic species of Formula 1:

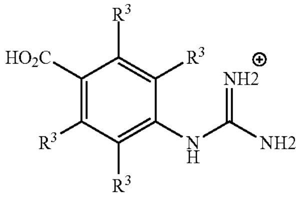
1 wherein $R^3$ for each instance is independently selected from the group consisting of hydrogen, Me, Et, F, Cl, Br, I, CN, SCN, and $—NO_2$.

In certain embodiments, the MNA has Formula 2:

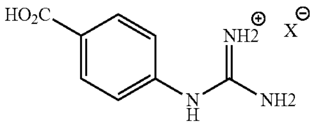
2 wherein X is Br or I.

In certain embodiments, the one or more $A^+$ comprises $Cs^+$, $CH_3NH_3^+$, and $H(C{=}NH_2)NH_2^+$.

In another aspect, the present application provides a preparation method of the device. In certain embodiments, HTL material (103) is spin-coated on 102—transparent conductive layer, and formed after annealing for the first time. Then, the perovskite solution is spin-coated on the 103—hole-transport layer, and the 104—perovskite functional layer is formed after the second annealing; ETL materials and metal electrode materials are sequentially evaporated on the 104—perovskite functional layer by vacuum thermal evaporation to complete the device preparation.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

$$N_t = \frac{2V_{TFL}\varepsilon\varepsilon_0}{ed^2},$$

e is the charge of electron, d is the thickness of the perovskite layer (700 nm), $\varepsilon_0$ is the vacuum permittivity, and $\varepsilon$ is the dielectric constant of the perovskite layer.

Figure 40:
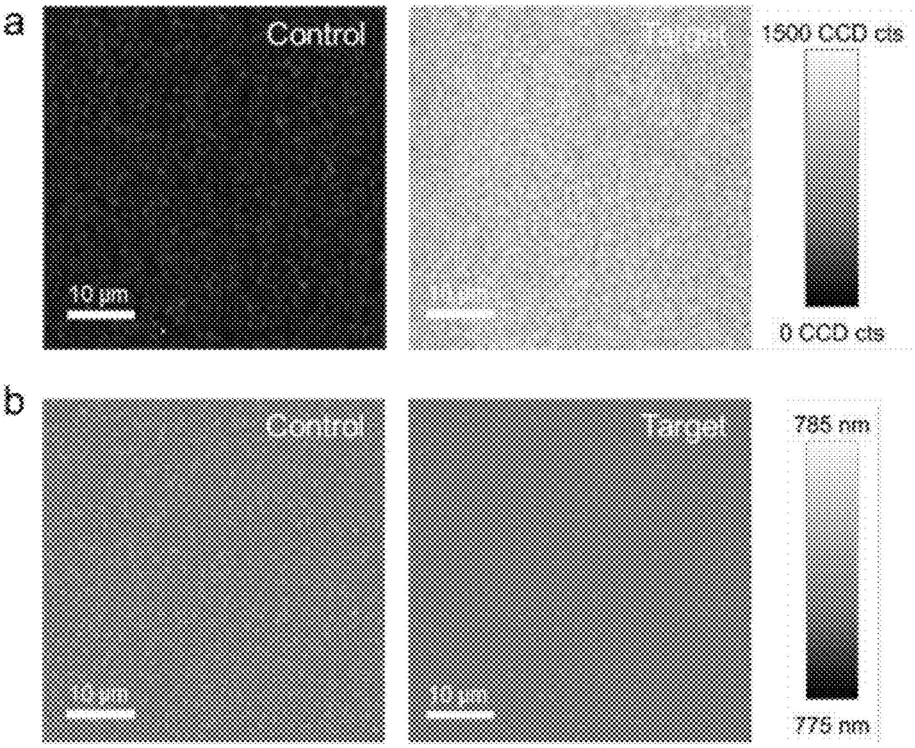

FIG. 40 (a) depicts the confocal PL intensity mapping and (b) the distribution of PL peak position for a region of 50×50 μm in the control and target perovskite films.

Figure 41:
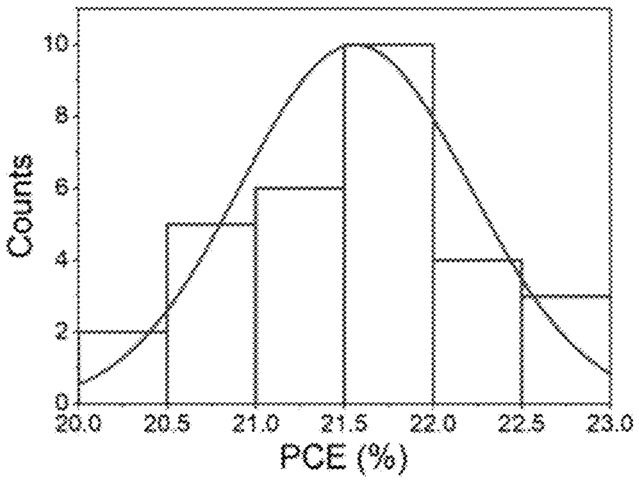

FIG. 41 depicts the histogram of device performance for 30 large-area devices (1 $cm^2$) fabricated in one batch.

Figure 42:
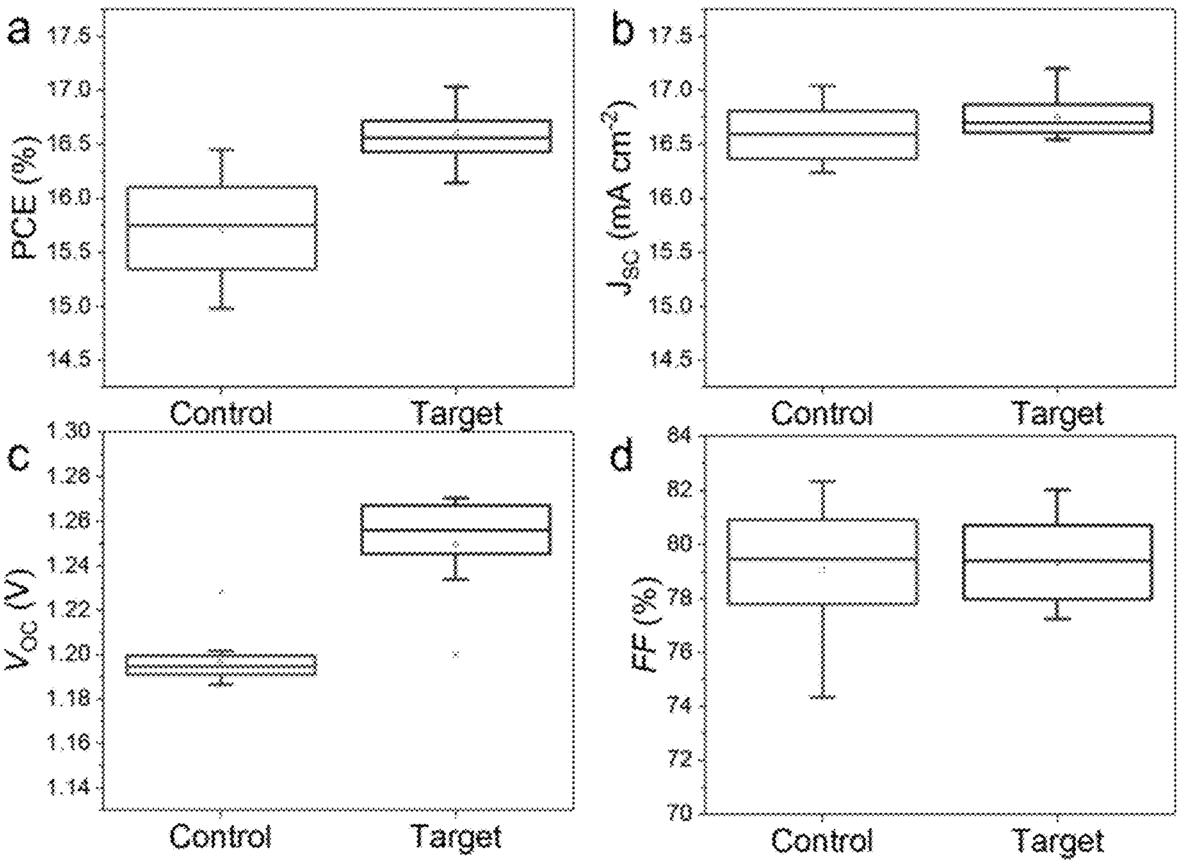

FIG. 42 depicts the (a-d) box plots of device performance for control and target wide-bandgap (1.78 eV) PVSCs. The data are from 15 devices.

Figure 43:
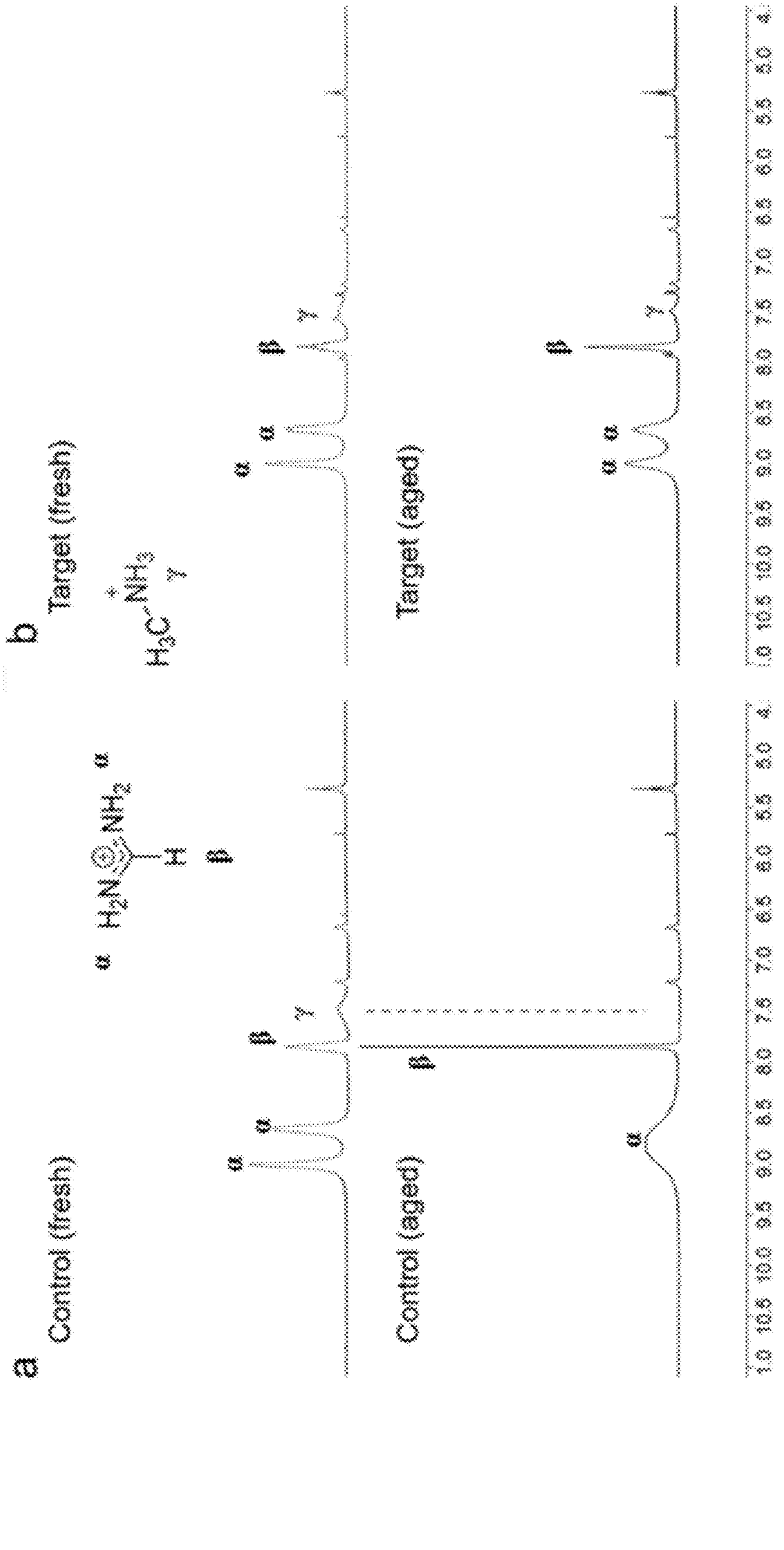

FIG. 43 depicts the 1H NMR spectra of the fresh and aged (a) control and (b) target perovskite films. The films were aged under 85±5° C. for about 72 h to accelerate the decomposition. The resonance peaks belonging to the protons (peak Y) of the MA amine disappeared in the aged sample, suggesting the loss of $MA^+$ in the control film after thermal aging. Also, the conformation of $FA^+$ changed in the aged control film, where the resonance of protons from the $NH_2$ groups (peak a) in $FA^+$ became broadened after aging. However, for target film aged under the same condition, the resonance of protons (peak Y) from MA and the inequivalent protons of the $NH_2$ groups (peak a) in $FA^+$ both well remained. These results indicate that GBAC can interact with the organic components to enhance thermal stability.

Figure 44:
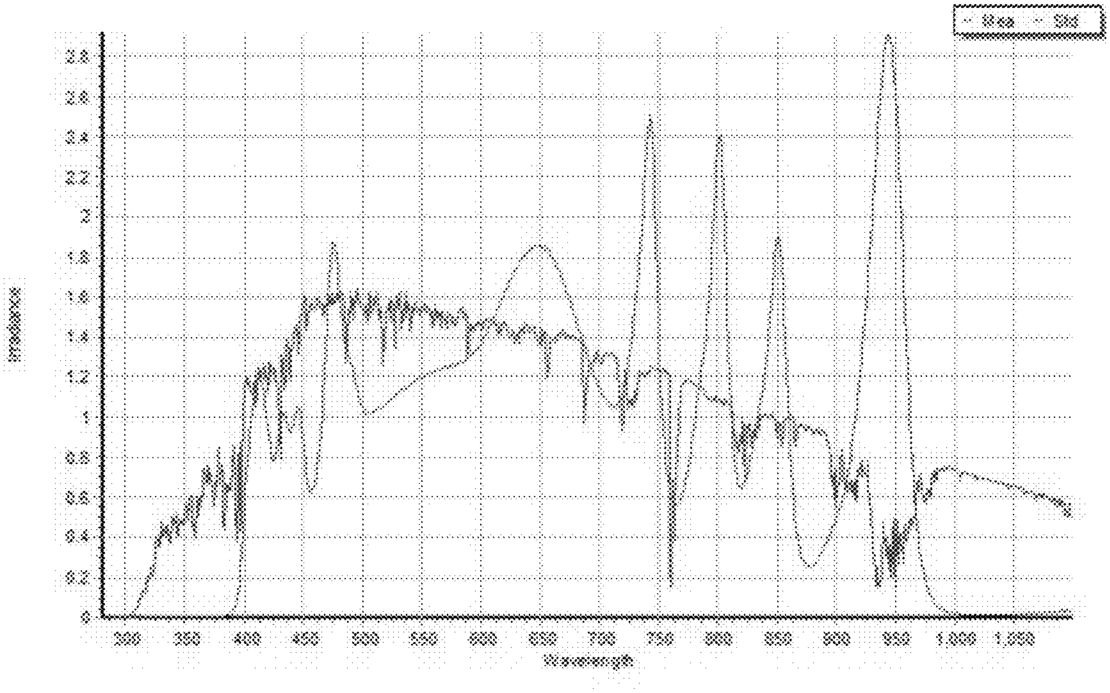

FIG. 44 depicts the spectrum of the SLED source used for the stability test.

Figure 45:
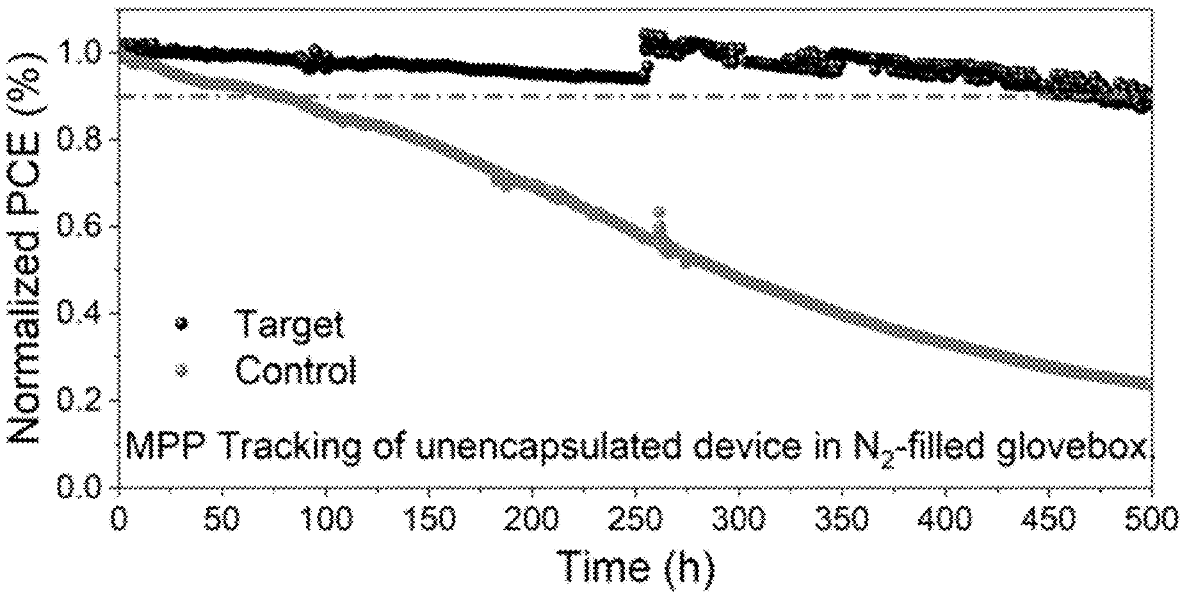

FIG. 45 depicts the maximum power point (MPP) tracking of the control and target devices. The initial PCE of the control and target device is 21.59% and 23.53%, respectively.

Figure 46:
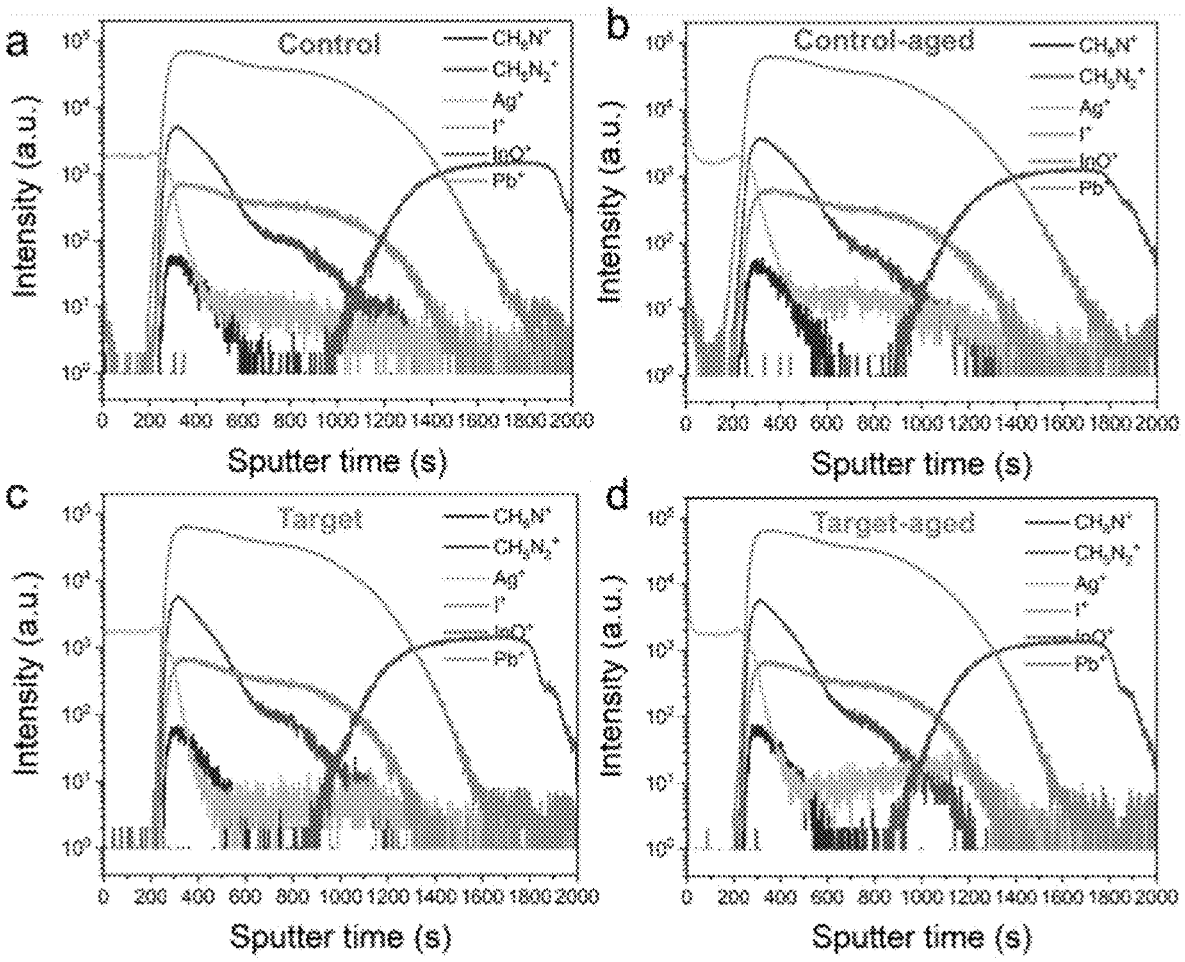

FIG. 46 depicts the ToF-SIMS profiles of the (a and b) control and (c and d) target devices. The films were aged under continuous heating (at 65±5° C.) and illumination for about 50 h.

FIG. 47 depicts a table showing representative device performances of PVSCs with an inverted (p-i-n) structure.

FIG. 48 depicts a table showing crystal data and refinement of GBAC-$PbI_2$-DMF.

FIG. 49 depicts a table showing photovoltaic parameters of the target device with GBAC addition fabricated in one batch.

FIG. 50 depicts a table showing representative device performances of single-junction PVSCs with 1-$cm^2$ active area.

FIG. 51 depicts a table showing photovoltaic parameters of the large-area (1 $cm^2$) devices with GBAC addition fabricated in one batch.

DETAILED DESCRIPTION

Definitions

Throughout the present disclosure, unless the context requires otherwise, the word "comprise" or variations such as "comprises" or "comprising", will be understood to imply the inclusion of a stated integer or group of integers but not the exclusion of any other integer or group of integers. It is also noted that in this disclosure and particularly in the claims and/or paragraphs, terms such as "comprises", "comprised", "comprising" and the like can have the meaning attributed to it in U.S. Patent law; e.g., they can mean "includes", "included", "including", and the like; and that terms such as "consisting essentially of" and "consists essentially of" have the meaning ascribed to them in U.S. Patent law, e.g., they allow for elements not explicitly recited, but exclude elements that are found in the prior art or that affect a basic or novel characteristic of the present invention.

Furthermore, throughout the present disclosure and claims, unless the context requires otherwise, the word "include" or variations such as "includes" or "including", will be understood to imply the inclusion of a stated integer or group of integers, but not the exclusion of any other integer or group of integers.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10%, ±7%, ±5%, ±3%, ±1%, or ±0% variation from the nominal value unless otherwise indicated or inferred.

As used herein, "alkyl" refers to a straight-chain or branched saturated hydrocarbon group. Examples of alkyl groups include methyl-, ethyl-, propyl (e.g., n-propyl and isopropyl), butyl (e.g., n-butyl, iso-butyl, sec-butyl, tert-butyl), pentyl groups (e.g., 1-methylbutyl, 2-methylbutyl, iso-pentyl, tert-pentyl, 1,2-dimethylpropyl, neopentyl, and 1-ethylpropyl), hexyl groups, and the like. In various embodiments, an alkyl group can have 1 to 40 carbon atoms (i.e., C1-40 alkyl group), for example, 1-30 carbon atoms (i.e., $C_1$-$C_{30}$ alkyl group). In certain embodiments, an alkyl group can have 1 to 6 carbon atoms, and can be referred to as a "lower alkyl group." Examples of lower alkyl groups include methyl, ethyl, propyl (e.g., n-propyl and isopropyl), and butyl groups (e.g., n-butyl, isobutyl, sec-butyl, and tert-butyl). In certain embodiments, alkyl groups can be optionally substituted as described herein. An alkyl group is generally not substituted with another alkyl group, an alkenyl group, or an alkynyl group.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or heterocycloalkyl rings. An aryl group can have 6 to 24 carbon atoms in its ring system (e.g., $C_6$-$C_{24}$ aryl group), which can include multiple fused rings. In certain embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In certain embodiments, aryl groups can be optionally substituted.

As used herein, "heteroaryl" refers to an aromatic monocyclic ring system containing at least one ring heteroatom selected from oxygen (O), nitrogen (N), sulfur(S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide thiophene S-oxide, thiophene S,S-dioxide). Examples of heteroaryl groups include, for example, the 5- or 6-membered monocyclic and 5-6 bicyclic ring systems shown below: where T is O, S, NH, N-alkyl, N-aryl, N-(arylalkyl) (e.g., N-benzyl), $SiH_2$, SiH(alkyl), Si(alkyl) 2, SiH(arylalkyl), $Si(arylalkyl)_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In certain embodiments, heteroaryl groups can be substituted as described herein. In certain embodiments, heteroaryl groups can be optionally substituted.

The term "optionally substituted" refers to a chemical group, such as alkyl, cycloalkyl aryl, and the like, wherein one or more hydrogen may be replaced with a substituent as described herein, for example, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, sulfonyl, sulfonamido, ketone, aldehyde, ester, heterocyclyl, aromatic or heteroaromatic moieties, $—CF_3$, —CN, or the like.

As used herein, "heteroatom" refers to an atom of any element other than carbon or hydrogen and includes, for example, nitrogen, oxygen, silicon, sulfur, phosphorus, and selenium.

As used herein, unless otherwise indicated, the term "halo" or "halide" includes fluoro, chloro, bromo or iodo.

The present disclosure relates to an effective and facile strategy for preparing high quality perovskite films that employ a MNA, which is an optionally substituted aryl or optionally substituted heteroaryl, which comprises both acidic groups and basic groups. During perovskite film fabrication, fast crystallization and disordered grain growth induce defect-rich grain boundaries, leading to large energy loss and poor performance. The MNAs described herein can be added into the precursor solution to form hydrogen bond-bridged intermediate phase with perovskite precursors, thus modulating the crystallization process and improving the film quality. The MNAs can also remain and function as defects passivator for reducing defects in the derived perovskite films.

In a first aspect, provided herein is an organic-inorganic hybrid perovskite comprising: $M^{2+}$, one or more $A^+$, and a multifunctional nonvolatile additive (MNA) comprising a cationic species having the formula $R^1Ar^1R^2$, wherein $M^{2+}$ comprises $Pb^{2+}$, $Sn^{2+}$, $Ge^{2+}$, or a mixture thereof; each of the one or more $A^+$ is independently selected from the group consisting of $Cs^+$, $Rb^+$, $CH_3NH_3^+$, $CH_3CH_2NH_3^+$, $H(C{=}NH_2)NH_2^+$, and $Me(C{=}NH_2)NH_2Ar^1$ is an optionally substituted aryl or an optionally substituted heteroaryl; $R^1$ is —COOH, $—CH_2COOH$, $—CH_2CH_2COOH$, $—SO_3H$, $—CH_2SO_3H$, $—CH_2CH_2SO_3H$, $—PO_3H_2$, $—CH_2PO_3H_2$, or $—CH_2CH_2PO_3H_2$; and $R^2$ is $—NH(C{=}NH_2)NH_2^+$ or $—N(R)_3H^+$, wherein R for each instance is independently hydrogen or $C_1$-$C_6$ alkyl, with the proviso that the one or more $A^+$ comprises $H(C{=}NH_2)NH_2^+$.

The organic-inorganic hybrid perovskite must be charge balanced. Accordingly, the organic-inorganic hybrid perovskite can further comprise one or more counter ions that balance the charge of the cationic species. Such counter ions are not particularly limited and can be any anion. Exemplary anions include, but are not limited to $F^-$, $Cl^-$, $Br^-$, $I^-$, and combinations thereof.

$Ar^1$ can be an optionally substituted phenyl, an optionally substituted pyrazine, an optionally substituted pyridazine, an optionally substituted pyrimidine, an optionally substituted furan, an optionally substituted thiophene, an optionally substituted pyrrole, an optionally substituted imidazole, an optionally substituted oxazole, an optionally substituted thiazole, an optionally substituted indole, an optionally substituted napthyl, an optionally substituted quinoline, or an optionally substituted pteridine.

In certain embodiments, the MNA is selected from the group consisting of:

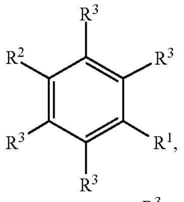, 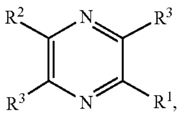, 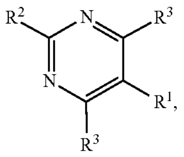, 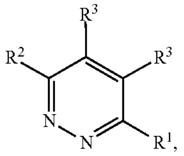, 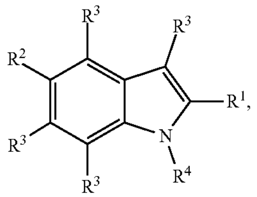, 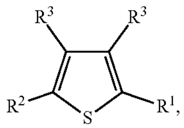, 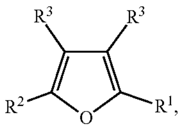, 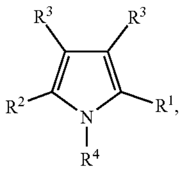, 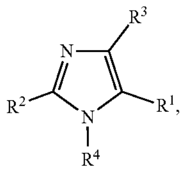, 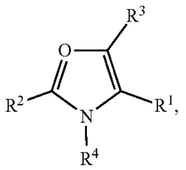, 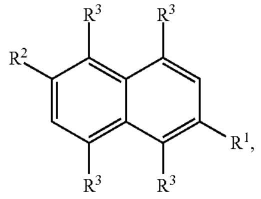, 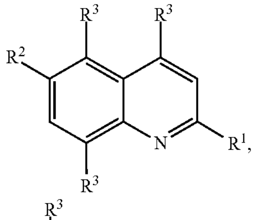, and 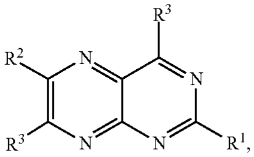, wherein $R^3$ for each instance is independently selected from the group consisting of hydrogen, $C_1$-$C_6$ alkyl, $C_1$-$C_3$ alkyl, F, Cl, Br, I, CN, SCN, —$NO_2$, —OMe, —OEt, —SMe, and —SEt; and $R^4$ is hydrogen or alkyl.

In certain embodiments, the MNA comprises a cationic species of Formula 1:

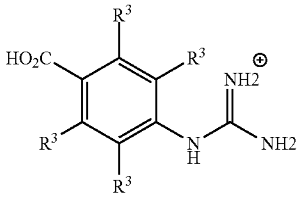

1 wherein $R^3$ for each instance is independently selected from the group consisting of hydrogen, Me, Et, F, Cl, Br, I, CN, SCN, —$NO_2$, —OMe, —OEt, —SMe, and —SEt.

In certain embodiments, $R^3$ for each instance is independently selected from the group consisting of hydrogen, Me, F, Cl, or —OMe.

The cationic species of Formula 1 can be associated with an anion selected from the group consisting of F, Cl, Br, or I.

In certain embodiments, MNA has the Formula 2:

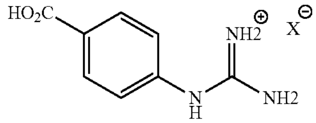

2 wherein X is $Cl^-$, Br, or I.

In certain embodiments, the one or more $A^+$ comprises $H(C{=}NH_2)NH_2^+$ and optionally one or more of $Cs^+$, $Rb^+$, $CH_3NH_3^+$, $CH_3CH_2NH_3^+$, and $Me(C{=}NH_2)NH_2^+$. In certain embodiments, $A^+$ is $Cs^+$, $CH_3NH_3^+$, $H(C{=}NH_2)NH_2^+$, or a mixture thereof.

Each instance of $A^+$ can be associated with an anion selected from the group consisting of $F^-$, $Cl^-$, $Br^-$, or $I^-$.

In certain embodiments, the organic-inorganic hybrid perovskite has the Formula 3:

$$(A^+)(M^{2+})(X^-)_3\cdot(MNA)_m \quad 3$$

wherein m is 0.01-0.5;

X is F, Cl, Br, or I;

$M^{2+}$ comprises $Pb^{2+}$, $Sn^{2+}$, $Ge^{2+}$, or a mixture thereof;

$A^+$ is $Cs^+$, $Rb^+$, $CH_3NH_3^+$, $CH_3CH_2NH_3^+$, $H(C{=}NH_2)NH_2^+$, or $Me(C{=}NH_2)NH_2^+$, or a mixture thereof;

the MNA is selected from the group consisting of:

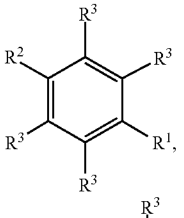, 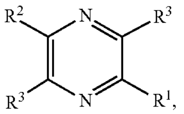, 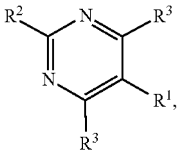, 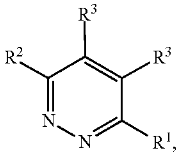, 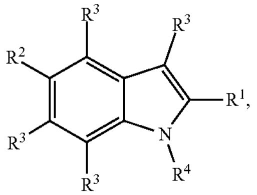, 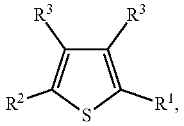, 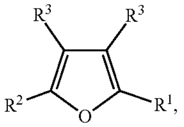, 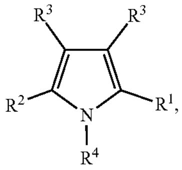, 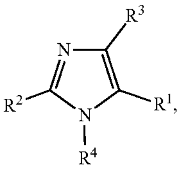, 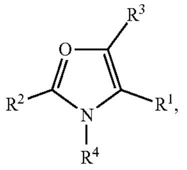, -continued

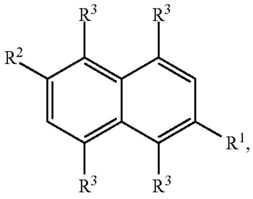,

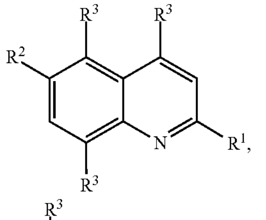, and

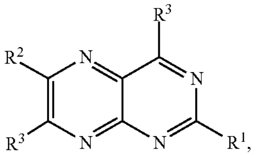, $R^1$ is —COOH, —$CH_2COOH$, —$CH_2CH_2COOH$, —$SO_3H$, —$CH_2SO_3H$, —$CH_2CH_2SO_3H$, —$PO_3H_2$, —$CH_2PO_3H_2$, or —$CH_2CH_2PO_3H_2$;

$R^2$ is —$NH(C{=}NH_2)NH_2^+$ or —N(R) $3H^+$, wherein R for each instance is independently hydrogen or $C_1$-$C_6$ alkyl;

$R^3$ for each instance is independently selected from the group consisting of hydrogen, Me, Et, F, Cl, Br, I, CN, SCN, —$NO_2$, —OMe, —OEt, —SMe, and —SEt; and $R^4$ is hydrogen or alkyl, with the proviso that $A^+$ comprises $H(C{=}NH_2)NH_2^+$.

In certain embodiments, m is 0.01-0.5, 0.1-0.5, 0.2-0.5, 0.3-0.5, 0.4-0.5, 0.04-0.5, 0.04-0.4, 0.04-0.3, 0.04-0.2, 0.04-0.1, 0.04-0.09, 0.04-0.08, 0.04-0.07, 0.04-0.06, or 0.04-0.05.

Figure 2:
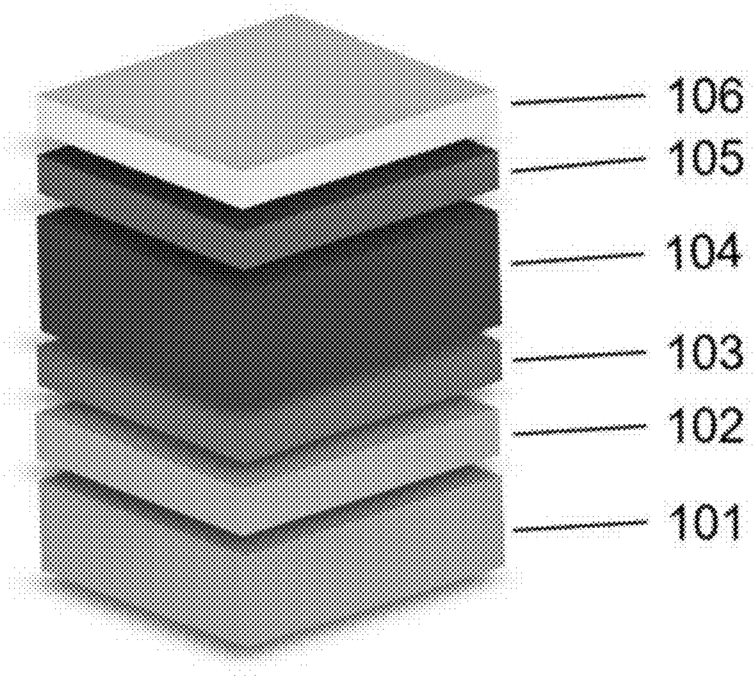
FIG. 2 depicts device structure of the p-i-n perovskite solar cells, including a substrate layer (101); a transparent conductive layer (102); a hole-transport layer (103); a perovskite functional layer (104); an electron-transport layer (105); and a metal electrode (106).

The present disclosure also provides electronic devices comprising the organic-inorganic hybrid perovskite described herein. Referring to FIG. 2, the electronic device can comprise: a substrate layer (101); a transparent conductive layer (102) disposed on a surface of the substrate layer (101), a hole-transport layer (103) disposed on the surface of the substrate layer (102); a perovskite functional layer (104) comprising the organic-inorganic hybrid perovskite described herein disposed on a surface of the hole-transport layer (103); an electron-transport layer (105) disposed on the surface of the perovskite functional layer (104); and a metal electrode (106) disposed on the surface of the electron-transport layer (105).

The substrate (101) can comprise a flexible or rigid material with light transmittance greater than 80% (at 550 nm). In certain embodiments, the substrate comprises: polymethyl methacrylate (PMMA), polycarbonate (PC), polystyrene, (PS), polyethylene glycol terephthalate, (PET), polyethylene naphthalate (PEN), polydimethylsiloxane (PDMS), styrene-ethylene-butylene-styrene (SEBS), ethylene terephthalateco-1,4-cylclohexylenedimethylene terephthalate (PETG), acrylonitrile butadiene styrene copolymers (ABS), polypropylene (PP), polyamide (PA) acrylonitrile-styrene copolymer (AS), or mixtures thereof.

The transparent conductive layer (102) can comprise aluminum- or indium-doped zinc oxide, magnesium-indium oxide, nickel-tungsten oxide, gallium nitride, zinc selenide, zinc sulfide, zinc oxide (ZnO), tin oxide ($SnO_2$), lithium fluoride (LiF), zinc indium tin oxide (ZITO), indium tin oxide (ITO), aluminum zinc oxide (AZO), fluorine tin oxide (FTO), graphene, poly(3,4-ethylenedioxythiophene) polystyrene sulfonate (PEDOT:PSS), silver nanowire, copper nanowire, or a mixture thereof.

The aforementioned hole-transport layer (103) can comprise SAMs (self-assembled monolayer), PTAA (poly (triaryl amine), PTAA), PEDOT:PSS, $NiO_x$, Spiro-OMeTAD, or mixtures thereof.

The perovskite functional layer (104) comprises a organic-inorganic hybrid perovskite described herein.

The electron-transport layer (105) can comprise $PC_{61}BM$, C60, $SnO_2$, or a mixture thereof.

The metal electrode can comprise any metal with resistivity less than $5\times10^{-7}$ Ω·m (at 25° C.). Exemplary metal electrode metals include, but are not limited to Ag, Cu, Au, Al, W, Fe, Pt. and mixtures thereof.

In certain embodiments, the electronic devised is prepared as follows: the substrate layer (101) is deposited with transparent conductive layer (102) (5~70 Ωsq-1) were sequentially cleaned by sonication with detergent, deionized water, acetone, and isopropyl alcohol for 15-90 min, respectively. Then, the substrates were dried at 40-125° C. in oven for over 1 h. The cleaned and dry substrates were treated with oxygen plasma for 10-75 min and then transferred into a $N_2$-filled glovebox before use. The hole-transport solution was spin-coated onto the 102-transparent conductive layer at 1000-10000 rpm for 5~90 s and the substrates were subsequently annealed at 75-180° C. for 5-90 min to form the 103—hole-transport layer. The perovskite solutions were spin-coated onto hole-transport layer (103) at 300-12000 rpm for 10-140 s. The antisolvent was slowly dripped onto the center of film at 3-35 s before the end of spin-coating. The as-prepared perovskite films were subsequently transferred to the hotplate at 65-180° C. for 6-120 min. The spin-coating processes were all conducted when the substrates and films were cool down at room temperature. Finally, electron-transport layer (105) and metal electrode (106) were thermally evaporated under high vacuum (<$5\times10^{-6}$ Torr).

In certain embodiments, the MNA is introduced into the precursor solution as follows: The MNAs powder or solution is added directly into the perovskite precursor with the molar ratio of 0.01~50 mol % relative to $M^{2+}$. To ensure the MNAs interact with the perovskite precursor, the solution can be mixed by vortex mixer prior to use.

In certain embodiments, the rigid/flexible electronic device fabrication is as follows: the perovskite precursor solution is meniscus-coated on the substrate layer (101)/transparent conductive layer (102)/hole-transport layer (103). Next, substrates coated with perovskite precursor are heat-annealed at 75-200° C. for 5-120 min on hotplate. Then the electron-transport materials dissolved in anhydrous chlorobenzene to form the electron-transport layer (105). Finally, the 1 metal electrode (106) is deposited by vacuum evaporation under high vacuum (<$5\times10^{-6}$ Torr).

In certain embodiments, the organic-inorganic hybrid perovskite has a chemical formula of $Cs_{0.01\text{-}0.5}MA_{0.01\text{-}0.5}FA_{0.01\text{-}0.5}PbI_3$. 1.0~2.5 M perovskite precursor solutions were constructed by mixing FAI, $PbI_2$, MAI, and CsI powders in 1 mL DMF:DMSO mixed solvent (4:1/v:v). 1-10 mol % excessive $PbI_2$ and 1~40 mol % MACI were added into the precursor solution. For target perovskite with MNAs, the solution of MNAs or solid powder was added in the precursor solution directly with the final molarity of 0.01-0.5 M. The prepared precursor solution can be mixed by vortex mixer prior to use.

Figure 1:
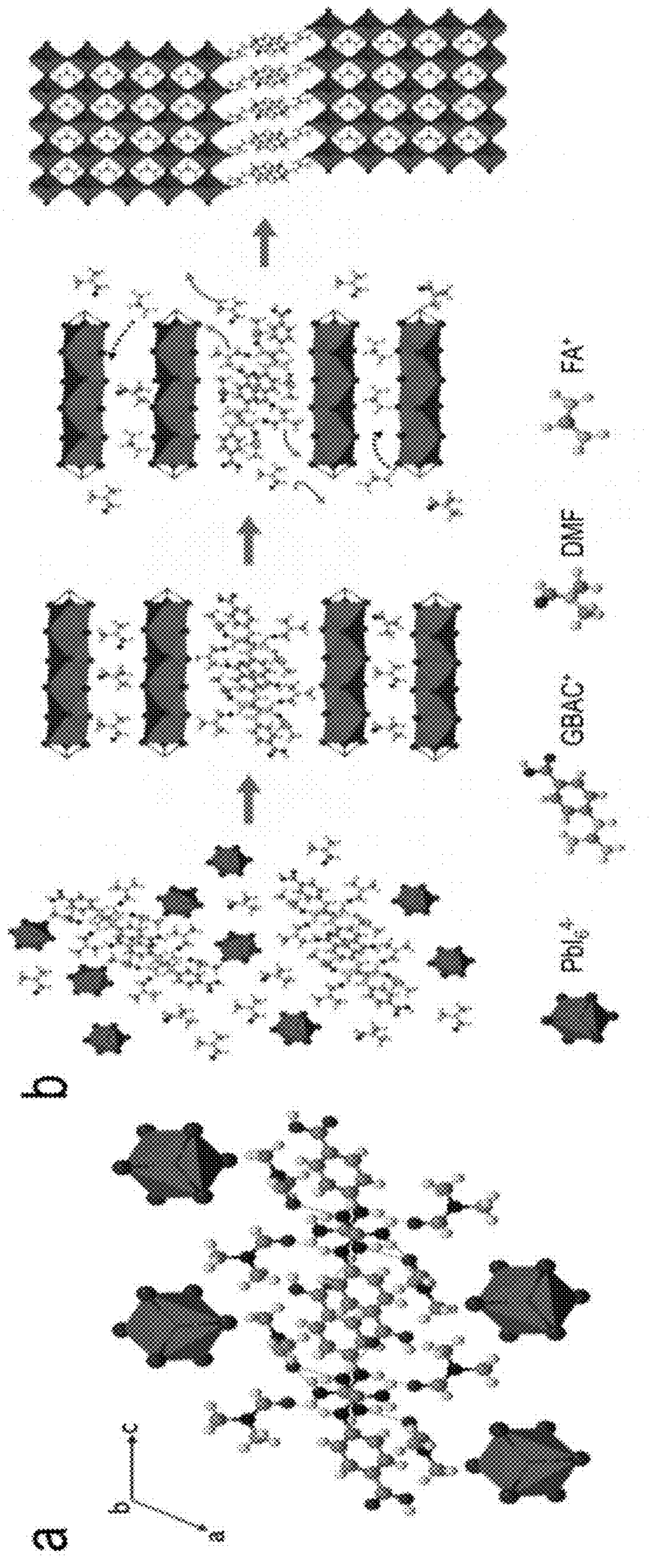
FIG. 1 depicts (a) Crystal structure of the GBAC-$PbI_2$-DMF intermediate, the hydrogen bonds are marked in cyan-blue. (b) Schematic illustration of GBAC-assisted film growth. The solid arrow represents the breakage of hydrogen bonds, and the dashed arrow represents the cation exchange.

The molecular structure and the formed hydrogen-bond bridged intermediate phase of one typical MNA (4-guanidinobenzoic acid hydrochloride, GBAC) are shown in FIG. 1*a*. Strong cyclic hydrogen bonding formed between carboxylic acid and guanidino groups, and between DMF and guanidino group are found. The DMF molecules locked by these hydrogen bonds help isolate the $PbI_2$ sheets and GBAC layer, leading to a 1D organic-inorganic hybrid chain structure. This GBAC-$PbI_2$-DMF intermediate phase forms upon the addition of GBAC into perovskite precursor and can modulate the film formation with highly enhanced film quality. FIG. 1*b* shows the multifunctionality of GBAC during film formation, during which it will first form the intermediate phase with perovskite precursor and solvent and then slow down the crystallization process thermodynamically and kinetically. After annealing, the molecules will pack rigidly at grain boundaries after DMF evaporation due to the π-π interaction between the molecules.

In the embodiment of FIG. 2, Glass, ITO, DC-PA ((2-(2, 7-dimethoxy-9H-carbazol-9-yl) ethyl)phosphonic acid), $Cs_{0.06}MA_{0.14}FA_{0.80}PbI_3$, C60/BCP and Ag are used as substrate layer (102), transparent conductive layer (102), hole-transport layer (103), perovskite functional layer (104), electron-transport layer (105) and metal electrode (106), respectively. The perovskite functional layer contains the MNAs as described above. The manufacturing method of the perovskite solar cells is as follows: ITO glass (15 (2 sq-1) was progressively washed by sonication with detergent (Decon 90), deionized water, acetone, and isopropyl alcohol for 15 min, respectively. Washed ITO glass was dried in a 75° C. oven for over 12 hours. Then, the cleaned ITO substrates were dealt with UV ozone for 25 min and transformed into $N_2$-filled glovebox for film fabrication. DC-PA (2 mg/mL in IPA) was dynamic spin-coated onto the cleaned ITO at 3000 r.p.m. for 30 s, following with annealing at 100° C. for 15 min. The substrates were cool down to room temperature and washed by pure IPA. Then annealed at 100° C. for 5 min. 1.7 M perovskite precursor solutions were constructed by mixing FAI, $PbI_2$, MAI, and CsI in DMF: DMSO mixed solvent (4:1/v:v) with a chemical formula of $Cs_{0.06}MA_{0.14}FA_{0.80}PbI_3$. 5 mol % excessive $PbI_2$ and 10 mol % MACI were added into the precursor solution. For target perovskite with MNAs, the solution of MNAs or solid powder was added in the precursor solution directly. The molar ratio of the MNA is 0.8 mol %. 50 μL of the prepared precursor solution was spin-coated at 1000 rpm for 10 s and 5000 r.p.m. for 30 s onto the DC-PA based ITO substrate, 170 μL CB as anti-solvent was dripped on the film at 10 s before the end of the last procedure and then annealed at 100° C. for 30 min. The spin-coating processes were all conducted when the substrates and films were cool down at room temperature. Finally, 20 nm C60, 6 nm BCP and 100 nm silver electrode was thermally evaporated under high vacuum ($<4\times10^{-6}$ Torr).

Figure 3:
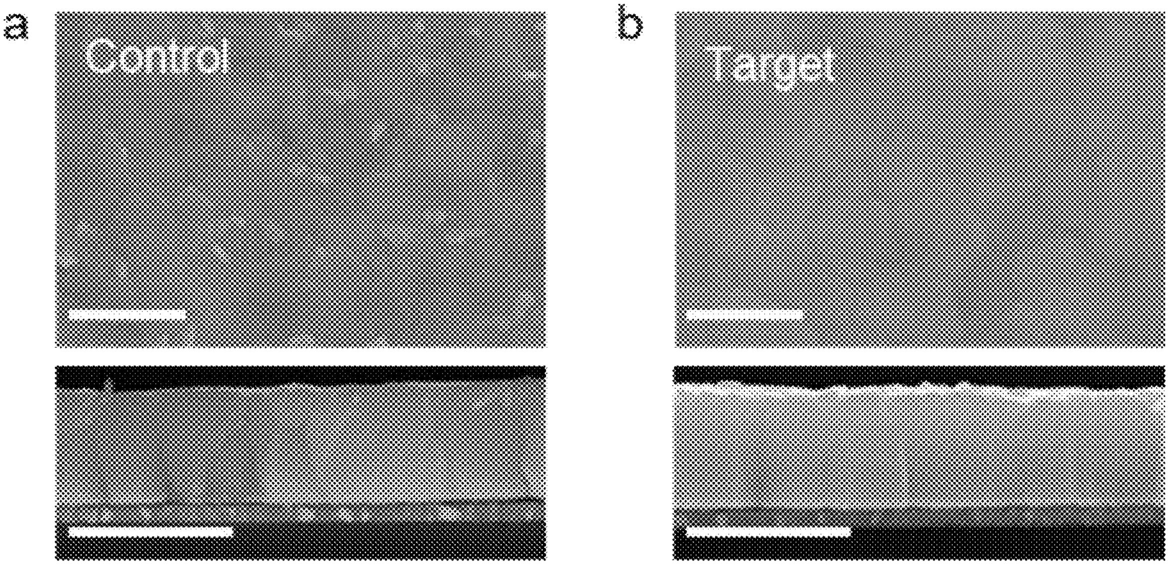
FIG. 3 depicts scanning electron microscopy (SEM) images of the (a) control and (b) target perovskite films. The scale bar is 1 μm.
Figure 4:
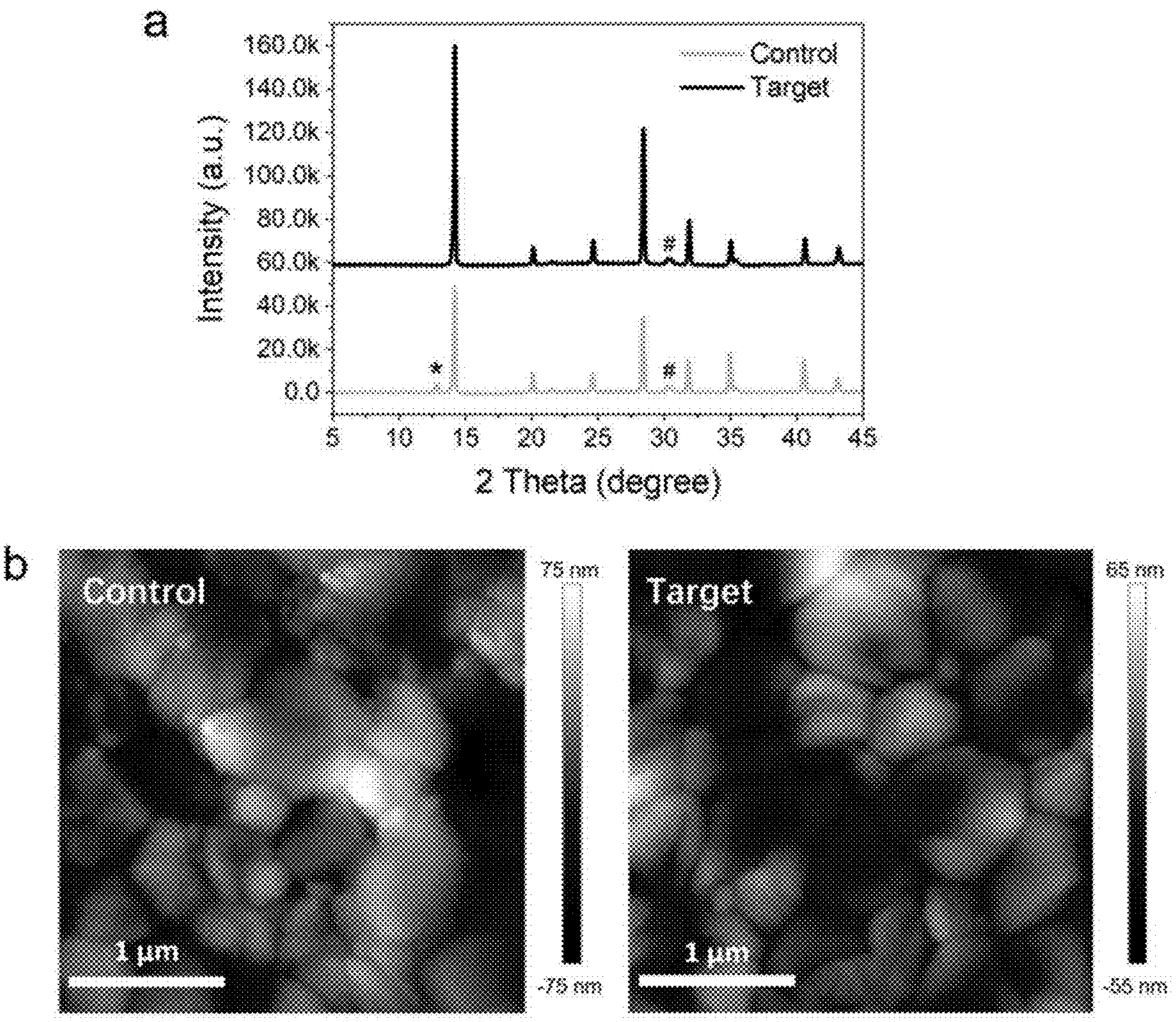
FIG. 4 depicts (a) XRD patterns and (b) the AFM images of the control and target perovskite films.
Figure 5:
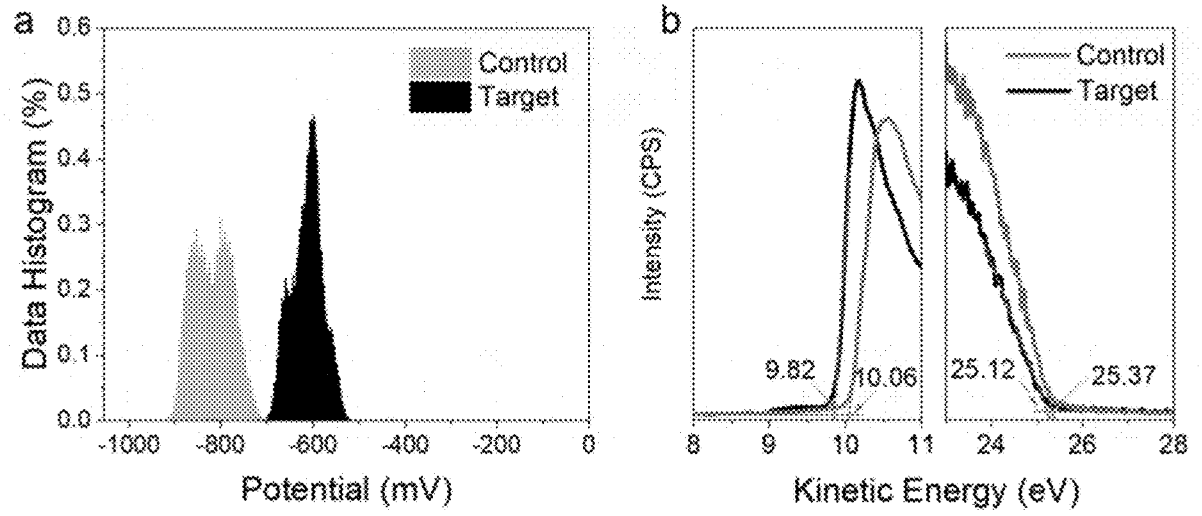
FIG. 5 depicts (a) the statistical distribution of surface potential extracted from KPFM images. (b) UPS results of control and target perovskite films.

The enhanced film quality can be first characterized by scanning electron microscopy (SEM) for recording surface morphology. FIG. 3 shows that the target perovskite film with MNAs shows considerably enhanced surface morphology with larger grain sizes and fewer residual $PbI_2$ sheets than the control film. The average grain size of target film is about 1 μm, which leads to fewer grain boundaries and more coherent grain growth from bottom to surface. In addition to good film morphology, the crystallinity of target perovskite film is significantly improved with MNAs. The decreased $PbI_2$ sheets in SEM was also confirmed by reviewing the XRD pattern (FIG. 4*a*), with the disappearance of the small peak (located at 12.8° corresponding to $PbI_2$) in control film after adding MNAs. The results from atomic force microscopy (AFM) show that the average roughness (Ra) of the film decreased from 16.8 nm to 12.6 nm after MNAs, demonstrating a smoother film surface for facilitating charge transport at the interfaces (FIG. 4*b*). Kelvin probe force microscopy (KPFM) was also employed to evaluate the distribution of surface potential of perovskite films. The surface potential of target perovskite film is higher than that of the control film, indicating the Fermi level ($E_f$) of the target film is closer to the conductive band edge. As depicted in FIG. 5*a*, the statistical distribution of surface potential extracted from KPFM images shows a 200-300 mV increase in the target film. The higher work function measured by KPFM matches well with the results obtained from ultraviolet photoelectron spectroscopy (UPS) when a 0.25-eV shift of $E_f$ is observed by adding GBAC (FIG. 5*b*). The more n-characteristic film should be deriving from the modified surface termination after adding GBAC, which enables more efficient charge transfer between perovskite and electron-transporting materials.

Figure 6:
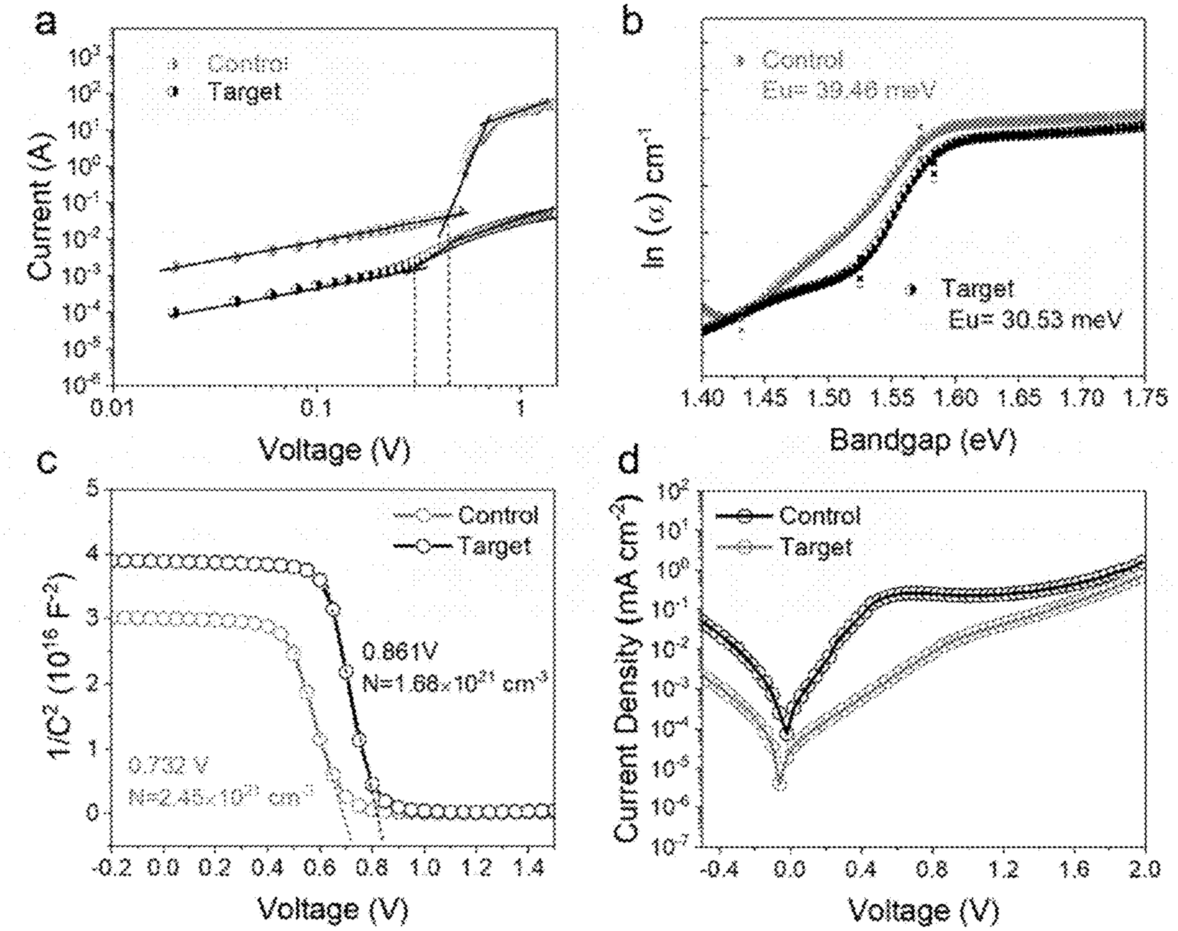
FIG. 6 depicts (a) Space charge-limited current (SCLC) measurements of the hole-only devices (ITO/PEDOT:PSS/Perovskite/$MoO_3$/Ag). (b) Plot of In(α) vs E (=eV) to extract the Urbach energy of control and target perovskites. (c) Capacitance-voltage (Mott-Schottky) plots of the control and target devices. (d) Dark J-V curves of the control and target devices.

Benefited from the modulated film growth and defect passivation by MNAs, the trap density of the perovskite film is decreased from $2.64\times10^{16}$ $cm^{-3}$ to $1.76\times10^{16}$ $cm^{-3}$ (FIG. 6*a*). The Urbach energy ($E_u$) of the resultant perovskite is also reduced from 40 meV to 30 meV after adding the MNAs (FIG. 6*b*), which is likely due to the reduced band edge disorder and defect density. Capacitance spectroscopy and the dark J-V measurements of control and target devices were also applied to investigate the carrier profile, showing the typical P-N junction characteristics. The smaller diffusion potential ($V_d$) (FIG. 6*c*) and much lower leakage current (FIG. 6*d*) of target devices confirm the enhanced charge transport with less defect-induced recombination, which is very important for achieving high-efficiency solar cells with large $V_{OC}$s.

Figure 7:
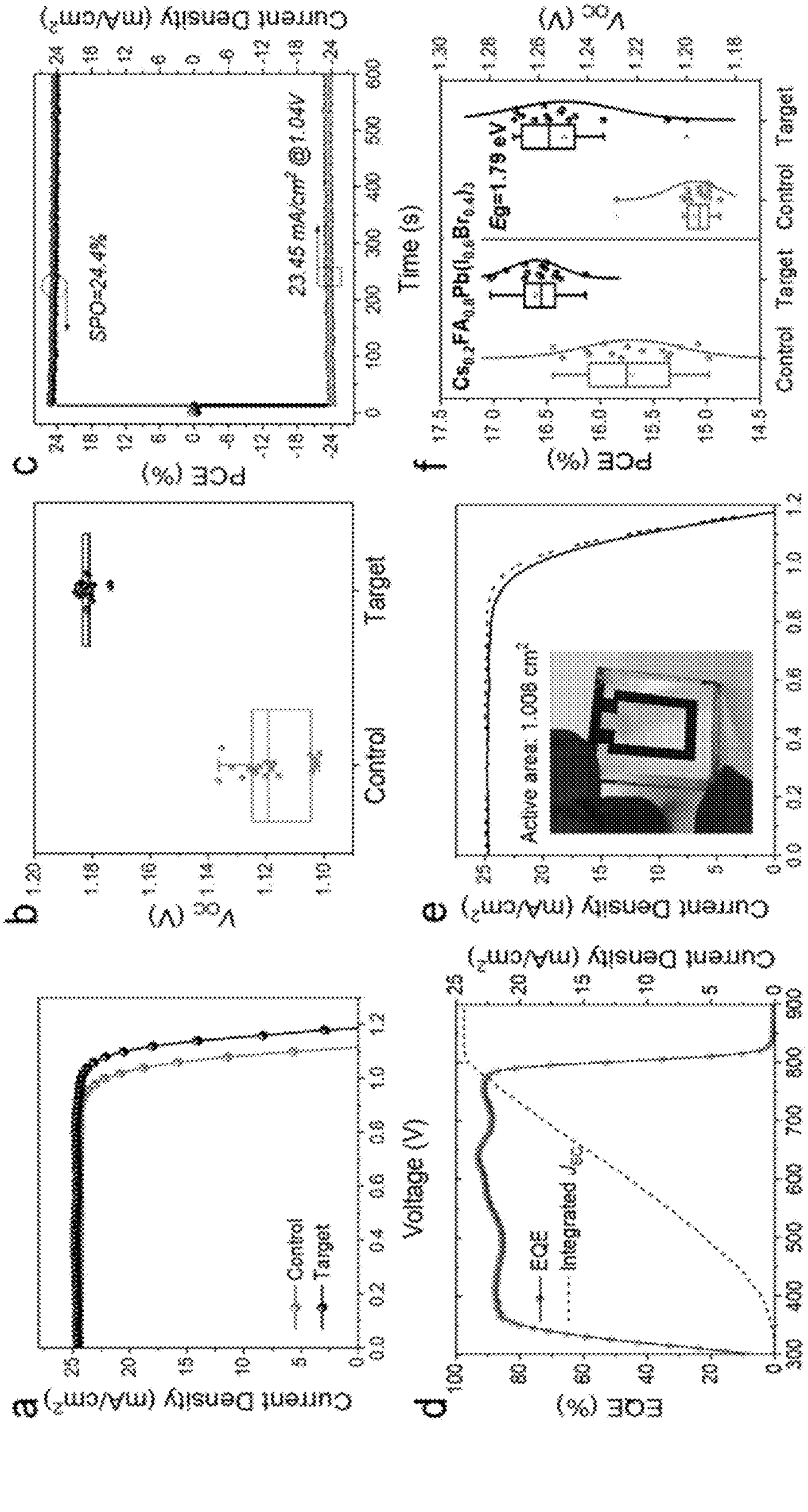
FIG. 7 depicts (a) J-V curves of the champion devices. (b) Box plot of the $V_{OC}$ distribution of control and target devices. (c) Stable output and (d) EQE curve of the target champion device. (e) J-V curve of the champion device with an active area of 1.008 $cm^2$, inset is the photograph of device. (f) Box plots of device performance for control and target wide-bandgap (1.78 eV) PVSCs.

Inverted PVSCs were fabricated to evaluate the photovoltaic performance based on MNAs modified perovskite film. As shown in FIGS. 7*a* and *b*, the highest PCE of the control device is 22.8%, with a $V_{OC}$ of 1.12 V, $J_{SC}$ of 24.48 mA/$cm^2$ and FF of 83.01%. However, the champion PCE of the GBAC treated target device is significantly improved to 24.8% ($V_{OC}$ of 1.19 V, $J_{SC}$ of 24.55 mA/$cm^2$, FF of 84.78%). The stabilized power outputs at the maximum power point (MPP) of target champion device is 24.4%, which matches well with the PCEs from the J-V curve measurement (FIG. 7*c*). FIG. 7*d* shows the external quantum efficiency (EQE) of the champion device, displaying an integrated photocurrent of 24.38 mA/$cm^2$, matching well with the values obtained from J-V curves. Box plot of the device performance. A large-area PVSCs could also be fabricated to evaluate the potential for using this strategy for upscaling. As shown in FIG. 7*e*, a larger area device (1.008 $cm^2$) was made that exhibited a PCE of 22.7% ($V_{OC}$=1.18 V, $J_{SC}$=24.83 mA $cm^{-2}$, FF=77.43%). To demonstrate the general applicability of this strategy to different perovskite compositions, the device based on a larger bandgap (1.78 eV) perovskite ($Cs_{0.2}FA_{0.8}Pb(Br_{0.6}I_{0.4})_3$) commonly used for fabricating tandem cells was also tested. Its average PCE was shown to increase from 15.70% to 16.61% with average $V_{OC}$ improved from 1.19 V to 1.25 V (FIG. 7*f*).

Figure 8:
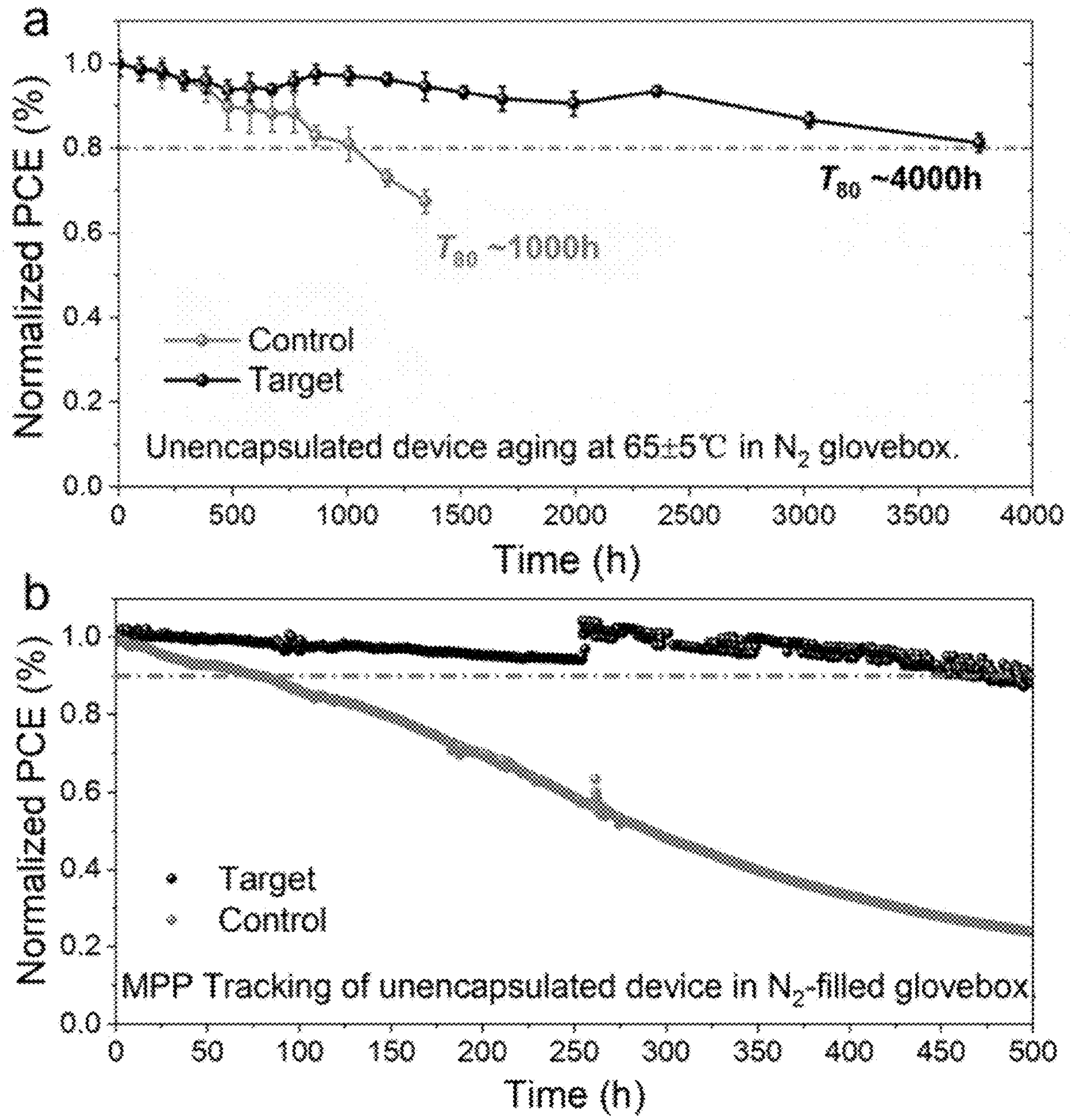
FIG. 8 depicts (a) Long-term thermal stability and (b) MPP tracking of the control and target devices.
Figure 9:
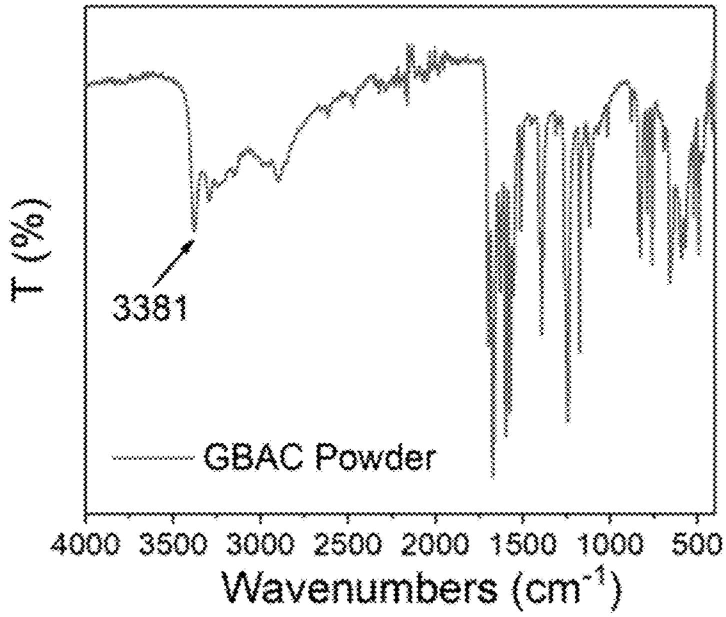
FIG. 9 depicts the Fourier-transform infrared spectroscopy (FTIR) spectrum of the pure GBAC powder, which shows the N—H stretching of GBAC exists at 3381 $cm^{-1}$.
Figure 10:
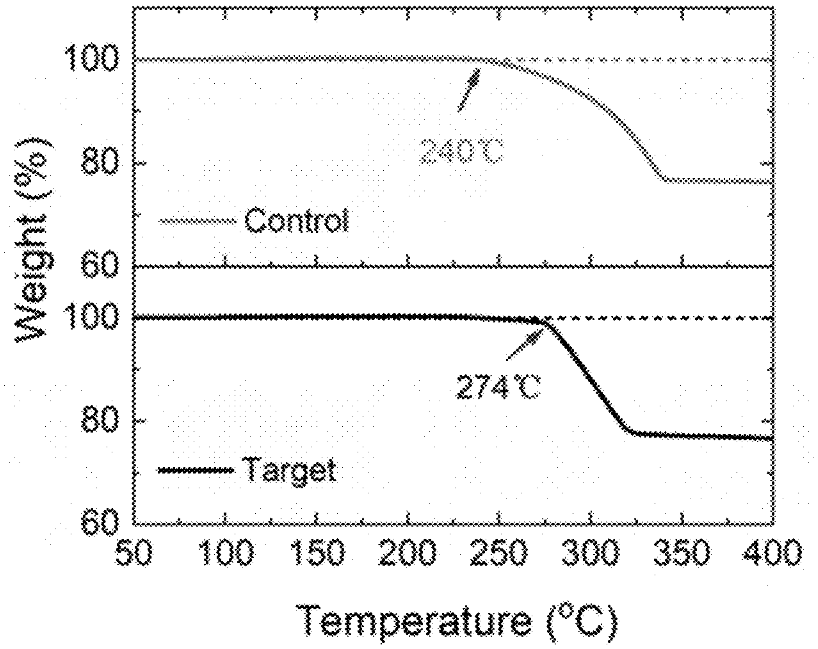
FIG. 10 depicts the thermogravimetric analysis (TGA) of the control and target perovskite films scraped from substrates.
Figure 11:
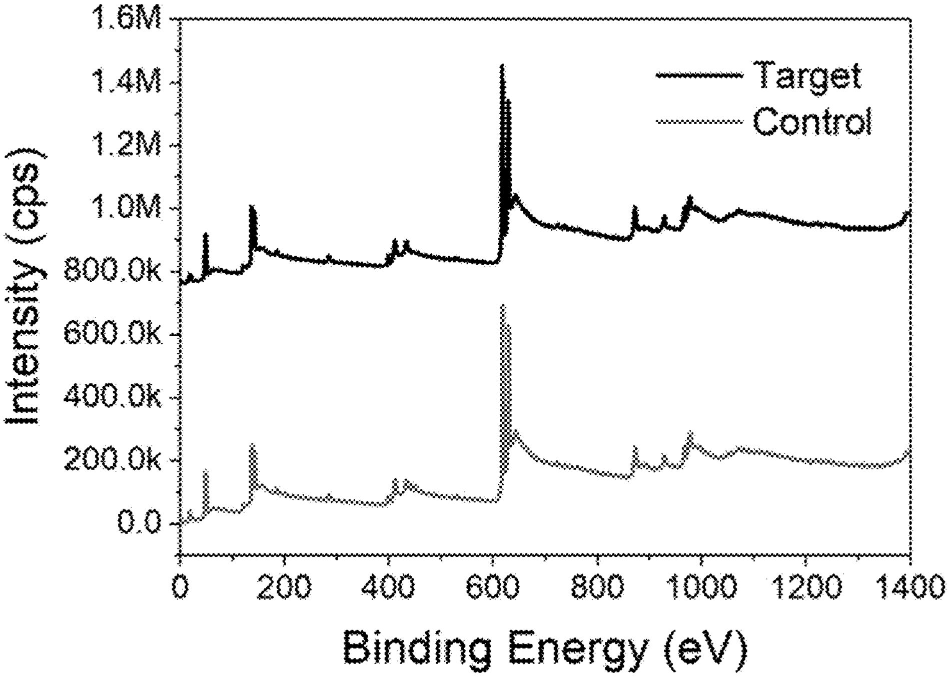
FIG. 11 depicts the full-scale X-ray photoelectron spectroscopy (XPS) spectrum of control and target perovskite films.
Figure 12:
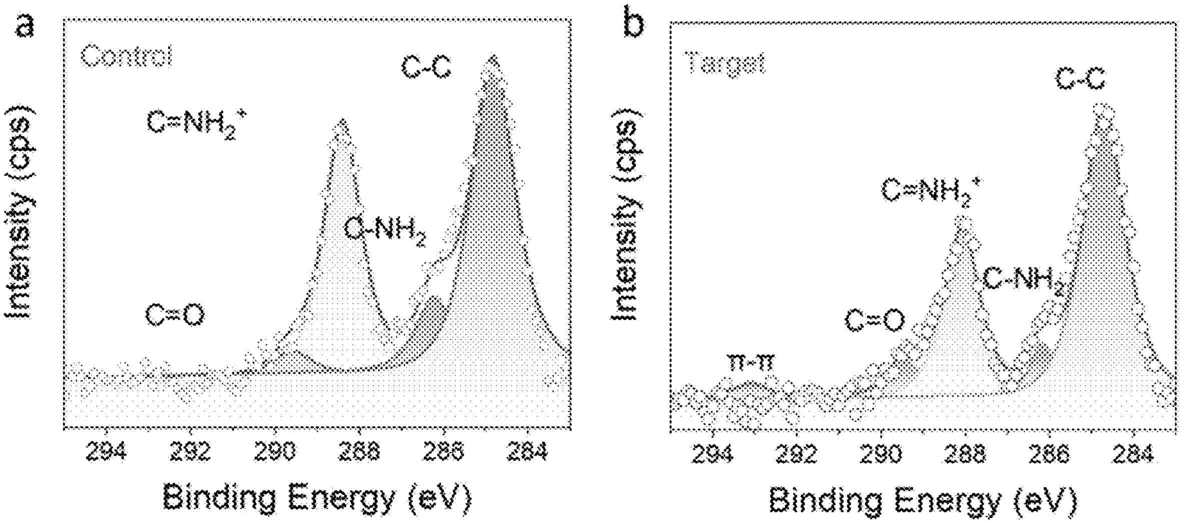
FIG. 12 depicts the C1s spectrum of the (a) control and (b) target perovskite films.
Figure 13:
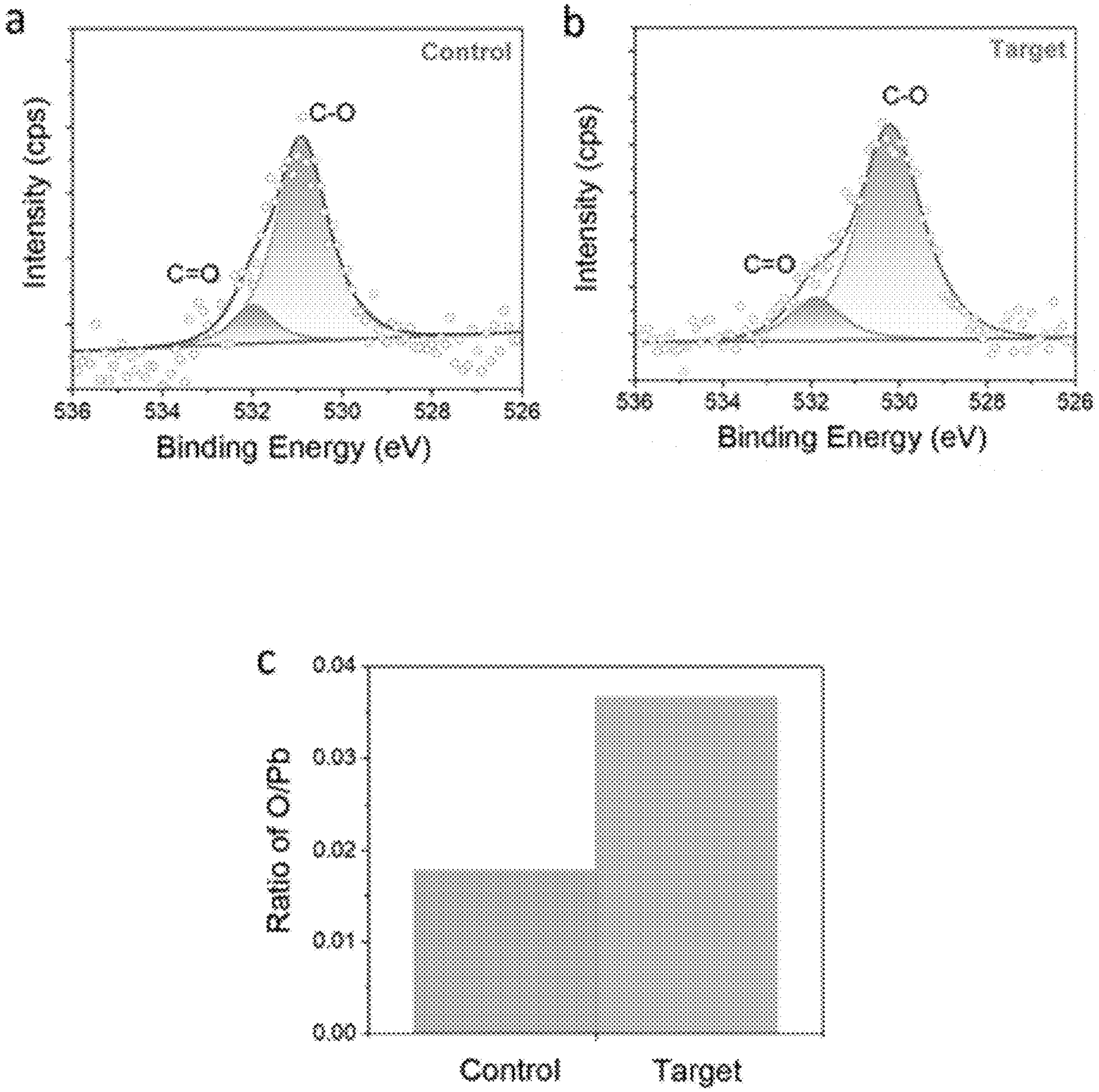
FIG. 13 depicts the O1s spectrum of the (a) control and (b) target perovskite films. (c) The intensity ratio of O/Pb demonstrates the increased content of O.
Figure 14:
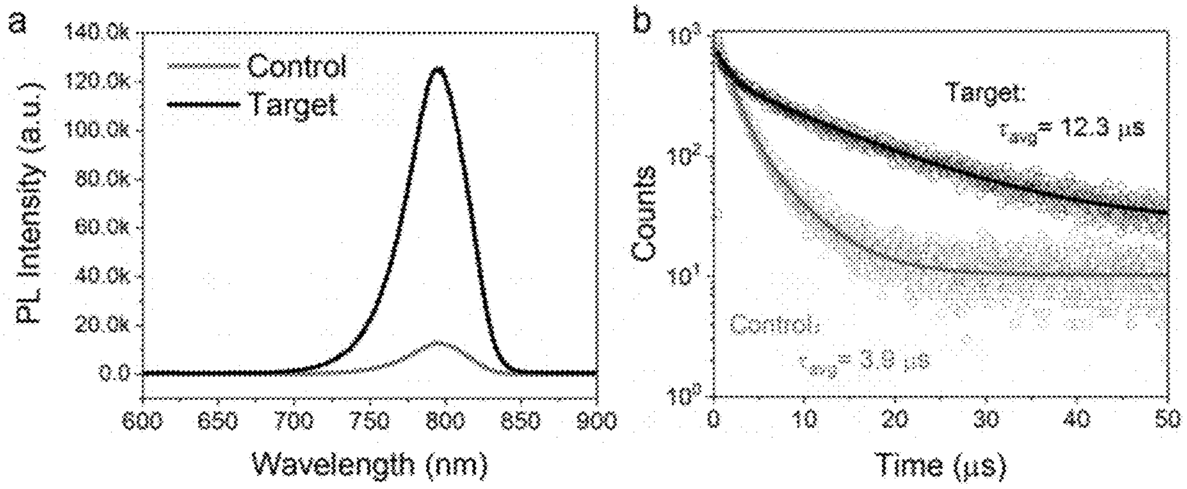
FIG. 14 depicts the (a) steady-state PL and (b) time-resolved photoluminescence (TRPL) of the control and target perovskite films on glass.
Figure 15:
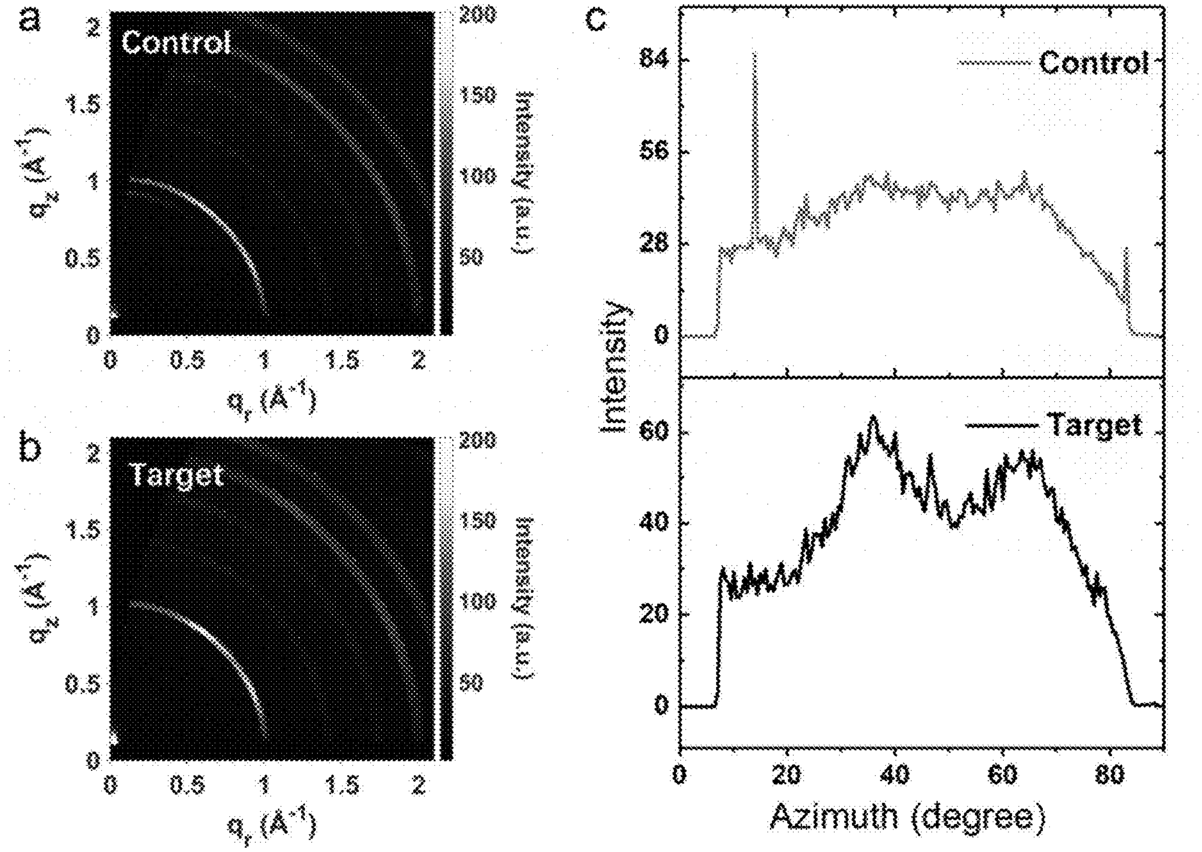
FIG. 15 depicts the GIWAXS images of the (a) control and (b) target perovskite films. (c) Corresponding intensity plots azimuthally along the ring at the qr axis.
Figure 16:
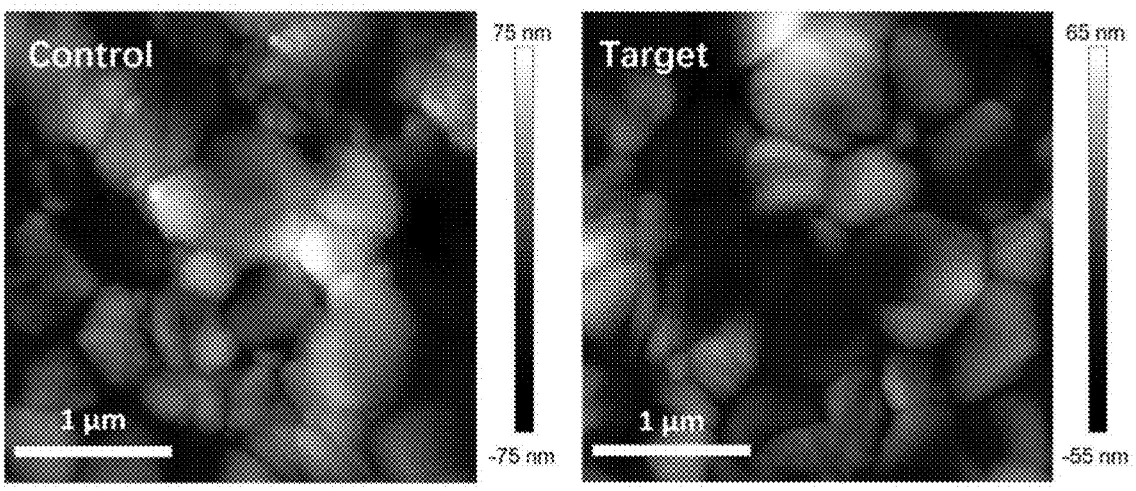
FIG. 16 depicts the atomic force microscopy (AFM) images of the control and target perovskite films. The average surface roughness of the film reduced from 16.8 nm to 12.6 nm after GBAC addition.
Figure 17:
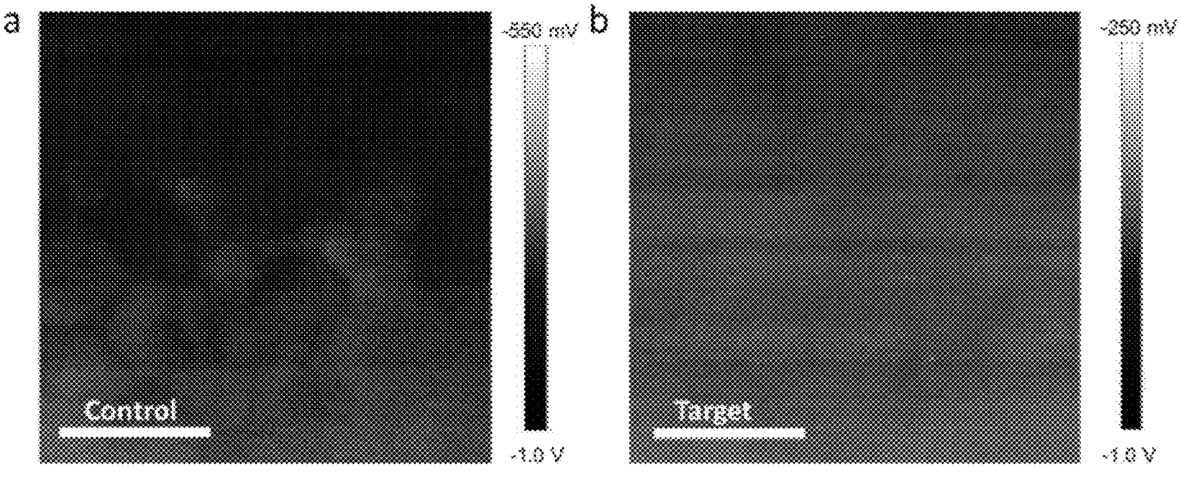
FIG. 17 depicts the Kelvin probe force microscopy (KPFM) images of the (a) control and (b) target perovskite films, the scale bar is 1 μm.
Figure 18:
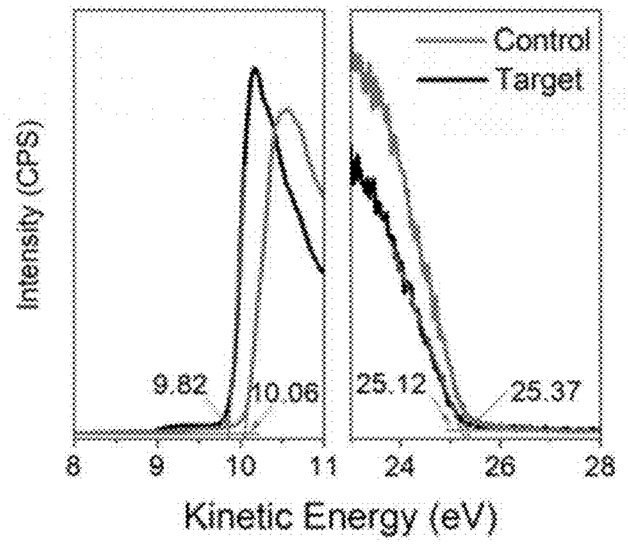
FIG. 18 depicts the ultraviolet photoelectron spectroscopy (UPS) results of control and target perovskite films.
Figure 19:
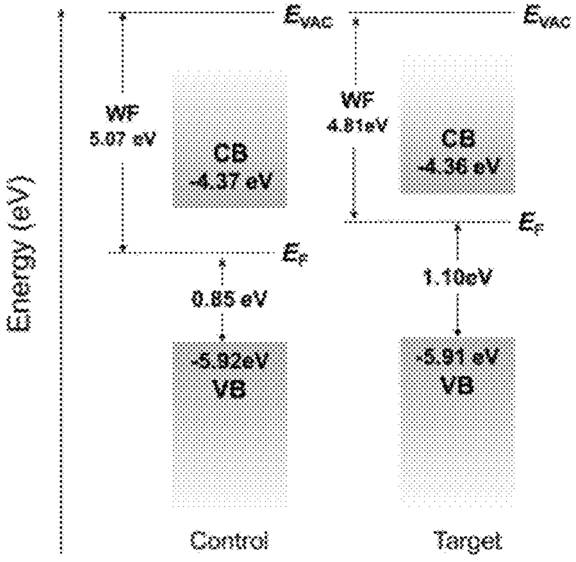
FIG. 19 depicts the energy-level scheme for the control and perovskite films based on the parameters derived from UPS spectra.
Figure 20:
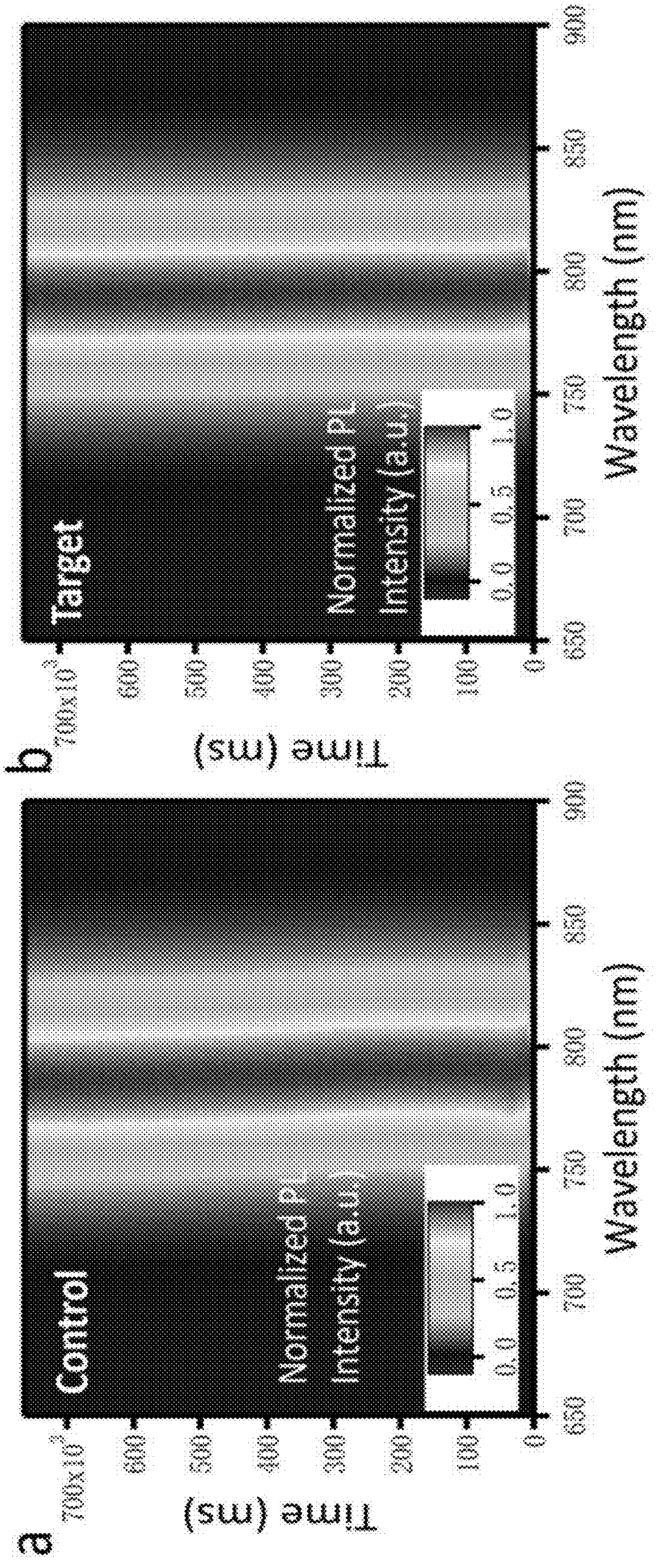
FIG. 20 depicts the overall PL peak evolution of (a) control and (b) target perovskite films in ambient.
Figure 21:
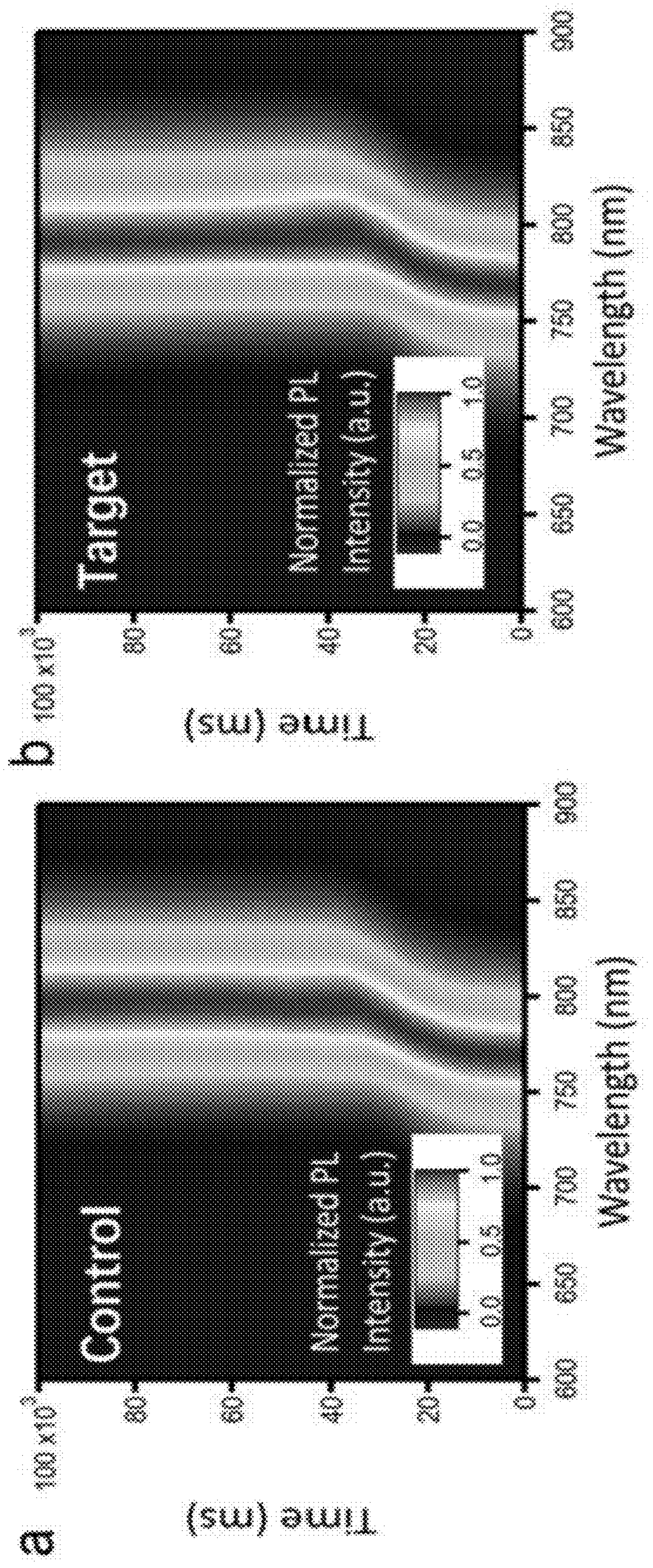
FIG. 21 depicts the evolution of the in-situ PL peak position for (a) control and (b) target perovskite films annealed in an $N_2$-filled glove box, which shows similar peak shifting with the results acquired in ambient air, due to the quantum confinement of nanograins and the compositional evolution of perovskite.
Figure 22:
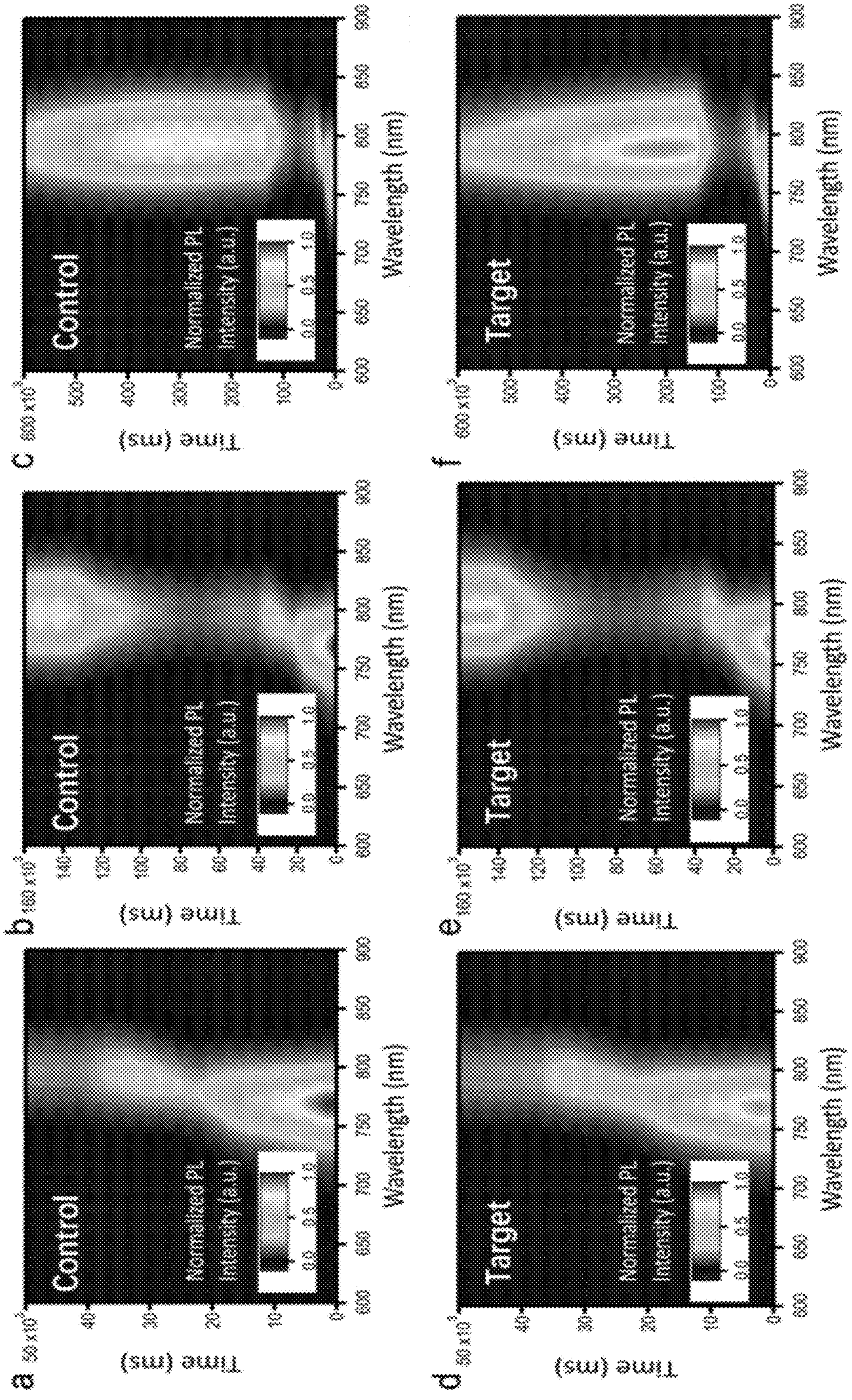
FIG. 22 depicts the evolution of the in-situ PL intensity for (a-c) control and (d-f) target perovskite films annealed in an $N_2$-filled glove box. The overall evolution of PL intensity of control and target films show the same "up-down-up-down" trends as those acquired results in ambient. The growth stage of the target film has been retarded with GABC addition, taking more than 80 s for the target film to reach the final stage. Also, the PL intensity of the control film reaches its maximum in <10 s, while the PL intensity of the target film reaches its maximum in a much longer time span of ~200 s. Moreover, the full width at half maximum (FWHM) of the stabilized PL peak in the target film is much narrower than that of the control film, indicating better phase homogeneity. These results show that the GBAC can help slow down the film formation and improve the film quality considerably, which is in accord with the results acquired from ambient air.
Figure 23:
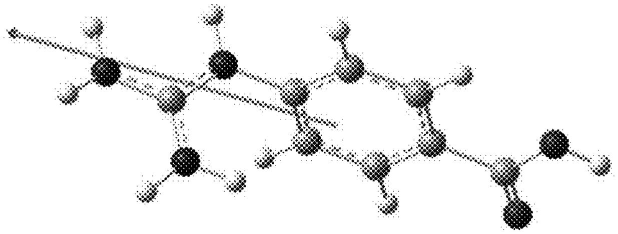
FIG. 23 depicts the dipole of $GBAC^+$ (13.1584 D).
Figure 24:
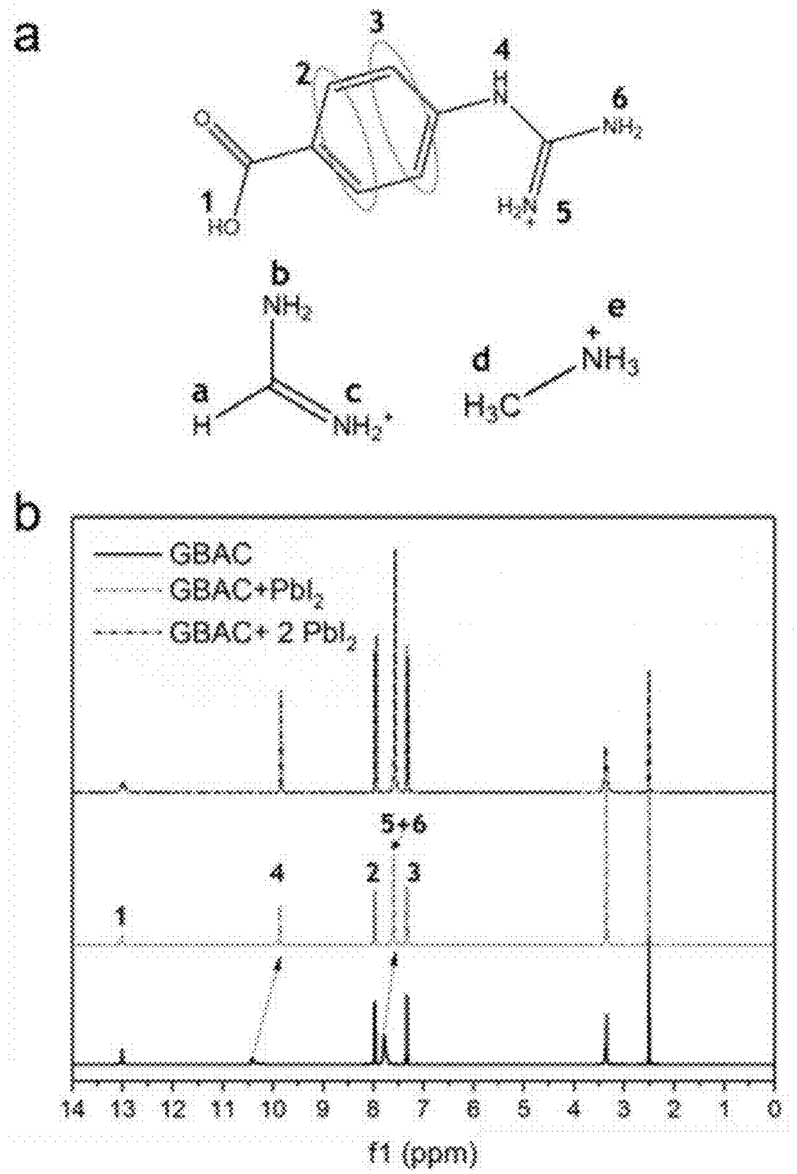
FIG. 24 depicts the 1H NMR spectra of GBAC, and its mixture with $PbI_2$, MAI, and FAI, respectively. (a) The recognition of different protons in $GBAC^+$ and $FA^+$, $MA^+$ cations. (b) $^1$H NMR spectrum of GBAC and mixing with $PbI_2$, showing only guanidino proton presents visible shift. (c) $^1$H NMR spectrum of GBAC, MAI, and the mixture of MAI and GBAC, (d) $^1$H NMR spectrum of GBAC, FAI, and the mixture of FAI and GBAC, showing that the strong hydrogen bonding between GBAC and MAI/FAI has won the competition with the fast proton exchanges between MAI/FAI, HDO, and DMSO.
Figure 24:
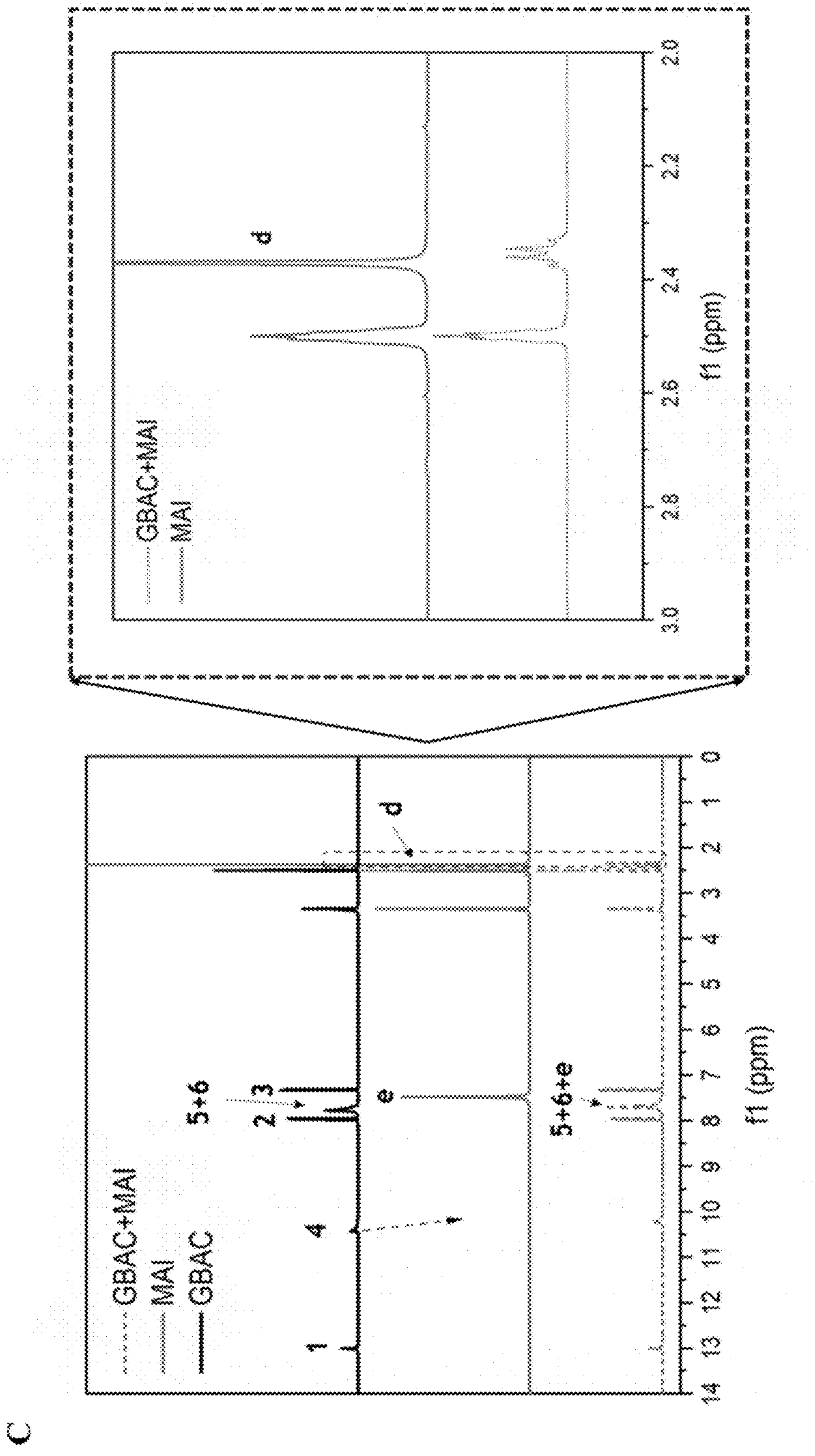
Figure 24:
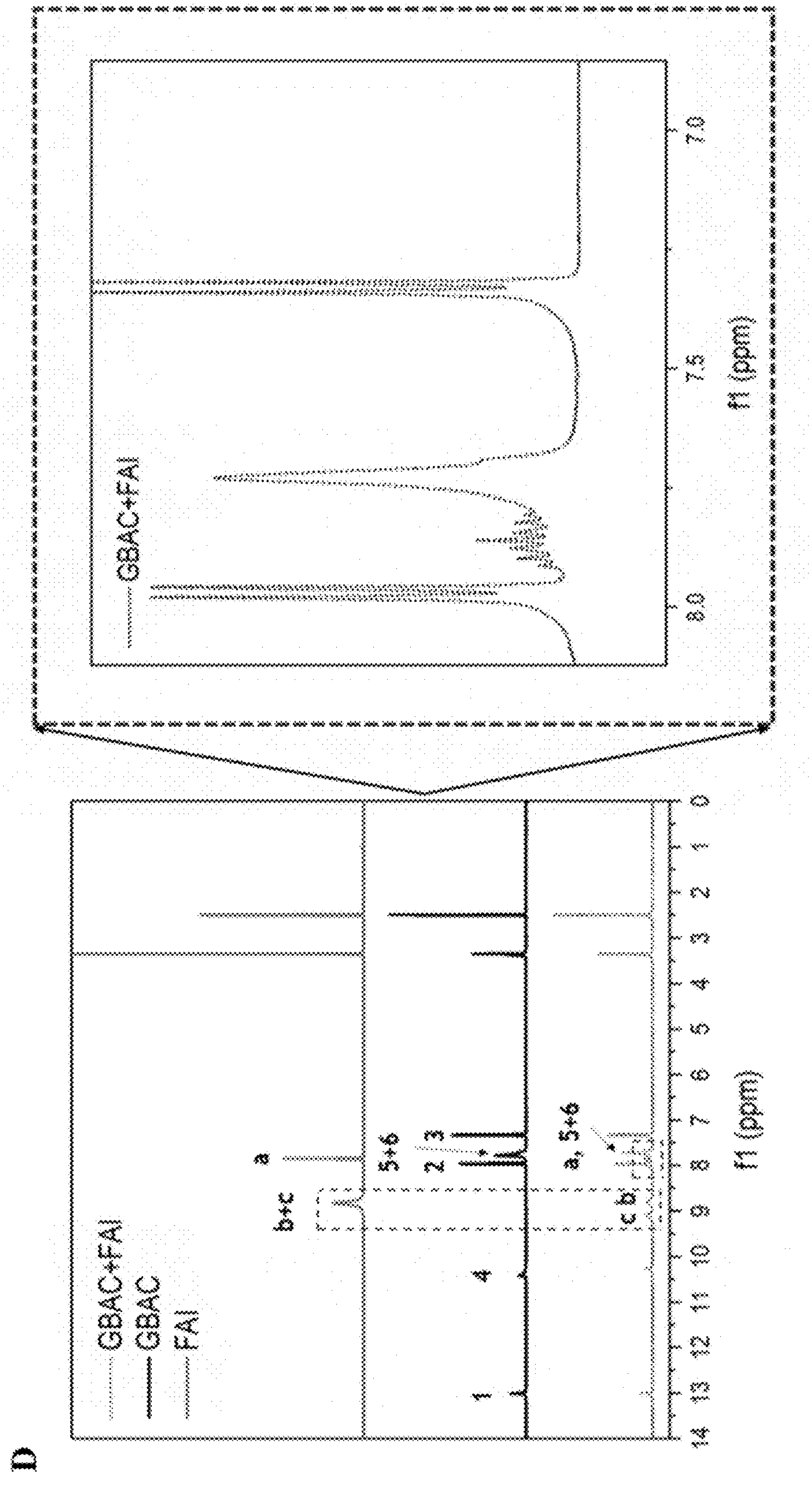
Figure 25:
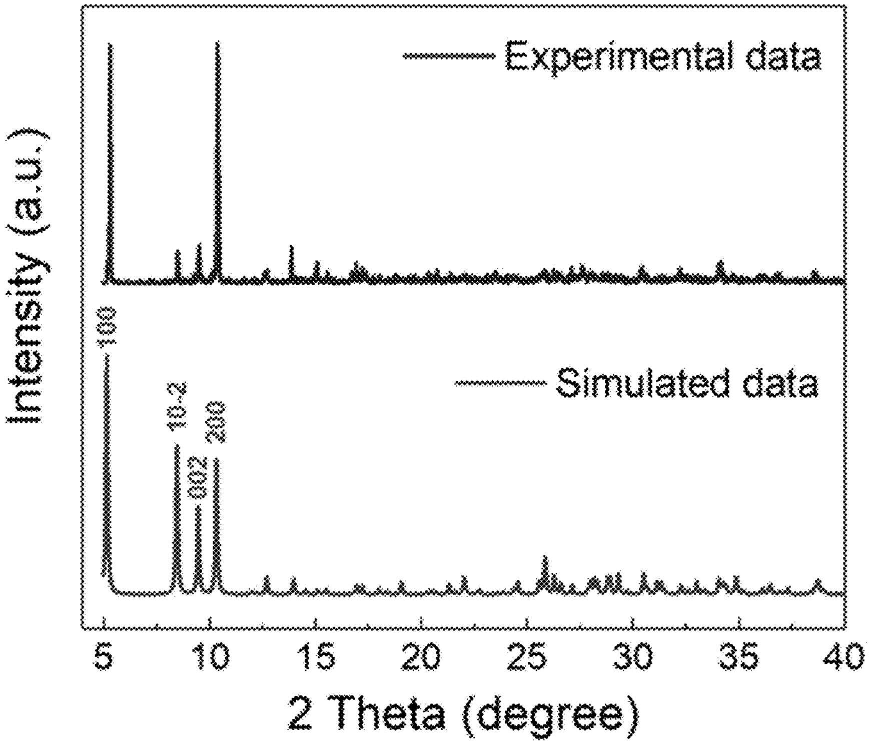
FIG. 25 depicts the simulated powder XRD and the experimental powder XRD of the $PbI_2$-GBAC-DMF single crystal.
Figure 26:
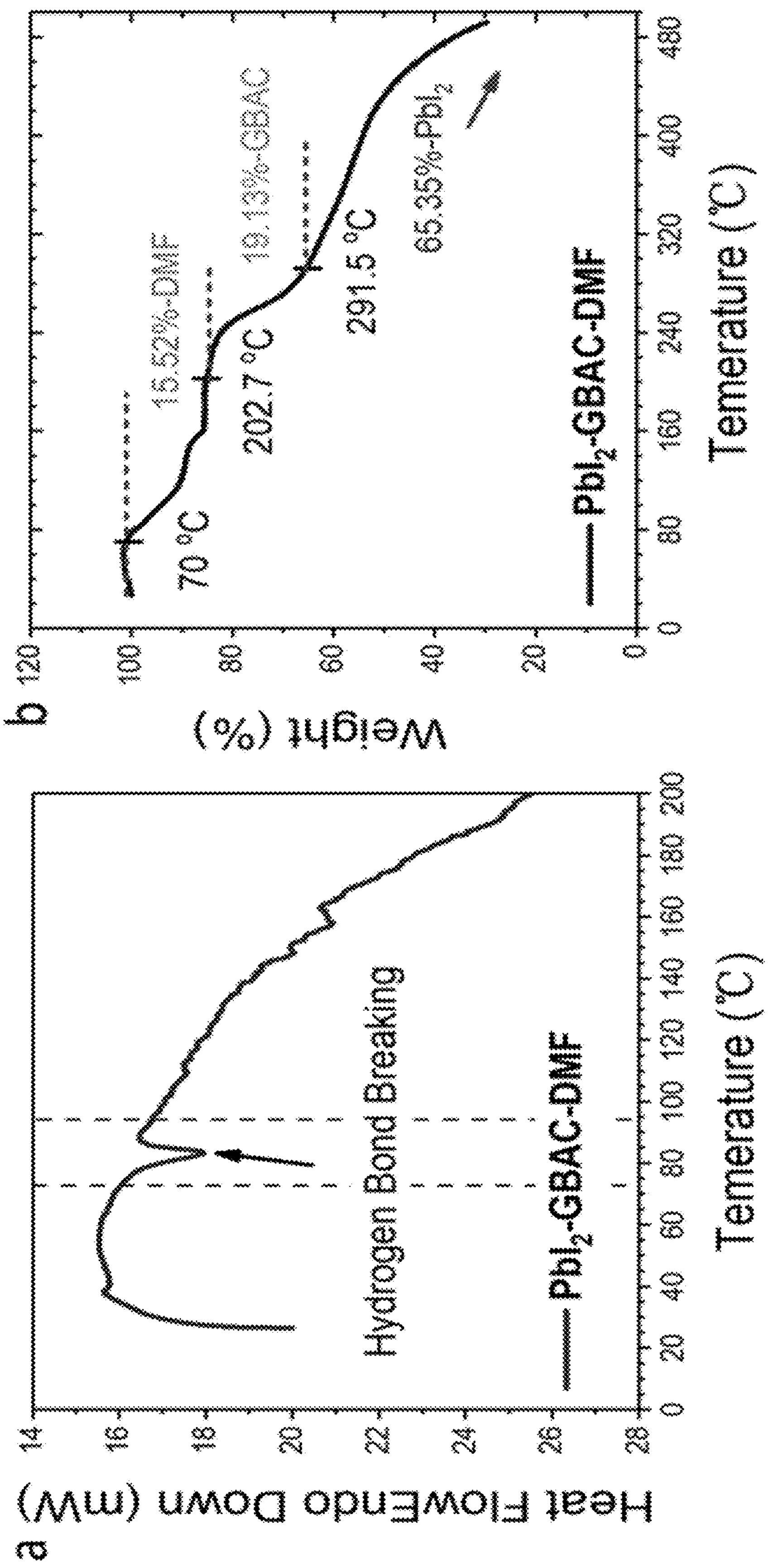
FIG. 26 (a) Simultaneous thermal analysis (STA) and (b) thermogravimetric analysis (TGA) of the $PbI_2$-GBAC-DMF single crystal.
Figure 27:
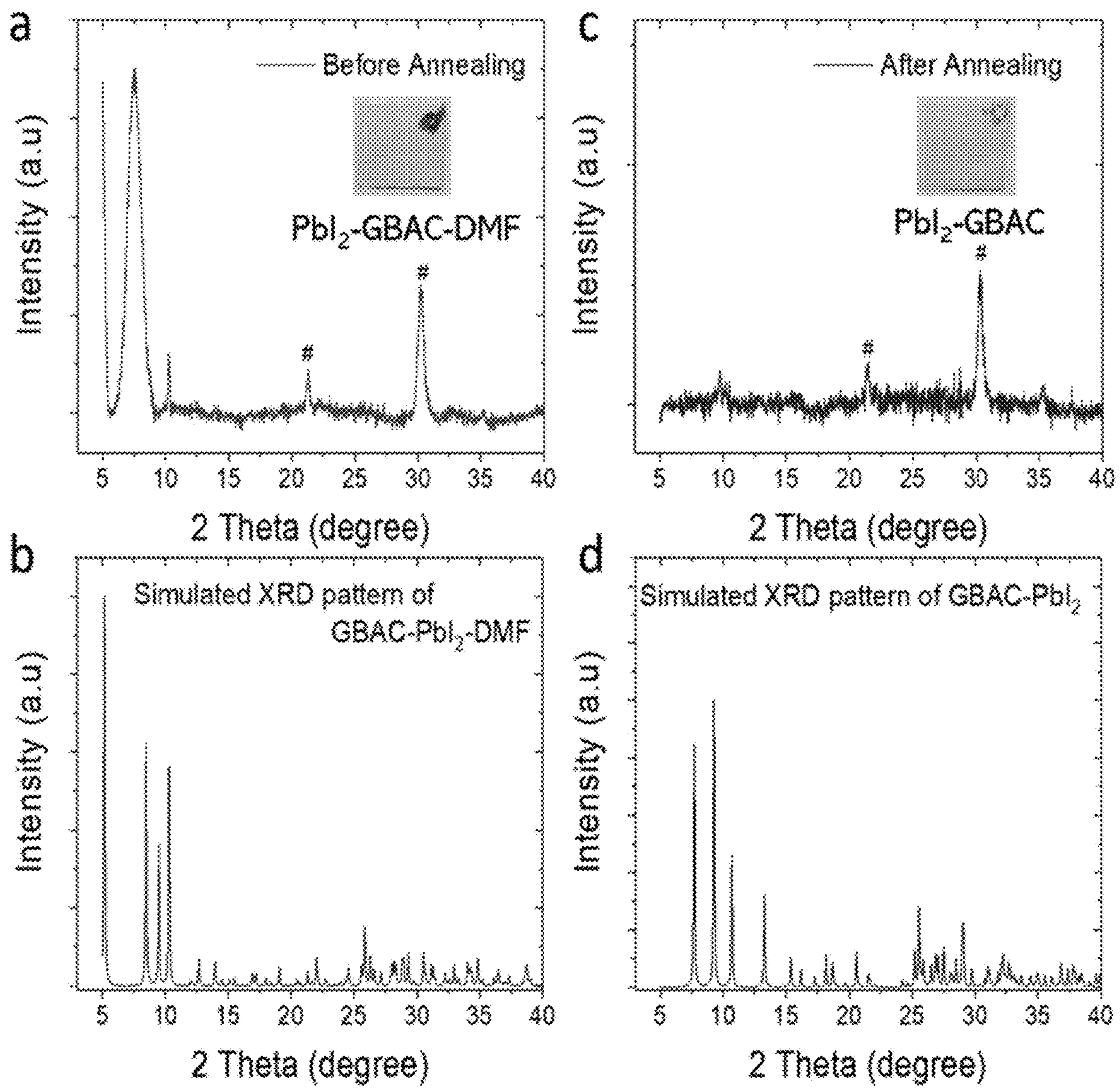
FIG. 27 depicts the XRD patterns of the $PbI_2$-GBAC-DMF film (a) before and (c) after annealing. Insets are photographs of films, showing transparent and light yellow respectively. (b) and (d) are the corresponding simulated XRD pattern from the crystal structure. # denotes the signal of ITO glass.
Figure 28:
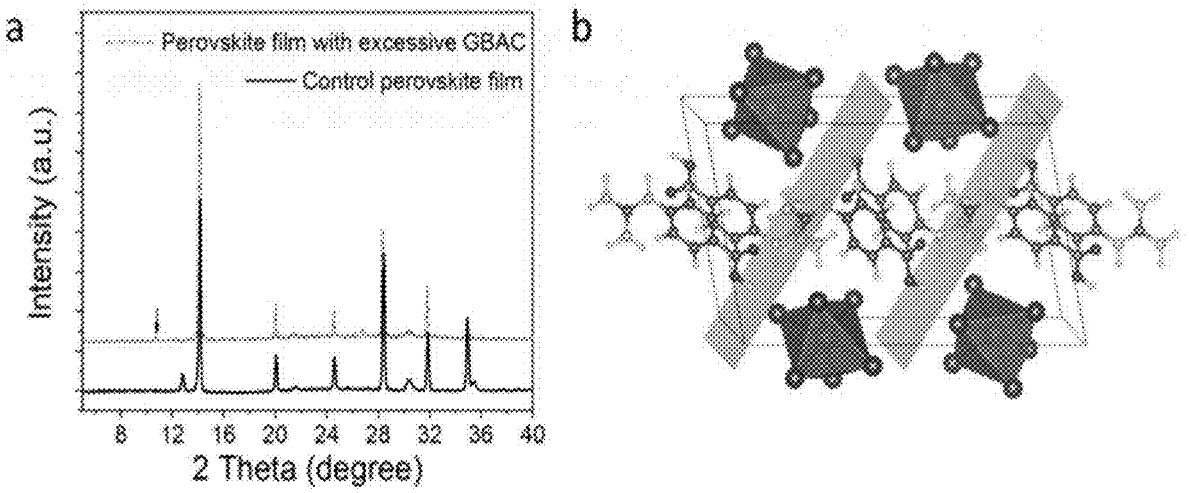
FIG. 28 depicts the (a) XRD pattern of perovskite film with excessive GBAC (4 mol %) showing a new peak of the low dimensional structure. (b) The corresponding crystal structure of GBAC-$PbI_2$ after annealing, the orange crystal plane (10-2) corresponds to the peak of 10.7° in the XRD pattern.
Figure 29:
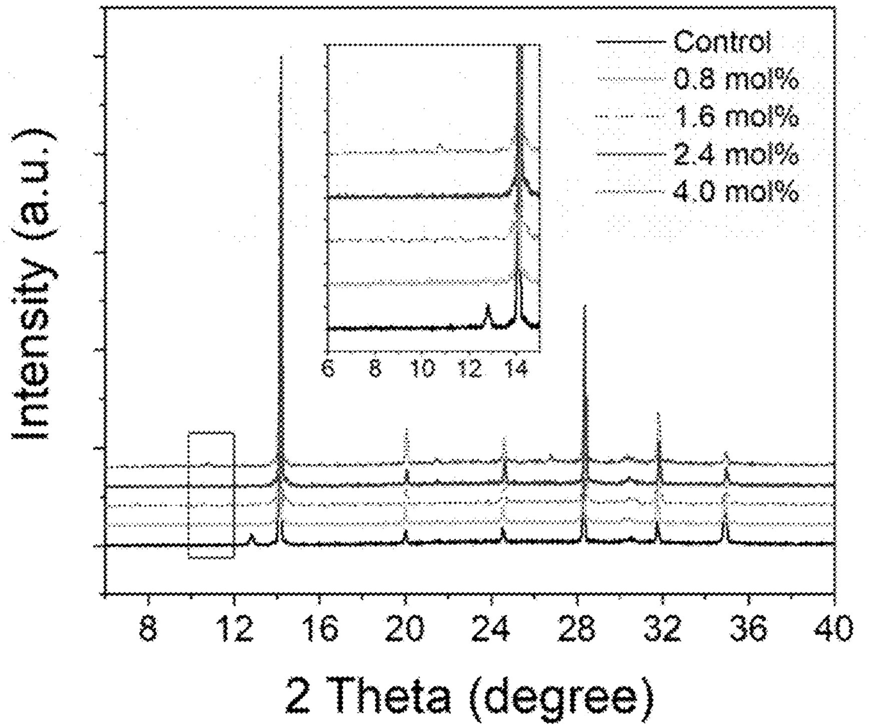
FIG. 29 depicts the XRD patterns of perovskite film with different amounts of GBAC.
Figure 30:
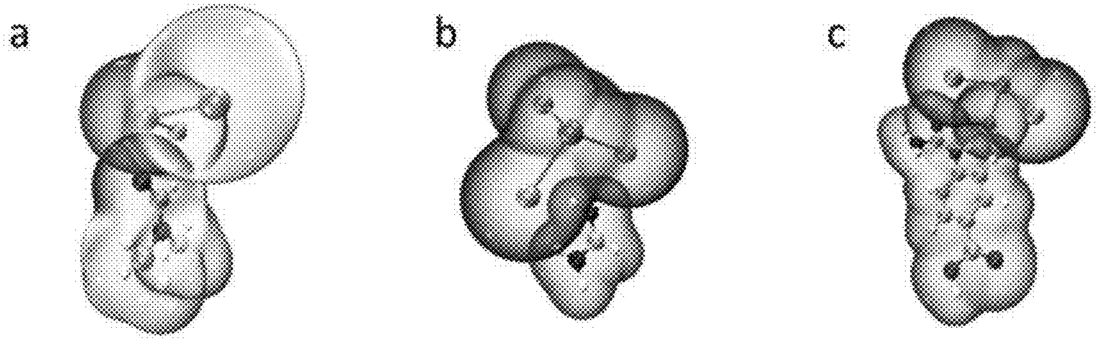
FIG. 30 depicts the (a-c) superposition of electrostatic potential mapped vdW surfaces of interacting pairs.
Figure 31:
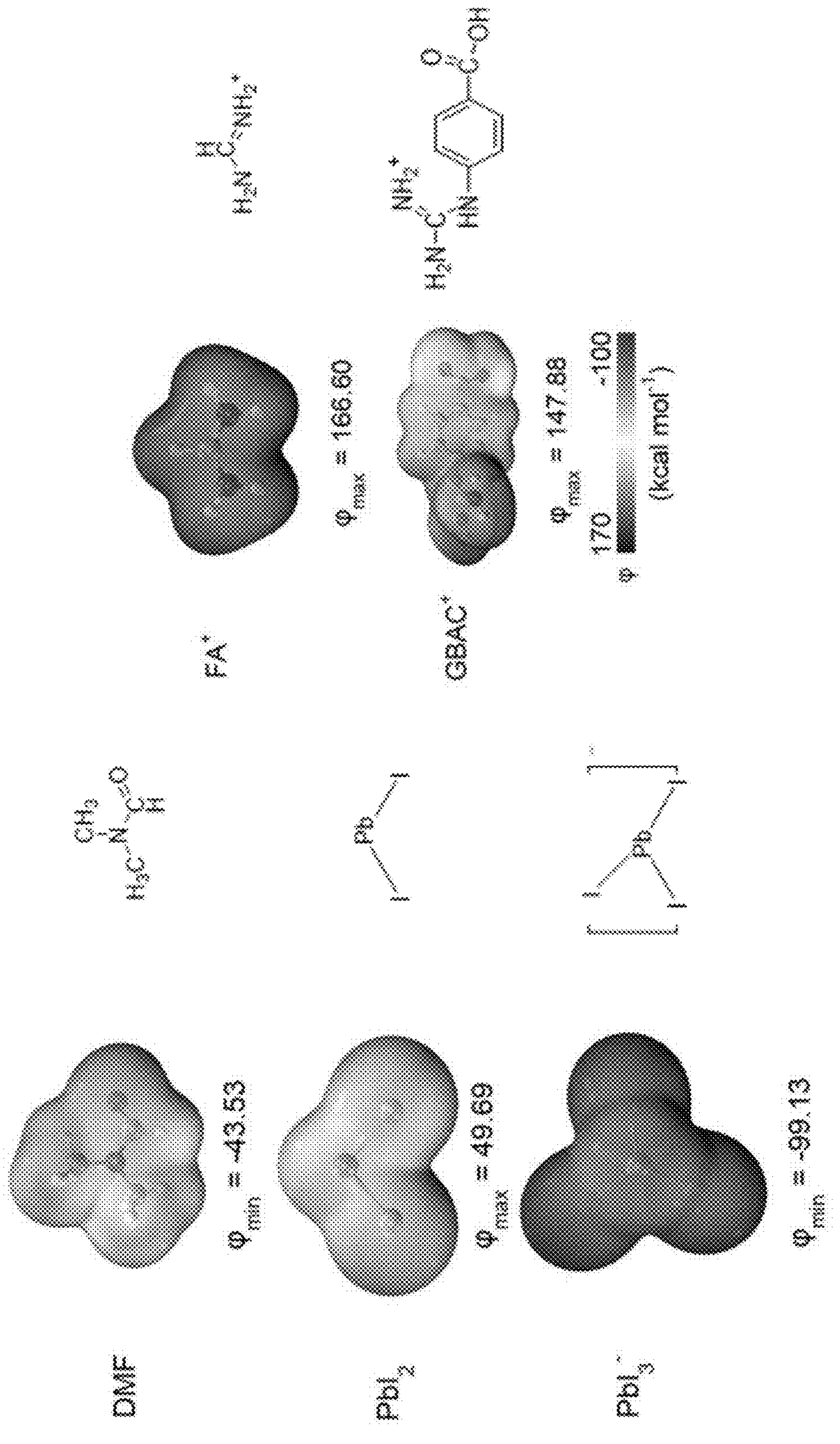
FIG. 31 depicts the molecular structures of interacting pairs and corresponding Gaussian calculated electrostatic potentials (q).
Figure 32:
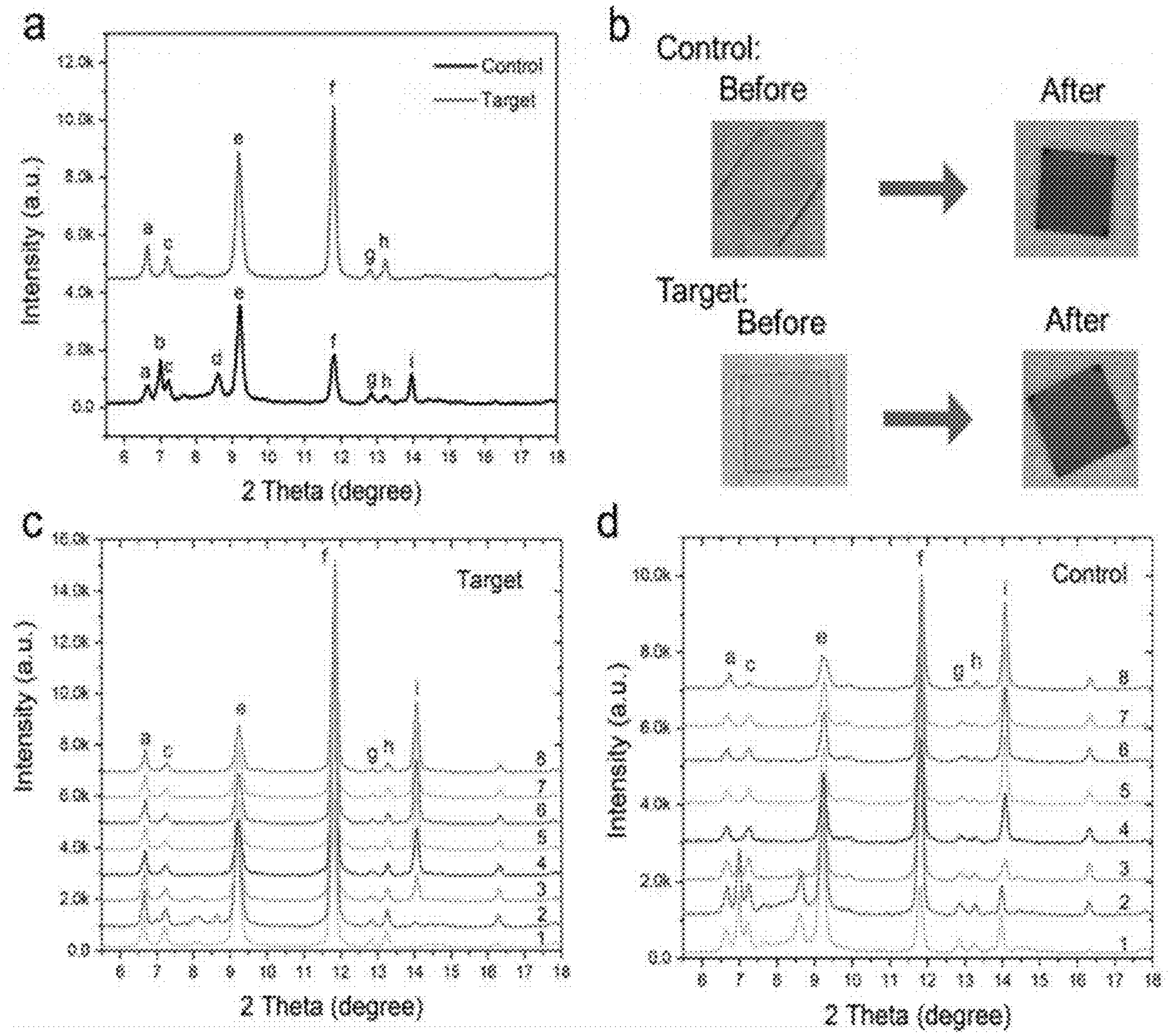
FIG. 32 depicts the cyclic XRD characterization of wet films, collecting the signal from 5.5° to 18° within 2 mins and then repeating for another cycle. (a) XRD patterns of the first cycle scan for the as-cast control and target perovskite films. Peak a, c, e: MAI-based intermediated phase (*ACS Energy Lett.* 2017, 2, 12, 2686; *Sci. Adv.* 2021; 7, cabb2412), peak b: the (020) plane of the metastable $(MAI)_2(DMF)_2Pb_2I_6$ phase, peak d: $CH_3NH_3PbI_3{\cdot}H_2O$ intermediate phase (*J. Am. Chem. Soc.* 2014, 136, 46, 16411), peak f: δ-$FAPbI_3$, peak g: $PbI_2$, peak i: α-$FAPbI_3$. (b) The pictures of the wet control and target perovskite films before and after cyclic XRD measurement. (c and d) The XRD patterns of the control and target perovskite films under cycling. Every cycle takes about 2 min. The dampened appearance of peak i and the higher intensity of peak e in the target film also help support that the GBAC could slow down the crystallization process and form other intermediate phases to modulate the film growth.
Figure 33:
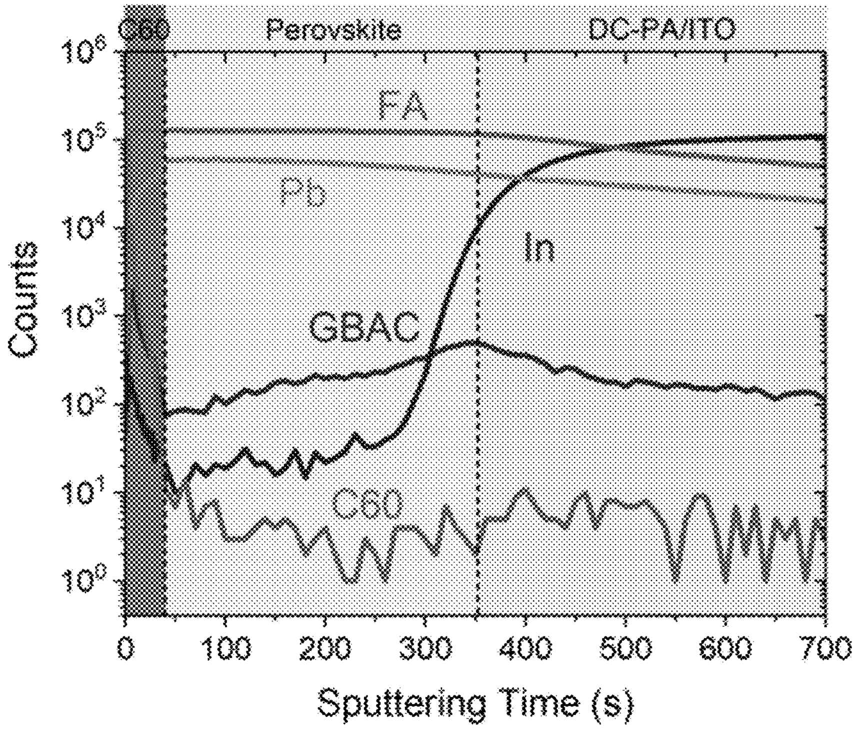
FIG. 33 depicts the ToF-SIMS results of the target perovskite film with an architecture of C60/Perovskite/DC-PA/ITO. The grey, yellow and blue shaded regions represent the C60 film, perovskite film, and substrates, respectively.
Figure 34:
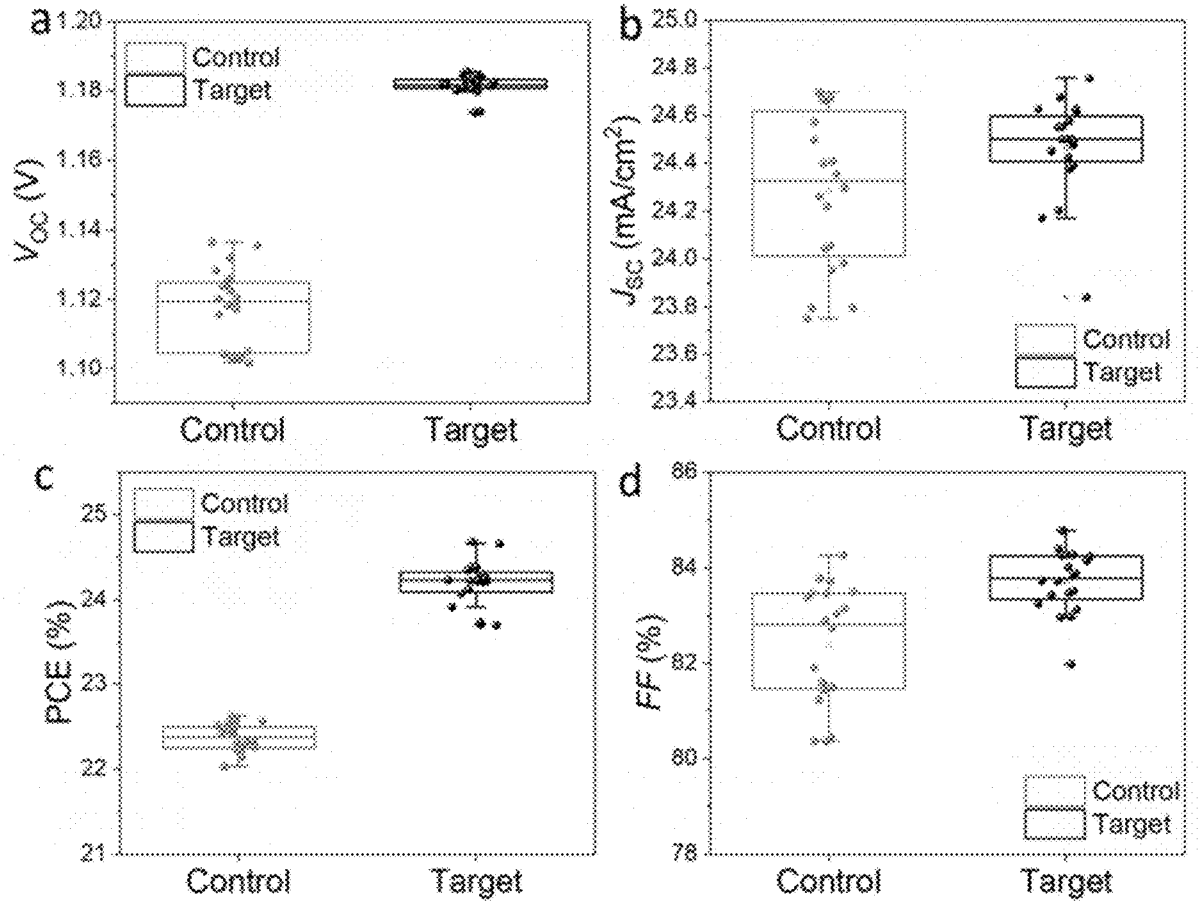
FIG. 34 depicts the (a-d) statistical analysis of the photovoltaic performance for control and target devices. The data from 20 cells were statistically analyzed. The box represents the median and the quartiles, and the whisker covers the minima up to maxima of the data points. The individual value of each data point is plotted as a point superimposed on the graph. All the box plots below have the same definition.
Figure 35:
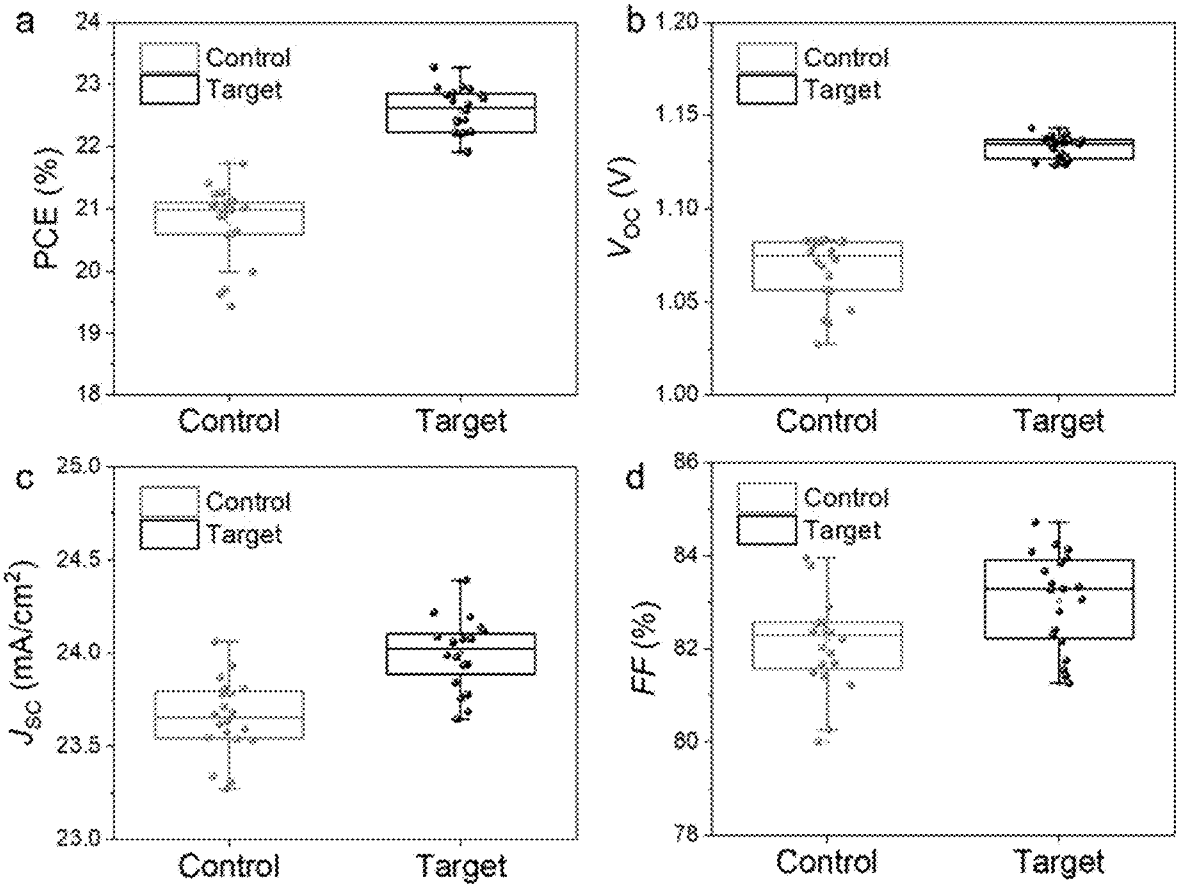
FIG. 35 depicts the (a-d) box plots of the device's performance for control and target PVSCs (20 devices) without PI surface treatment and anti-reflection (AR) layer.
Figure 36:
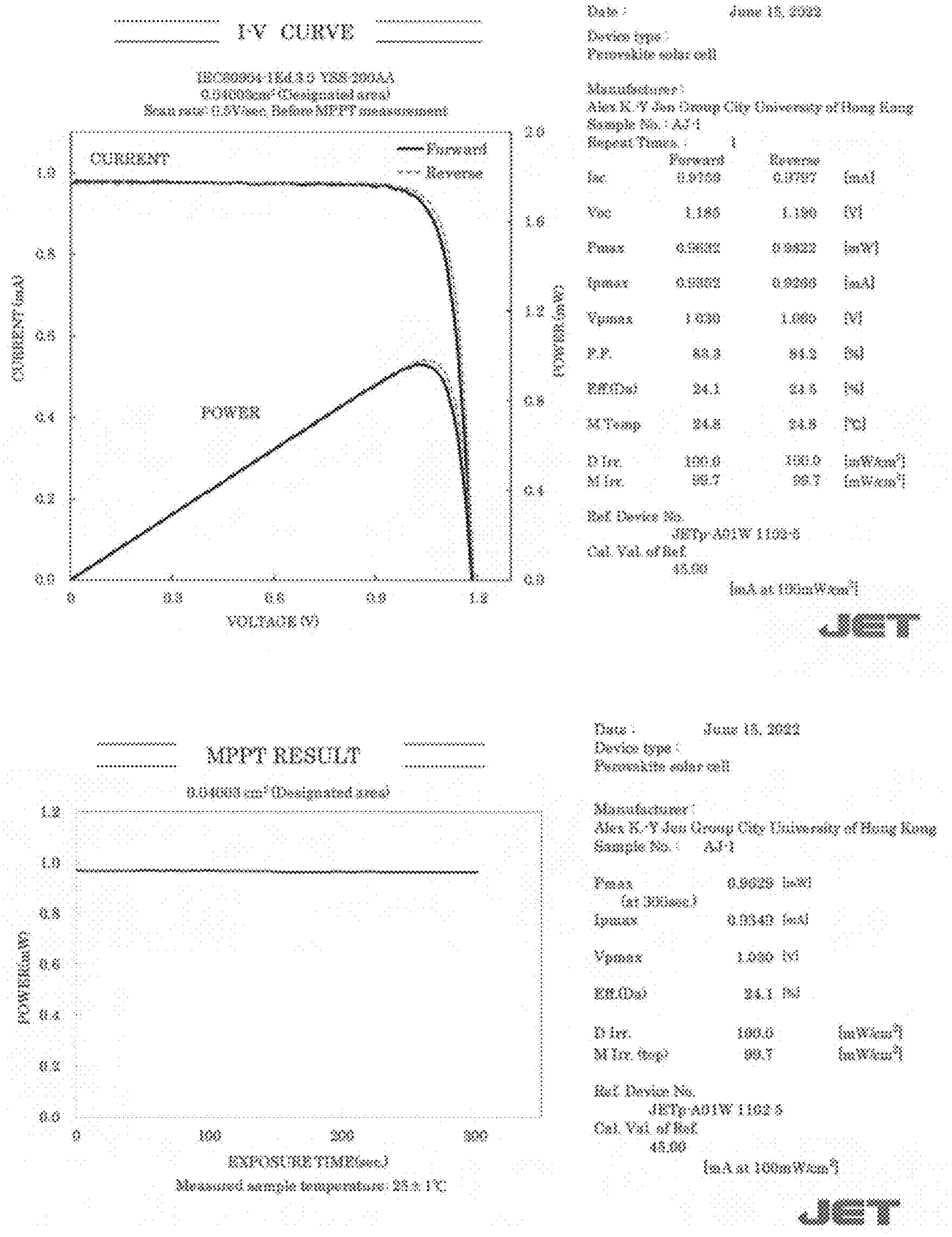
FIG. 36 depicts the certified results of the champion device were measured at JET. The certified PCE is 24.5% certified aperture with an area of 0.04003 $cm^2$. The certified J-V curves with double scanning give PCE forward: 24.1% and PCE reverse: 24.5%. The certified stabilized power output is 24.1%.
Figure 37:
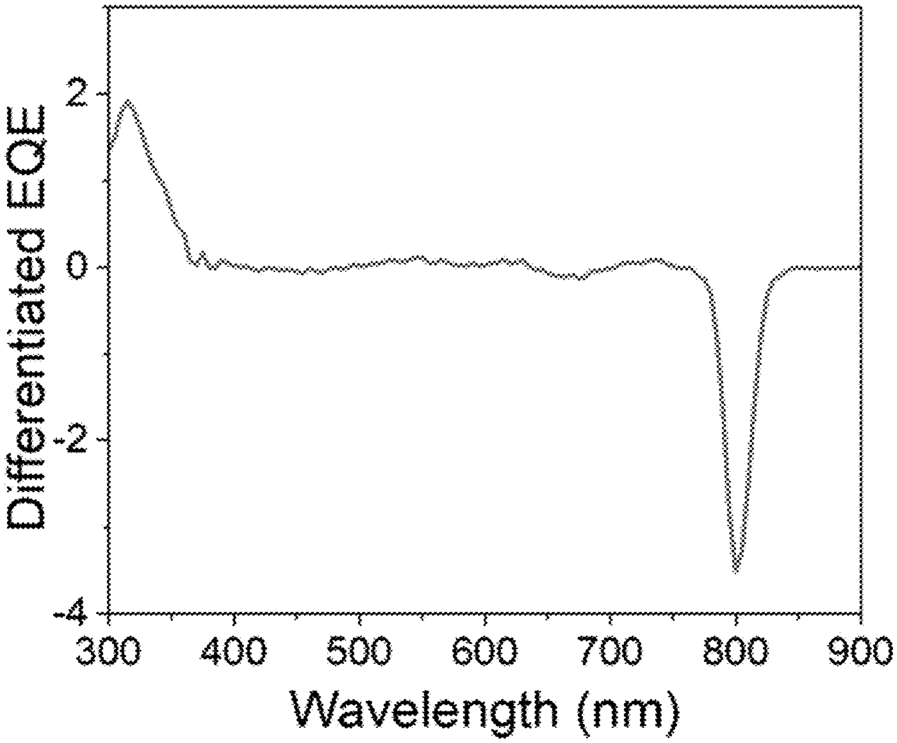
FIG. 37 depicts the derivative of EQE curve to identify the bandgap of the perovskite, which is 1.55 cV.
Figure 38:
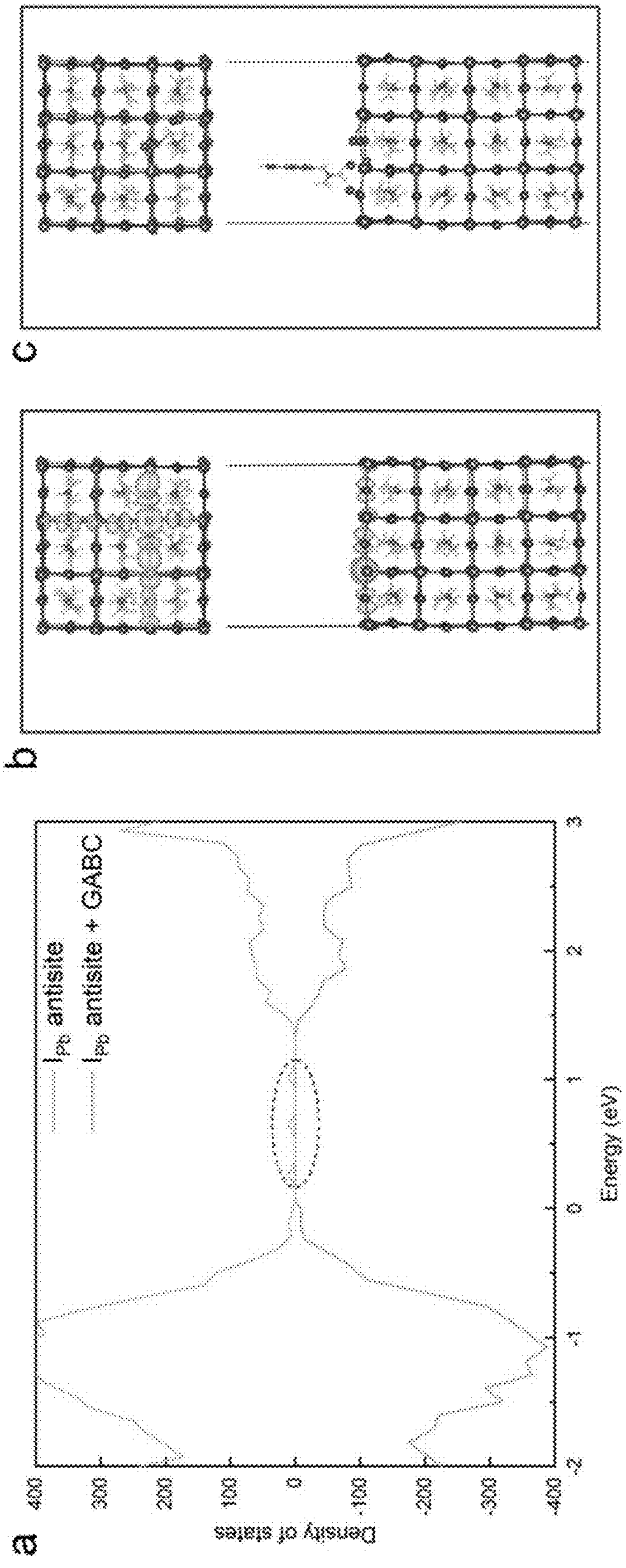
FIG. 38 depicts the (a) density of states (DOS) of the surface Ipb antisite defect with or without GBAC passivation. (b) Partial charge density of the in-gap states in (a) marked with a circle. (c) Adsorption configuration of the GBAC on the perovskite surface with Ipb antisite defect.
Figure 39:
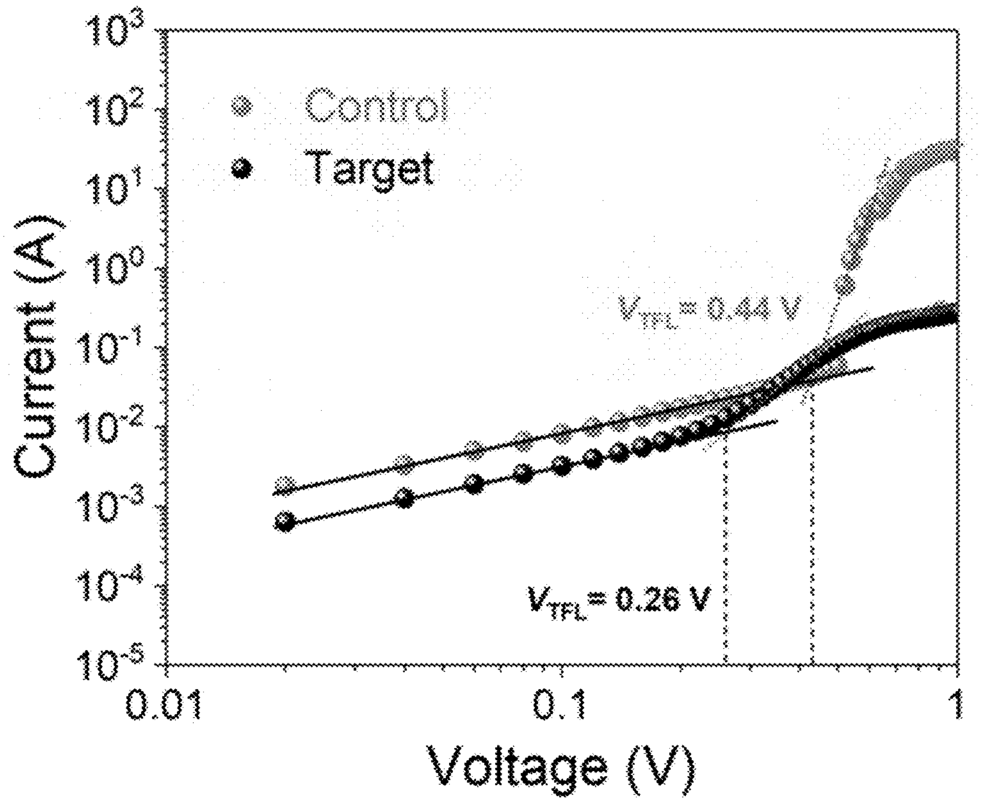
FIG. 39 depicts the dark I-V curves of the control and target devices based on the electron-only structure (ITO/$SnO_2$/Perovskites/C60/BCP/Ag). The trap density can be calculated from the equation.

To evaluate the stability of PVSCs, the unencapsulated devices were aged under continuous heating at 65±5° C. in $N_2$ atmosphere. As illustrated in FIG. 8*a*, the target device showed a very small decay (<3%) after 1200 h. In contrast, the PCE of the control device decreased almost 30% during the same time. The long-term operational stability of unencapsulated devices was then measured by tracking the true maximum power point (MPP) under continuous 1-sun illumination (LED simulated full AM 1.5G spectrum) in an $N_2$-filled glovebox. The target device maintained ~90% of its initial PCE after 500 h, while the control device decreased to ~30% of its initial value (FIG. 8*b*). These results confirm that the device stability can be significantly enhanced by applying the multifunctional additive.

What is claimed is:

1. An organic-inorganic hybrid perovskite comprising: $M^{2+}$, one or more $A^+$, and a multifunctional nonvolatile additive (MNA) comprising a cationic species having the formula $R^1Ar^1R^2$, wherein $M^{2+}$ comprises $Pb^{2+}$, $Sn^{2+}$, $Ge^{2+}$, or a mixture thereof; each of the one or more $A^+$ is independently selected from the group consisting of $Cs^+$, $Rb^+$, $CH_3NH_3^+$, $CH_3CH_2NH_3^+$, $H(C{=}NH_2)NH_2^+$, and $Me(C{=}NH_2)NH_2^+$; $Ar^1$ is an optionally substituted aryl or an optionally substituted heteroaryl; $R^1$ is —COOH, —$CH_2COOH$, —$CH_2CH_2COOH$, —$SO_3H$, —$CH_2SO_3H$, —$CH_2CH_2SO_3H$, —$PO_3H_2$, —$CH_2PO_3H_2$, or —$CH_2CH_2PO_3H_2$; and $R^2$ is —$NH(C{=}NH_2)NH_2^+$ or —$N(R)_3H^+$, wherein R for each instance is independently hydrogen or $C_1$-$C_6$ alkyl, with the proviso that the one or more $A^+$ comprises $H(C{=}NH_2)NH_2^+$.

2. The organic-inorganic hybrid perovskite of claim 1, wherein the MNA is selected from the group consisting of:

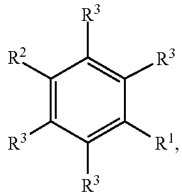,
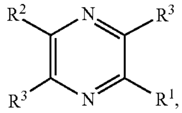,
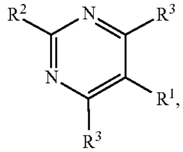,
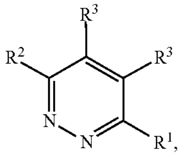,
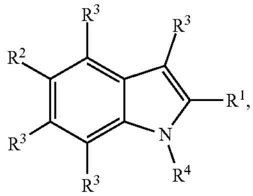,
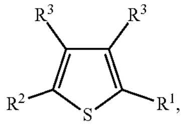,
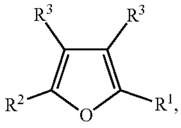,
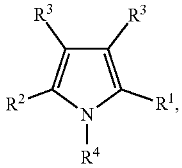,
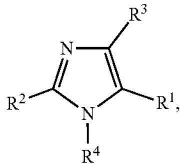,
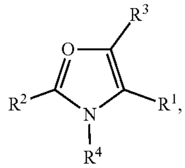,
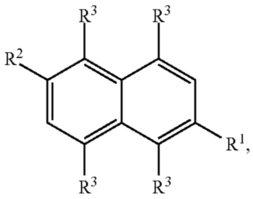,
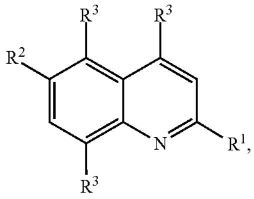, and
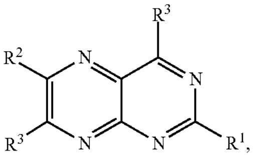, wherein $R^1$ is —COOH, —$SO_3H$, or —$PO_3H_2$;

$R^2$ is —$NH(C{=}NH_2)NH_2^+$;

$R^3$ for each instance is independently selected from the group consisting of hydrogen, Me, Et, F, Cl, Br, I, CN, SCN, —$NO_2$, —OMe, —OEt, —SMe, and —SEt; and $R^4$ is hydrogen or alkyl.

3. The organic-inorganic hybrid perovskite of claim 1, wherein the MNA comprises a cationic species of Formula 1:

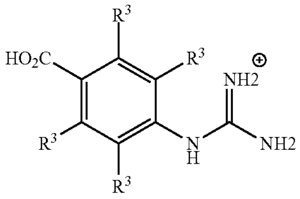
1 wherein $R^3$ for each instance is independently selected from the group consisting of hydrogen, Me, Et, F, Cl, Br, I, CN, SCN, —$NO_2$, —OMe, —OEt, —SMe, and —SEt.

4. The organic-inorganic hybrid perovskite of claim 1, wherein the MNA has Formula 2:

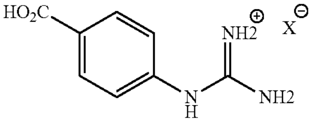
2 wherein X is $Cl^-$, Br, or I.

5. The organic-inorganic hybrid perovskite of claim 1, wherein the organic-inorganic hybrid perovskite has Formula 3:

$$(A^+)(M^{2+})(X^-)_3\cdot(MNA)m \quad 3$$

wherein m is 0.01-0.5;

X is F, Cl, Br, or I;

$M^{2+}$ comprises $Pb^{2+}$, $Sn^{2+}$, $Ge^{2+}$, or a mixture thereof;

$A^+$ is $Cs^+$, $Rb^+$, $CH_3NH_3^+$, $CH_3CH_2NH_3^+$, $H(C{=}NH_2)NH_2^+$, $Me(C{=}NH_2)NH_2^+$, or a mixture thereof;

the MNA is selected from the group consisting of:

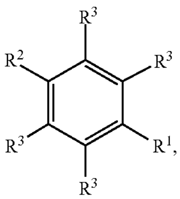,
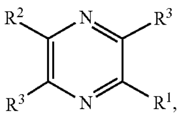,
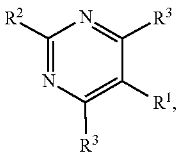,
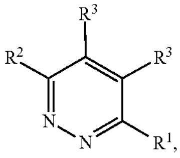,
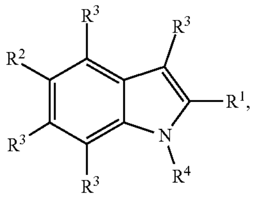,

-continued

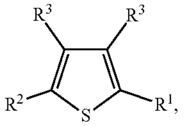,
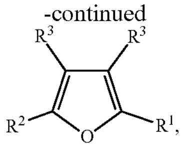,
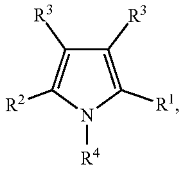,

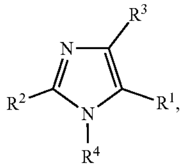,
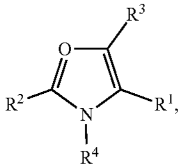,

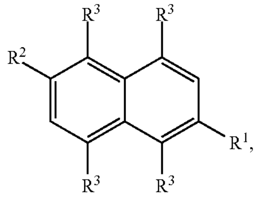,
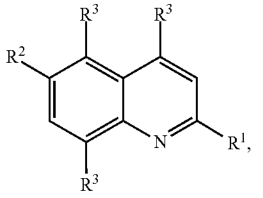, and

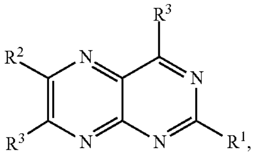, $R^1$ is —COOH, —$SO_3H$, or —$PO_3H_2$;

$R^2$ is —NH(C═$NH_2$)$NH_2^+$;

$R^3$ for each instance is independently selected from the group consisting of hydrogen, Me, Et, F, Cl, Br, I, CN, SCN, —$NO_2$, —OMe, —OEt, —SMe, and —SEt; and $R^4$ is hydrogen or alkyl, with the proviso that $A^+$ comprises H(C═$NH_2$)$NH_2^+$.

6. The organic-inorganic hybrid perovskite of claim 1, wherein the MNA has Formula 2:

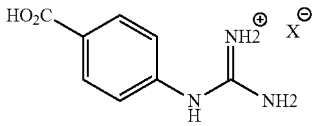

2 wherein X is $Cl^-$, Br, or I; and the one or more $A^+$ comprises $Cs^+$, $CH_3NH_3^+$, and H(C═$NH_2$)$NH_2^+$.

7. An electronic device comprising:

a substrate layer;

a transparent conductive layer disposed on a surface of the substrate layer, a hole-transport layer disposed on the surface of the substrate layer;

a perovskite functional layer comprising the organic-inorganic hybrid perovskite of claim 1 disposed on a surface of the hole-transport layer;

an electron-transport layer disposed on the surface of the perovskite functional layer; and a metal electrode disposed on the surface of the electron-transport layer.

8. The electronic device of claim 7, wherein the electronic device has a power conversion efficiency (PCE) of 24.5-24.8% measured under International Electrotechnical Commission (IEC) 60904-9:2007.

9. The electronic device of claim 7, wherein the MNA comprises a cationic species of Formula 1:

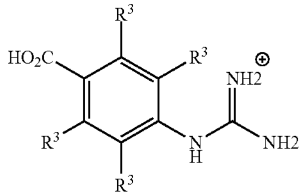

1 wherein $R^3$ for each instance is independently selected from the group consisting of hydrogen, Me, Et, F, Cl, Br, I, CN, SCN, and —$NO_2$.

10. The electronic device of claim 7, wherein the MNA has Formula 2:

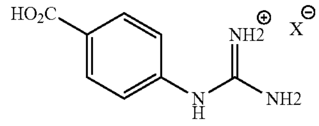

2 wherein X is Br or I.

11. The electronic device of claim 10, wherein the one or more $A^+$ comprises $Cs^+$, $CH_3NH_3^+$, and H(C═$NH_2$)$NH_2^+$.

12. An organic-inorganic hybrid perovskite precursor solution comprising: $M^{2+}$, one or more $A^+$, a multifunctional nonvolatile additive (MNA) comprising a cationic species having the formula $R^1Ar^1R^2$, and an organic solvent, wherein $M^{2+}$ comprises $Pb^{2+}$, $Sn^{2+}$, $Ge^{2+}$, or a mixture thereof; each of the one or more $A^+$ is independently selected from the group consisting of $Cs^+$, $Rb^+$, $CH_3NH_3^+$, $CH_3CH_2NH_3^+$, H(C═$NH_2$)$NH_2^+$, and Me(C═$NH_2$)$NH_2^+$; $Ar^1$ is an optionally substituted aryl or an optionally substituted heteroaryl; $R^1$ is —COOH, —$CH_2$COOH, —$CH_2CH_2$COOH, —$SO_3H$, —$CH_2SO_3H$, —$CH_2CH_2SO_3H$, —$PO_3H_2$, —$CH_2PO_3H_2$, or —$CH_2CH_2PO_3H_2$; and $R^2$ is —NH(C═$NH_2$)$NH_2^+$ or —$N(R)_3H^+$, wherein R for each instance is independently hydrogen or $C_1$-$C_6$ alkyl, with the proviso that the one or more $A^+$ comprises H(C═$NH_2$)$NH_2^+$.

13. The organic-inorganic hybrid perovskite precursor solution of claim 12, wherein the MNA is selected from the group consisting of:

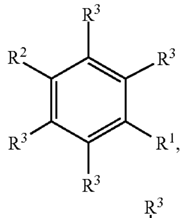,
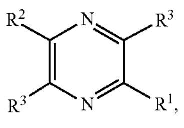,
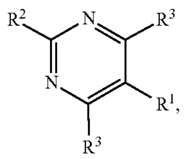,

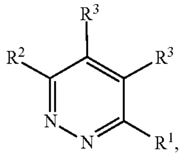,
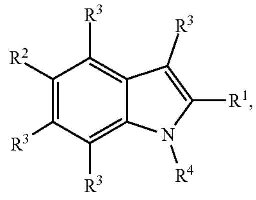,

-continued

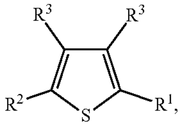 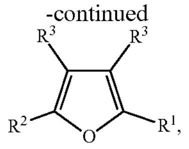 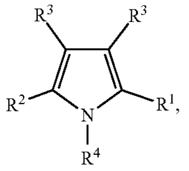

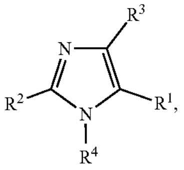 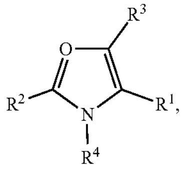

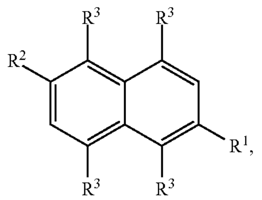 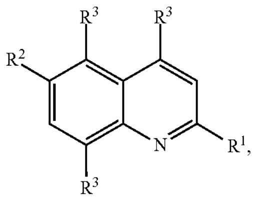 and

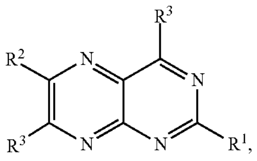

wherein $R^1$ is —COOH, —$SO_3H$, or —$PO_3H_2$;

$R^2$ is —NH(C=$NH_2$)$NH_2^+$;

$R^3$ for each instance is independently selected from the group consisting of hydrogen, Me, Et, F, Cl, Br, I, CN, SCN, —$NO_2$, —OMe, —OEt, —SMe, and —SEt; and $R^4$ is hydrogen or alkyl.

14. The organic-inorganic hybrid perovskite precursor solution of claim 12, wherein the solvent comprises dimethyl formamide, dimethyl sulfoxide, or a mixture thereof.

15. The organic-inorganic hybrid perovskite precursor solution of claim 12, wherein the MNA has Formula 2:

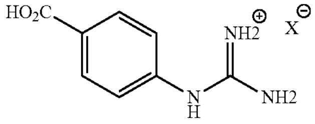 2 wherein X is $Cl^-$, Br, or I.

16. The organic-inorganic hybrid perovskite precursor solution of claim 15, wherein $M^{2+}$ comprises $Pb^{2+}$.

17. The organic-inorganic hybrid perovskite precursor solution of claim 12, wherein the MNA comprises a cationic species of Formula 1:

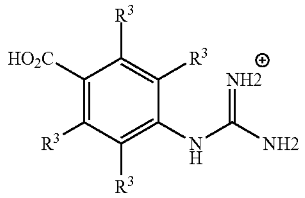 1 wherein $R^3$ for each instance is independently selected from the group consisting of hydrogen, Me, Et, F, Cl, Br, I, CN, SCN, and —$NO_2$.

18. The organic-inorganic hybrid perovskite precursor solution of claim 17, wherein $M^{2+}$ comprises $Pb^{2+}$; and the one or more $A^+$ comprises $Cs^+$, $CH_3NH_3^+$, and H(C=$NH_2$)$NH_2^+$.

19. The organic-inorganic hybrid perovskite precursor solution of claim 18, wherein the MNA has Formula 2:

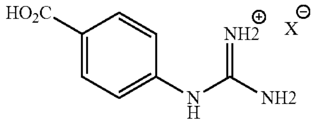 2 wherein X is Br or I; and the solvent comprises dimethyl formamide, dimethyl sulfoxide, or a mixture thereof.

* * * * *